(12) United States Patent
Koymen et al.

(10) Patent No.: US 10,284,963 B2
(45) Date of Patent: May 7, 2019

(54) HIGH PERFORMANCE SEALED-GAP CAPACITIVE MICROPHONE

(71) Applicant: Nanofone Ltd., St. Helier, Jersey (GB)

(72) Inventors: Hayrettin Koymen, Ankara (TR); Abdullah Atalar, Ankara (TR)

( * ) Notice: Subject to any disclaimer, the term of this patent is extended or adjusted under 35 U.S.C. 154(b) by 0 days.

(21) Appl. No.: 15/939,077

(22) Filed: Mar. 28, 2018

(65) Prior Publication Data

US 2018/0302726 A1 Oct. 18, 2018

Related U.S. Application Data

(60) Provisional application No. 62/616,424, filed on Jan. 11, 2018, provisional application No. 62/614,897, (Continued)

(51) Int. Cl.
*H04R 19/04* (2006.01)
*B81C 1/00* (2006.01)
(Continued)

(52) U.S. Cl.
CPC .......... *H04R 19/04* (2013.01); *B81B 7/0025* (2013.01); *B81C 1/00158* (2013.01); (Continued)

(58) Field of Classification Search
CPC .. H04R 19/0005; H04R 19/016; H04R 19/04; H04R 31/003; H04R 31/006; (Continued)

(56) References Cited

U.S. PATENT DOCUMENTS 5,186,054 A * 2/1993 Sekimura ............ B60C 23/0408
361/283.4
6,075,867 A 6/2000 Bay et al.
(Continued)

FOREIGN PATENT DOCUMENTS

WO 2012014010 A1 2/2012

OTHER PUBLICATIONS

H. Koymen, et al., "An improved lumped element nonlinear circuit model for a circular CMUT cell," IEEE Trans. Ultrason. Ferroelectr. Freq. Control, vol. 59, No. 8, pp. 1791-1799, Aug. 2012.
(Continued)

*Primary Examiner* — Joshua Kaufman
(74) *Attorney, Agent, or Firm* — Seth A. Horwitz; Carrington, Coleman, Sloman & Blumenthal, L.L.P.

(57) ABSTRACT

Some preferred embodiments include a microphone system for receiving sound waves, the microphone including a back plate, a radiation plate, first and second electrodes, first and second insulator layers, a power source and a microphone controller. The radiation plate is clamped to the back plate so that there is a hermetically sealed circular gap between the radiation plate and the back plate. The first electrode is fixedly attached to a side of the back plate proximate to the gap. The second electrode is fixedly attached to a side of the radiation plate. The insulator layers are attached to the back plate and/or the radiation plate, on respective gap sides thereof, so that the insulator layers are between the electrodes. The microphone controller is configured to use the power source to drive the microphone at a selected operating point comprising normalized static mechanical force, bias voltage, and relative bias voltage level. A radius and height of the gap, and a thickness of the radiation plate, are determined using the selected operating point so that a (Continued)

sensitivity of the microphone at the selected operating point is an optimum sensitivity for the selected operating point.

24 Claims, 20 Drawing Sheets

Related U.S. Application Data filed on Jan. 8, 2018, provisional application No. 62/477,510, filed on Mar. 28, 2017.

(51) Int. Cl.
*H04R 19/01* (2006.01)
*H04R 31/00* (2006.01)
*B81B 7/00* (2006.01)
*H04R 19/00* (2006.01)

(52) U.S. Cl.
CPC ......... *H04R 19/005* (2013.01); *H04R 19/016* (2013.01); *H04R 31/006* (2013.01); *B81B 2201/0257* (2013.01); *B81B 2203/0127* (2013.01); *B81B 2203/0315* (2013.01); *B81B 2203/04* (2013.01); *H04R 2201/003* (2013.01); *H04R 2499/11* (2013.01)

(58) Field of Classification Search
CPC ............ H04R 2201/003; B81B 7/0025; B81B 2201/003; B81B 2201/0257; B81B 2203/0127; B81B 2203/0315; B81B 2203/04
See application file for complete search history.

(56) References Cited

U.S. PATENT DOCUMENTS

| | | | | |
|---|---|---|---|---|
| 6,328,696 | B1* | 12/2001 | Fraser | B06B 1/0292 367/118 |
| 6,853,041 | B2* | 2/2005 | Khuri-Yakub | H03H 9/02409 257/415 |
| 7,257,051 | B2* | 8/2007 | Thomenius | B06B 1/0292 367/105 |
| 7,955,250 | B2 | 6/2011 | Jaeger et al. | |
| 8,288,971 | B2 | 10/2012 | Jiang | |
| 8,371,018 | B2* | 2/2013 | Chang | B06B 1/0292 29/594 |
| 8,531,919 | B2* | 9/2013 | Cheng | B06B 1/0292 367/181 |
| 8,952,595 | B2* | 2/2015 | Huang | B06B 1/0292 310/309 |
| 8,975,984 | B2* | 3/2015 | Huang | H03H 3/0072 333/186 |
| 9,061,318 | B2* | 6/2015 | Rothberg | B06B 1/0292 |
| 9,363,589 | B2 | 6/2016 | Lippert et al. | |
| 9,451,375 | B2 | 9/2016 | Maier | |
| 9,560,430 | B2 | 1/2017 | Iuchi | |
| 2001/0019945 | A1 | 9/2001 | Dubugnon | |
| 2004/0085858 | A1* | 5/2004 | Khuri-Yakub | B06B 1/0688 367/181 |
| 2004/0174773 | A1* | 9/2004 | Thomenius | B06B 1/0292 367/174 |
| 2004/0267134 | A1* | 12/2004 | Hossack | B06B 1/0292 600/459 |
| 2005/0096546 | A1* | 5/2005 | Hazard | B06B 1/0292 600/447 |
| 2005/0200241 | A1* | 9/2005 | Degertekin | B06B 1/0292 310/334 |
| 2006/0004289 | A1* | 1/2006 | Tian | B06B 1/0292 600/459 |
| 2006/0116585 | A1* | 6/2006 | Nguyen-Dinh | B06B 1/0292 600/459 |
| 2007/0215964 | A1* | 9/2007 | Khuri-Yakub | B06B 1/0292 257/414 |
| 2008/0067895 | A1* | 3/2008 | Adachi | A61B 8/12 310/324 |
| 2010/0173437 | A1* | 7/2010 | Wygant | B06B 1/0292 438/53 |
| 2011/0040189 | A1* | 2/2011 | Petruzzello | B06B 1/0292 600/459 |
| 2012/0133005 | A1* | 5/2012 | Langereis | B06B 1/0292 257/416 |
| 2014/0083296 | A1 | 3/2014 | Sanders | |
| 2014/0339657 | A1 | 11/2014 | Grosh et al. | |
| 2015/0163572 | A1 | 6/2015 | Weiss et al. | |

OTHER PUBLICATIONS

H. Koymen, et al., "Unbiased Charged Circular CMUT Microphone: Lumped Element Modeling and Performance", IEEE Trans. Ultrason. Ferroelectr. Freq. Control, vol. 65, No. 1, pp. 60-71, Nov. 14, 2017.
A. Unlugedik, et al., "Designing Transmitting CMUT Cells for Airborne Applications," IEEE Trans. Ultrason. Ferroelectr. Freq. Control, vol. 61, pp. 1899-1910, 2014.
M. Funding La Cour, et al., "Electrostatic and Small-Signal Analysis of CMUTs With Circular and Square Anisotropic Plates," IEEE Trans. Ultrason. Ferroelectr. Freq. Control, vol. 62, No. 8, pp. 1563-1579, 2015.
H. Koymen, et al., "Designing Circular CMUT Cells Using CMUT Biasing Chart," 2012 IEEE International Ultrasonics Symposium Proceedings pp. 975-978, Dresden, Oct. 2012.
M. Engholm, et al., "Modeling of plates with multiple anisotropic layers and residual stress," Sens. and Act. A: Phys., vol. 240, pp. 70-79, Apr. 2016.
M. Rahman, et al., "An Improved Analytical Method to Design CMUTs With Square Diaphraghms," IEEE Trans. Ultrason. Ferroelectr. Freq. Control, vol. 260, No. 4, Apr. 2013.
International Search Report, ISA/EP, dated Oct. 8, 2018.
Written Opinion, ISA/EP, dated Oct. 8, 2018.

\* cited by examiner

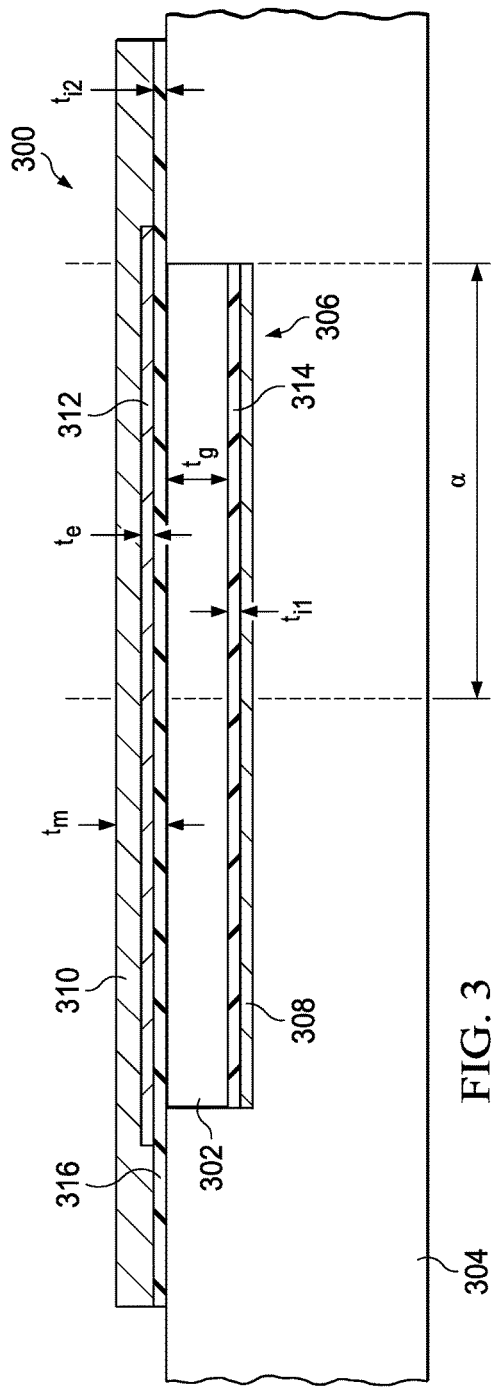
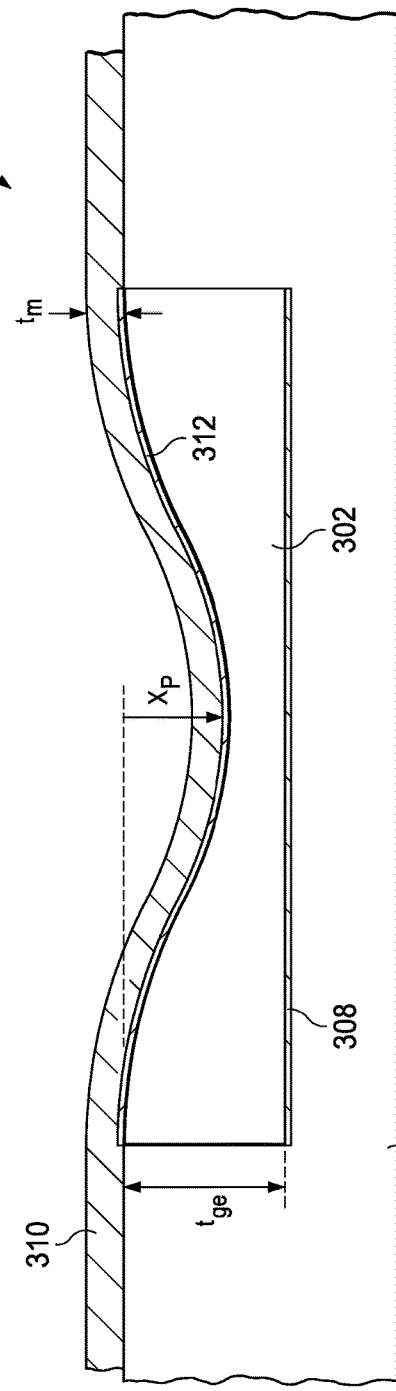
FIG. 3
FIG. 4

HIGH PERFORMANCE SEALED-GAP CAPACITIVE MICROPHONE

CROSS REFERENCE

The present application is a non-provisional of, and claims priority to, U.S. Provisional Pat. App. No. 62/477,510, filed on Mar. 28, 2017; and is a non-provisional of, and claims priority to, U.S. Provisional Pat. App. No. 62/614,897, filed on Jan. 8, 2018; and is a non-provisional of, and claims priority to, U.S. Provisional Pat. App. No. 62/616,424, filed on Jan. 11, 2018; all of which are incorporated herein by reference.

BACKGROUND

The present application relates to capacitive microphones with a sealed gap between the capacitor's conductive plates, and more particularly to capacitive Micro-machined Electro-Mechanical Systems (MEMS) microphones with a sealed gap for receipt of air-mediated sound.

Note that the points discussed below may reflect the hindsight gained from the disclosed innovative scope, and are not necessarily admitted to be prior art.

Microphones in consumer devices generally comprise pressure compensated MEMS microphones and pressure compensated electret microphones. An overview of pressure compensated microphones—that is, microphones which do not have a sealed gap—is provided below.

FIG. 1 schematically shows a cross-section of an example of a pressure compensated MEMS microphone 100. As shown in FIG. 1, a pressure compensated MEMS microphone 100 comprises an acoustic sensor 102 fabricated on a semiconductor substrate 104, the acoustic sensor 102 comprising a moveable, suspended membrane 106 (a vibrating plate) and a fixed sensor back plate 108. The back plate 108 is a stiff structure comprising perforations 110 that allow air to easily move through the back plate 108. Both the membrane 106 and the back plate 108 are connected to the substrate 104. The membrane 106 is located between the back plate 108 and the substrate 104, with a cavity 112 (a "gap") between the membrane 106 and the back plate 108. The perforations 110 enable pressure compensation of the gap 112, that is, they equalize the pressure on each side of the back plate 108. The membrane 106 is suspended over a front chamber 114 formed in the substrate 104.

The vibrating plate in a microphone can be called a membrane or a radiation plate, depending on the ratio between the radius and thickness of the membrane or radiation plate, as further described with respect to FIG. 3.

The substrate 104 is mounted on a carrier 116, which can be, for example, a lead frame or a printed circuit board. There is also a back chamber 118, which is surrounded by the carrier 116 and an enclosure 120 (e.g., a metal casing). An integrated circuit 122 for charging electrodes attached to the membrane 106 and the back plate 108, and for the interpreting the signal produced by the acoustic sensor 102, is coupled to the membrane 106 and the back plate 108 by wire bonds 124. A soldering pad 126 coupled to the integrated circuit 122 enables external input to and output from (e.g., power and signal, respectively) the microphone 100.

The membrane 106 is a thin solid structure made of a compliant (not stiff) material, such as a perforated solid material suitable for micromachining, that flexes in response to changes in air pressure caused by sound waves passed by the perforations 110 in the back plate 108. The membrane 106 does not fully seal the gap 112. Also, perforations in the membrane 106 (not shown) increase the membrane's 106 responsiveness to air-mediated sound waves by reducing membrane 106 stiffness (increasing flexibility), and by helping to equalize pressure on both sides of the membrane 106 (the side facing the back plate 108 and the side facing the substrate 104). As described above, the perforations 110 in the back plate 108 enable pressure compensation of the gap 112. In pressure compensated MEMS microphones 100 (and similarly in pressure compensated electret microphones 200, described below), the air pressure in the gap 112 is equal to the ambient static pressure, that is, the atmospheric pressure (thus the description "pressure compensated"). A pressure compensated gap 112 enables a more flexible membrane 106, because a static pressure difference between the gap-facing and substrate-facing sides of the membrane 106 is reduced. This means that there is effectively no static force against the membrane 106 due to air pressure.

The "ambient" is the medium (acoustic environment) through which acoustic waves are conducted to intersect a membrane, causing the membrane to vibrate, resulting in a signal being emitted from the microphone. For example, in microphones included in smartphones, the relevant ambient will generally be the atmosphere (air). As used herein, an "airborne" microphone is defined as a microphone for which the primary intended ambient is air.

FIG. 2 schematically shows a cross-section of an example of a pressure compensated electret microphone 200. An electret is a stable dielectric material with a permanently embedded stable electric dipole moment—that is, a permanently polarized piece of dielectric material. An electret microphone is a type of electrostatic capacitor-based microphone which uses an electret, and can thereby avoid using a polarizing power supply (used in a MEMS microphone 100 to apply charge to electrodes).

As shown in FIG. 2, an electret microphone 200 comprises an acoustic sensor 202, which in turn comprises an electret membrane 204 (e.g., a polymer electret membrane 204). A front chamber 206 is located on a front chamber 206 side (a first side) of the electret membrane 204. The front chamber 206 side of the electret membrane is electroded, and is clamped to a metal washer 208 at the electret membrane's 204 rim. The electret membrane 204 is separated from a back plate 210 to create a gap 212 on a gap 212 side (a second side) of the electret membrane 204. A constant gap 212 height is maintained by, for example, plastic washers 214. The back plate 210 comprises perforations 216 so that the gap 212 is pressure compensated. An amplifying transistor 218 is fixedly coupled to a carrier 220 (e.g., a lead frame or printed circuit board), and the amplifying transistor's 218 gate pin is coupled by a wire 222 to the back plate 210. The connection between the amplifying transistor 218 and the back plate 210 conveys received signal from the acoustic sensor 202 to the amplifying transistor 218. The amplifying transistor 218 interprets the signal produced by the acoustic sensor 202. The carrier 220 is coupled to the back plate 210 by a casing 224 (e.g., plastic casing). The carrier 220 is also fixedly coupled to a housing 226 (e.g., a metal housing), which holds the carrier 220, the casing 224, and the acoustic sensor 202. This coupling also electrically connects the electret membrane 204 and a source lead 228 of the amplifying transistor 218. A hole 230 in the housing 226, located proximate to the front chamber 206, gives acoustic waves access to the electret membrane 204. The hole 230 and the front chamber 206 are covered by a dust cover 232, which does not seal the electret microphone 200. That is, air, as well as humidity and other contaminants, can access the interior of the electret microphone 200.

Contamination can be mitigated, but not prevented, by the dust cover 232. The transistor 218 is located in a back chamber 234. The back chamber 234 is also proximate to the back plate 210 on a side of the back plate 210 distant from the gap 212. To maintain pressure compensation, the back chamber 234 is not sealed. Access to the source lead 224 and a drain lead 236 of the amplifying transistor 218 are provided at an outer surface of the carrier 220 (a surface distant from the back chamber 234) to enable external electrical connections for signal acquisition.

MEMS microphones 100 and electret microphones 200 detect sound by placing a fixed charge across the gap 112, 212, and measuring voltage variations caused by changes in the capacitance between the membrane 106, 204 and the back plate 108, 206 as a result of the membrane 106, 204 flexing in response to sound waves. MEMS microphones 100 apply the fixed charge using a bias voltage, and electret microphones 200 induce a fixed charge using an electret.

Typically, MEMS microphones 100 used in mobile phones are biased at 10 volts to 14 volts DC, generated using voltage doubler circuits to produce the appropriate voltage from a battery supply outputting 1.8 volts to 3.6 volts.

Typical electrets used in microphones are made of dielectric materials such as polymers used as membrane 204 material, or silicon oxide or silicon nitride in the back plate 210. Electrets can trap electrical charge in their bulk material or on their surface. Circuits including an electret are generally terminated using a terminating impedance. When the surfaces of an electret layer are properly electrically terminated, the trapped charge can yield, for example, a total charge corresponding to (which can be modeled as) a bias voltage of 150 to 200 volts polarizing the gap 212.

As discussed, pressure compensation means that the gap is open to ambient air in order to equalize gap pressure with ambient atmospheric pressure. A pressure compensated gap is therefore vulnerable to contamination by dirt, humidity or other foreign matter carried by the air that moves to and through it. Contamination of the gap can compromise microphone performance due to clogged gap vents, back plate perforations, and/or membrane holes, which cause noise. Membrane hole contamination reduces membrane compliance, which corresponds to a loss in microphone sensitivity. Also, material buildup in the gap can lower gap height, also lowering microphone sensitivity.

Signal-to-noise ratio (SNR) is the main competitive performance issue in the commercial microphone market, which encompasses microphones for devices such as smartphones, in-ear headphones and hearing aides. Typically, the SNR of commercial MEMS microphones ranges between 55 and 65 dB for a sensor area of approximately 1 mm$^2$. In microphones, SNR is measured when the input acoustic signal level is 94 dBA. The unit dBA refers to A-weighted decibels, which accounts for the human ear's different perception of loudness at different frequencies.

SNR is defined as the ratio of: the root-mean-square (rms) voltage across the terminals of the microphone, when the microphone is placed on a rigid baffle and a free field pressure wave of 1 Pa rms amplitude at 1 kHz frequency is incident on the microphone; to the rms voltage across the terminals of the microphone, filtered using A-weighted filters, when the microphone is completely isolated from any sound sources, such as in an anechoic chamber. The sound level at 0 dBA, which corresponds to about 20 µPa rms, is accepted as the hearing threshold of the human ear (though clinically measured threshold levels are much louder). The maximum possible SNR is about 94 dB, because the inherent noise induced by acoustic radiation physics (the radiation resistance, described below, which provides a generally-applicable noise floor) is about 0 dBA in a microphone with 1 mm$^2$ area.

A rigid baffle is an infinite, perfectly reflecting surface around the boundary of an acoustic aperture of a microphone. If a microphone is mounted on a rigid baffle, the incoming acoustic wave will create twice the free field pressure on the microphone's vibrating element that it would in empty space.

Noise in a microphone, which reduces the maximum possible SNR of the microphone, predominantly comes from one of three sources: radiation resistance of the membrane; mechanical losses caused by molecular friction in the material of vibrating parts, and/or by macroscopic friction of mechanical parts in the microphone moving against each other; and in pressure compensated microphones, mechanical losses caused by fluid friction, including the friction of air moving through perforations (holes) in a membrane or substrate, and the squeezed film friction effect in the gap. There can be other losses, such as electrical energy loss from dielectric loss in the insulator layer. Some pressure compensated MEMS microphones have a noise floor of about 30 dBA, with pressure compensation contributing most of this noise. The noise floors in pressure compensated electret microphones are generally higher than in comparable MEMS microphones.

Radiation resistance is the real component of radiation impedance (a complex number). Radiation impedance relates to Newton's third law of motion: every action has a reaction of equal magnitude and in the opposite direction. A transmitting acoustic transducer (such as a loudspeaker) applies a force onto the medium (pushes the medium, such as air, to and fro) at its aperture during transmission. The medium also exerts a reaction force on the transducer surface. The reaction force is equal to the product of the velocity of the transducer surface (the aperture) and the radiation impedance. Radiation impedance is a complex number with two components: radiation resistance (the real component) and radiation reactance (the imaginary component). Part of the reaction force, corresponding to the radiation resistance, generates acoustic waves, which radiate out from the aperture into the medium. The energy comprising the radiated acoustic waves (corresponding to the radiation resistance) is lost with respect to the transducer (the transducer does not recover the energy used to create the acoustic waves).

Acoustic transmission and acoustic reception are reciprocal phenomena. Therefore, radiation impedance is also present in acoustic reception (microphones). Radiation resistance is a source of noise in acoustic reception. The noise generated by radiation resistance is the noise floor of a 100% efficient microphone with no other sources of mechanical or electrical energy loss.

When an acoustic wave is incident on the microphone membrane, the acoustic field energy is included in the transduction and a force is applied on the membrane surface, which moves the membrane. The reaction force of the membrane, applied onto the medium (the ambient), is equal to the product of the radiation impedance and the velocity of the membrane. The incident acoustic energy is first partly dissipated by the resistive part of the radiation impedance. Remaining energy is then available to the transduction mechanism (that is, acoustic reception in a microphone). Radiation resistance is an energy dissipative factor in transduction, and therefore generates noise during reception.

The squeeze film effect refers to two consequences of air periodically squeezed between a vibrating membrane and a static substrate: (1) increasing air pressure forces air to escape from the gap through available outlets, e.g. holes, causing friction, which dissipates (loses) energy; and (2) increasing air pressure in the gap increases the temperature of the temporarily compressed (squeezed) air (following Gay-Lussac's Law), which causes energy loss by converting mechanical energy into heat.

Some typical integrated commercial MEMS microphones used in mobile phones are operated with a dc bias voltage of 10-14 volts, with an approximately 28-30 dBA noise floor in their audio bandwidth. This amount of self noise corresponds to an SNR of 66 dB or less at the transducer output before pre-amplification, when the incident signal level is 1 Pa. Such commercial MEMS microphones typically have about −38 dB re V/Pa maximum OCRV (open circuit receive voltage) sensitivity.

A Capacitive Micromachined Ultrasonic Transducer (CMUT) is a capacitive transducer. CMUTs can be used to transmit and receive ultrasonics. CMUTs have a wide bandwidth in water and in a frequency range near their first (lowest) resonance frequency. Microphones generally have many resonances. At a resonance, the amount of applied force, external pressure or electromechanical force required to induce high-amplitude vibration of the membrane is reduced. Ultrasonic transducers (such as CMUTs) are usually operated near their first resonance frequency. This enables the transducers to be highly sensitive; however, for efficient transmission and/or reception to be maintained, the transducer will have either a narrow operation bandwidth, or increased internal loss and consequent increased noise (lower SNR). Internal loss is power loss, and is the sum of power lost through mechanical and electrical energy loss mechanisms other than radiation resistance.

In some examples, CMUTs can have a pressure compensated gap, resulting in a compliant radiation plate and a relatively wide bandwidth. In some examples, CMUTs can have a sealed gap, resulting in low internal loss (in some examples, less than their radiation resistance in air). CMUTs are typically characterized as receivers when operated at a resonance frequency, and as microphones when operated off-resonance. A sealed gap can contain a sealed-in gas, or a vacuum (a "vacuum gap"). Internal loss in CMUT transducers is typically small with respect to the noise introduced by radiation resistance—small enough to be difficult to accurately measure. In some examples, losses and radiation impedance in sealed gap airborne CMUTs generate about 0 dBA in the audio bandwidth, which is slightly more than the noise contribution of the CMUT's radiation resistance in a 1 mm$^2$ microphone operated off-resonance in an audible range (generally, about 10 Hz to 20 kHz).

A pressure compensated MEMS microphone comprising a transducer, sealed membranes and a sealed volume is disclosed by U.S. Pat. No. 6,075,867.

An integrated and programmable microphone bias generation system is described by U.S. Pat. No. 8,288,971.

An implantable microphone which uses a housing to hermetically seal the microphone is described in U.S. Pat. No. 9,451,375. This microphone compensates for noise artifacts caused by the housing by using two highly compliant parallel membranes, compliance of the membranes being enhanced by respective pressure compensated gaps.

An implantable microphone which uses a perforated membrane for pressure compensation is described in U.S. Pat. No. 7,955,250. The perforation in the membrane makes the membrane more compliant, and thus increases sensitivity. U.S. Pat. No. 9,560,430 also describes a microphone with a perforated membrane.

A microphone module which uses vents to enable pressure compensation, and for driving water out of the system, is described by U.S. Pat. Pub. No. 2015/0163572.

A pressure compensated microphone module for a phone watch that uses a hydrophobic plate covered by an "impermeable" membrane—which allows passage of gasses—to enable pressure compensation, and to keep water out of the microphone, is described by Pat. Pub. No. 2001/0019945.

Some microphones use hydrophobic and/or oleophobic materials to cover microphone components to protect them from fluids. For example, a microporous composite material containing polytetrafluoroethylene (PTFE) is described in Pat. Pub. No. 2014/0083296 for use in filters, vents or protective membranes. PTFE is gas permeable such that it can both be used as a protective membrane and enable pressure compensation. A hydrophobic mesh (umbrella-shaped, covering an acoustic port), is described in U.S. Pat. No. 9,363,589. However, PTFE, hydrophobic mesh, and other methods of "waterproofing" microphones with pressure compensated gaps will generally degrade performance (due to isolation of sound-detection membranes from sound sources), and will fail to protect transducers from water given a relatively small static pressure difference between the external environment (e.g., immersion in water at a depth of a meter) and the gap, or given repeated submersion.

A MEMS microphone with a piezoelectric (rather than capacitive or electret) membrane, which can be covered by a Parylene film for waterproofing, is described in U.S. Pat. Pub. 2014/0339657. Piezoelectric MEMS microphones are fabricated using different production processes than capacitive microphones.

The inventors endeavor to disclose new and advantageous approaches to a capacitive MEMS microphone with a sealed gap, and methods for designing such microphones, as further described below.

SUMMARY

Some preferred embodiments include a microphone system for receiving sound waves, the microphone including a back plate, a radiation plate, first and second electrodes, first and second insulator layers, a power source and a microphone controller. The radiation plate is clamped to the back plate so that there is a hermetically sealed circular gap between the radiation plate and the back plate. The first electrode is fixedly attached to a side of the back plate proximate to the gap. The second electrode is fixedly attached to a side of the radiation plate. The insulator layers are attached to the back plate and/or the radiation plate, on respective gap sides thereof, so that the insulator layers are between the electrodes. The microphone controller is configured to use the power source to drive the microphone at a selected operating point comprising normalized static mechanical force, bias voltage, and relative bias voltage level. A radius and height of the gap, and a thickness of the radiation plate, are determined using the selected operating point so that a sensitivity of the microphone at the selected operating point is an optimum sensitivity for the selected operating point.

Numerous other inventive aspects are also disclosed and claimed.

BRIEF DESCRIPTION OF THE DRAWINGS

The disclosed inventive subject matter will be described with reference to the accompanying drawings, which show important sample embodiments and which are incorporated in the specification hereof by reference, wherein:

FIG. 3 schematically shows an example of a cross section view of a Micromachined Capacitive Microphone (MCM) with an undeflected radiation plate.

FIG. 4 schematically shows an example of a cross section view of a MCM with a depressed radiation plate.

that enables an MCM to meet the elastic linearity constraint, and normalized static mechanical force $F_b/F_g$, for example values of the relative bias voltage level $V_{DC}/V_C$.

Figure 8A:
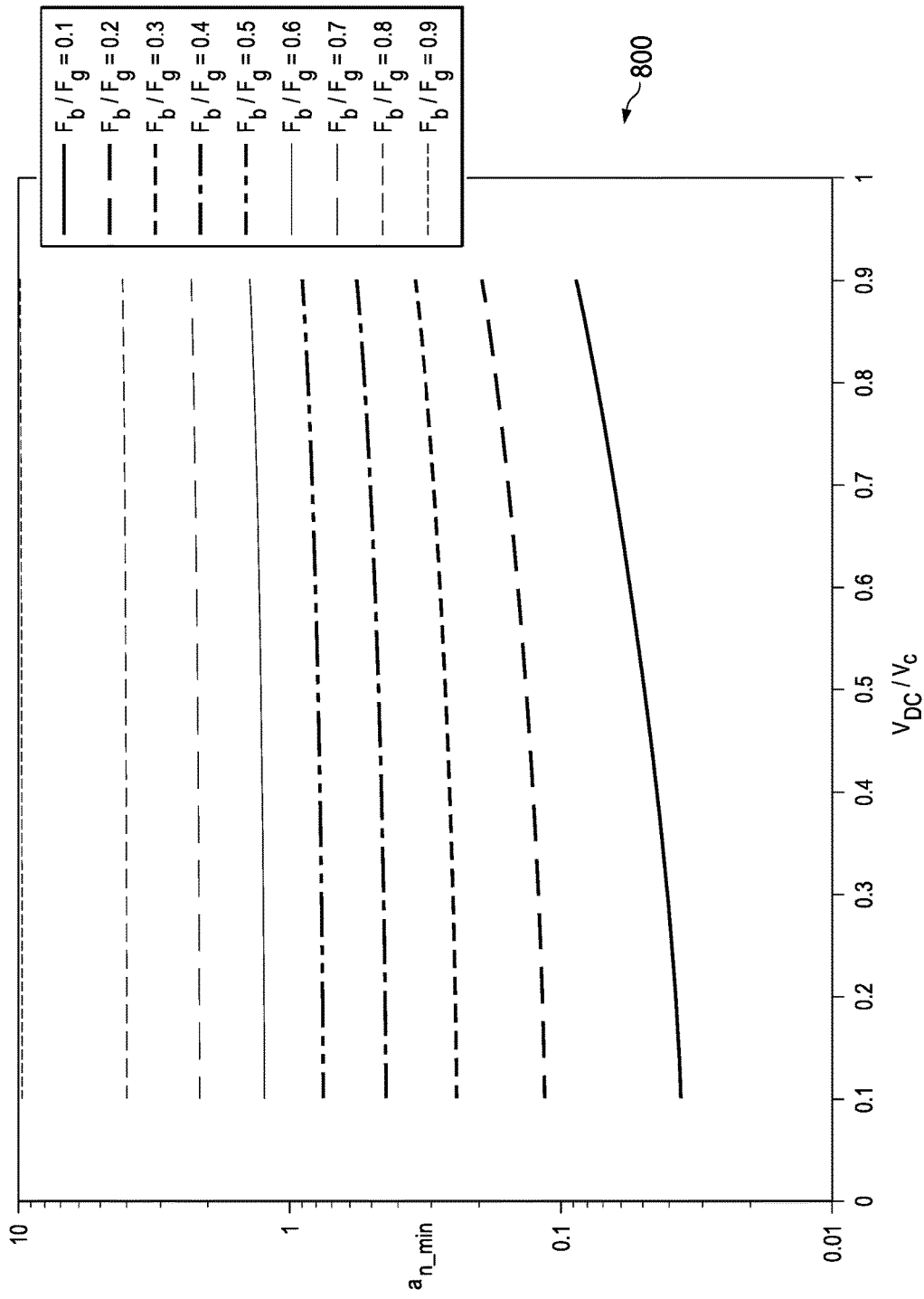

FIG. 8A shows a log-lin semi-log graph of the relationship between normalized minimum gap radius $a_{n\_min}$ that enables an MCM to meet the elastic linearity constraint, and normalized static mechanical force $F_b/F_g$, for example values of the relative bias voltage level $V_{DC}/V_C$.

Figure 8B:
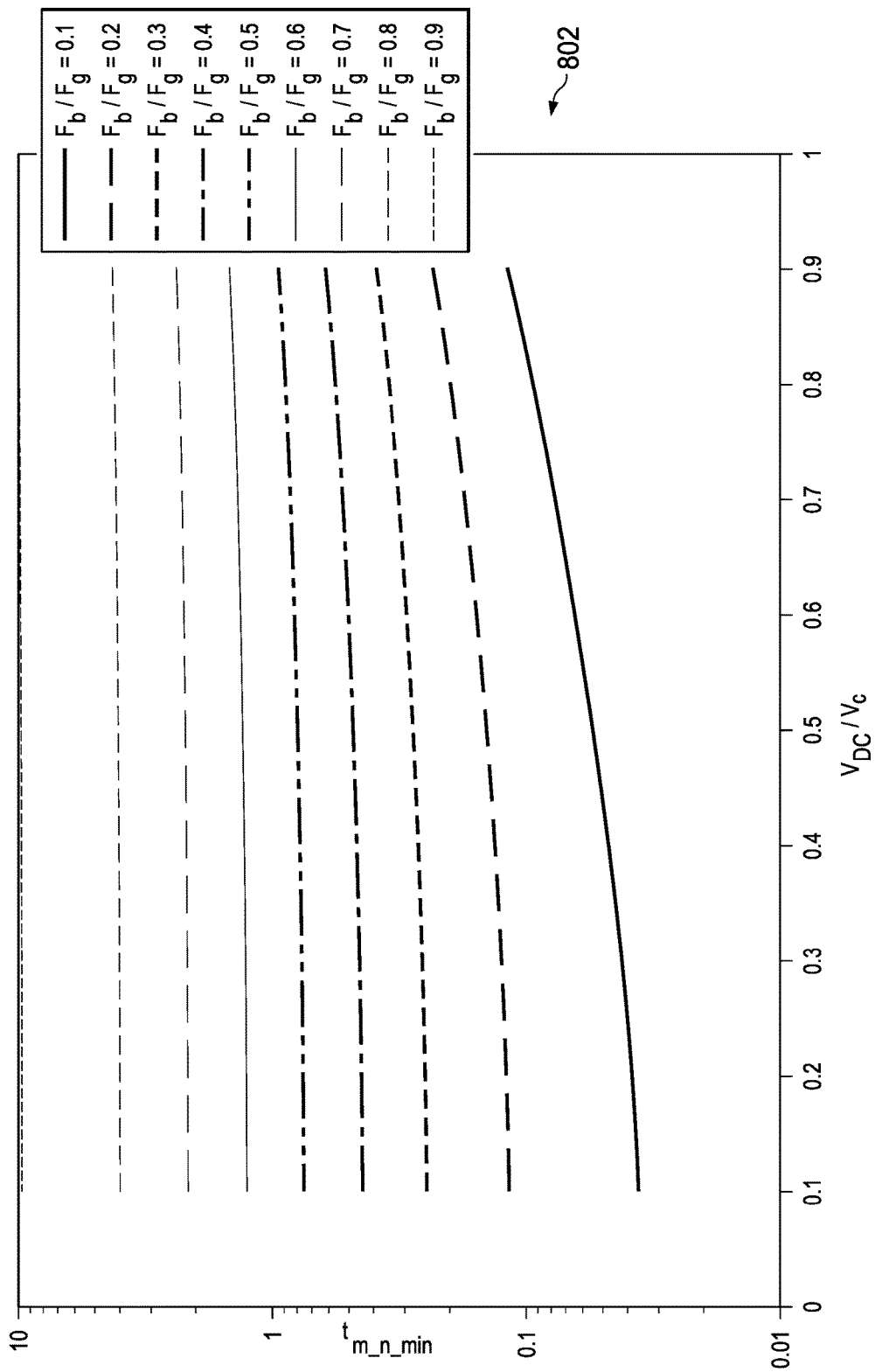

FIG. 8B shows a log-lin semi-log graph of the relationship between normalized minimum radiation plate thickness $t_{m\_n\_min}$ that enables an MCM to meet the elastic linearity constraint, and normalized static mechanical force $F_b/F_g$, for example values of the relative bias voltage level $V_{DC}/V_C$.

Figure 9:
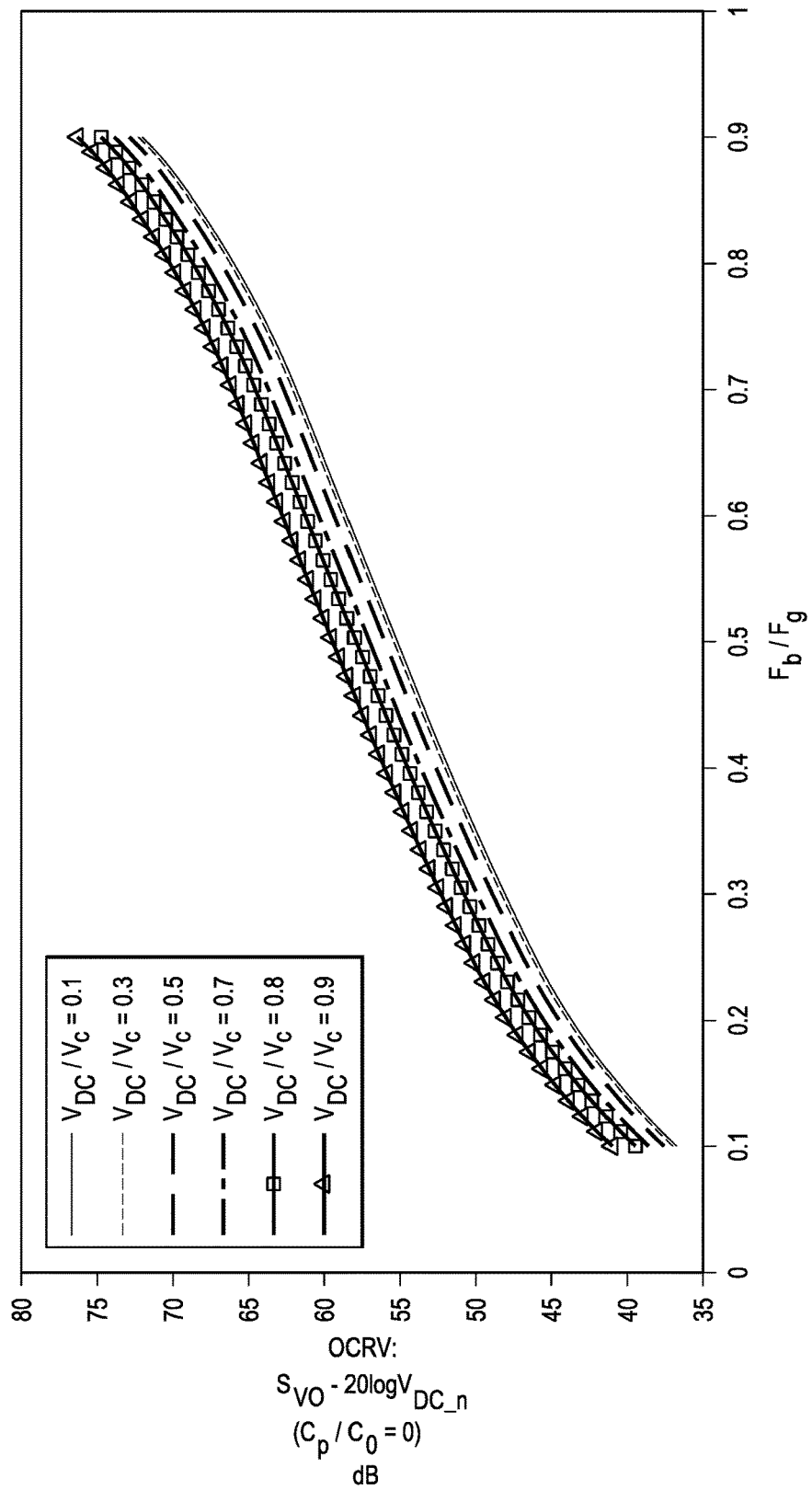

FIG. 9 shows a semi-log graph of the relationship between normalized Open Circuit Received Voltage Sensitivity (OCRV) and normalized static mechanical force $F_b/F_g$, for example values of the relative bias voltage level $V_{DC}/V_C$, where parasitic capacitance $C_p$ divided by clamped capacitance $C_0$ equals zero ($C_p/C_0=0$).

Figure 10:
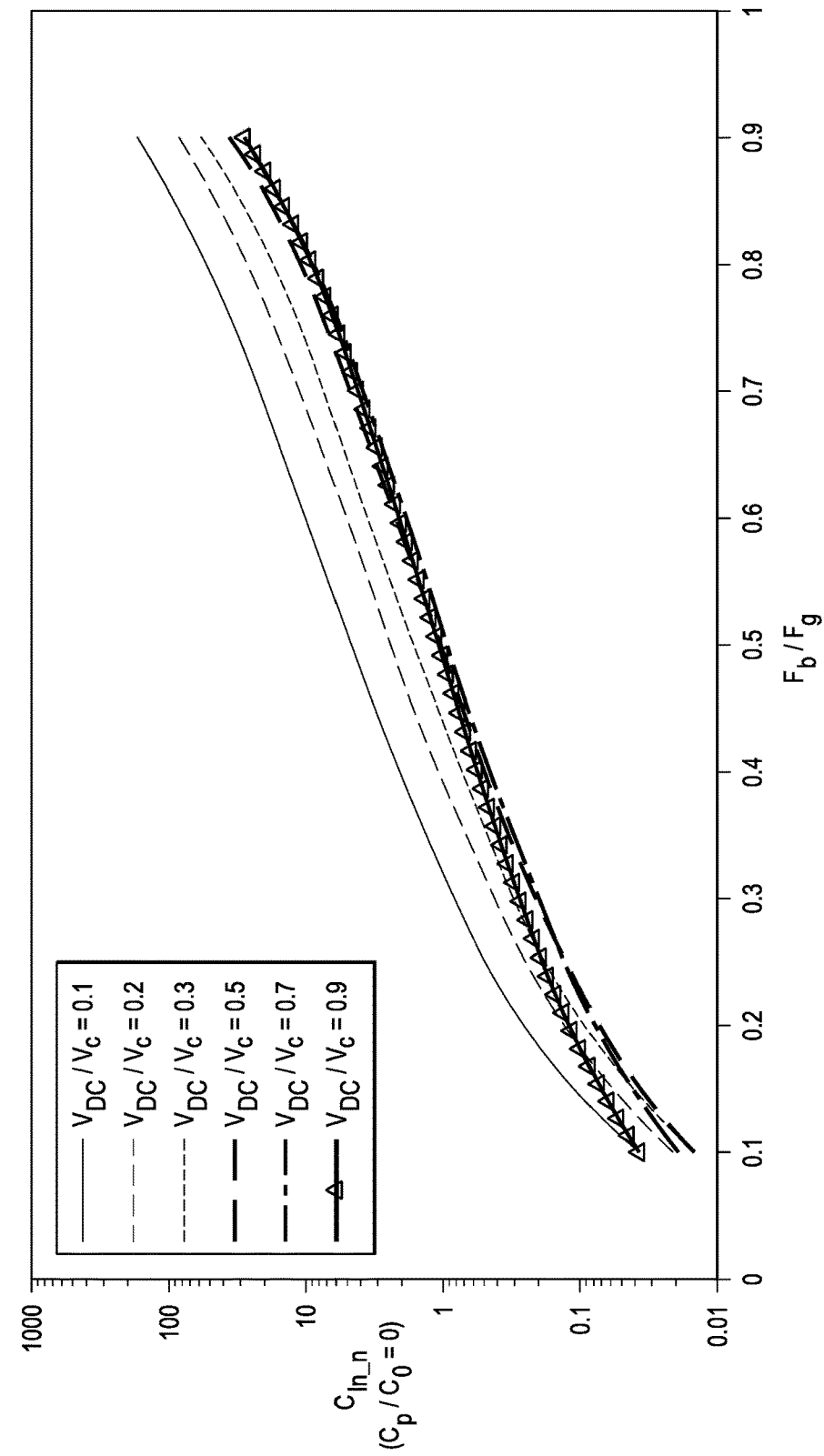

FIG. 10 shows a log-lin semi-log graph of the relationship between normalized input capacitance $C_{in\_n}$ and normalized static mechanical force $F_b/F_g$, for example values of the relative bias voltage level $V_{DC}/V_C$, where the normalized radius-to-thickness ratio equals the maximum normalized radius-to-thickness ratio $$\left(\frac{a}{t_m}\right)_N$$

which enables linearly elastic operation.

Figure 11:
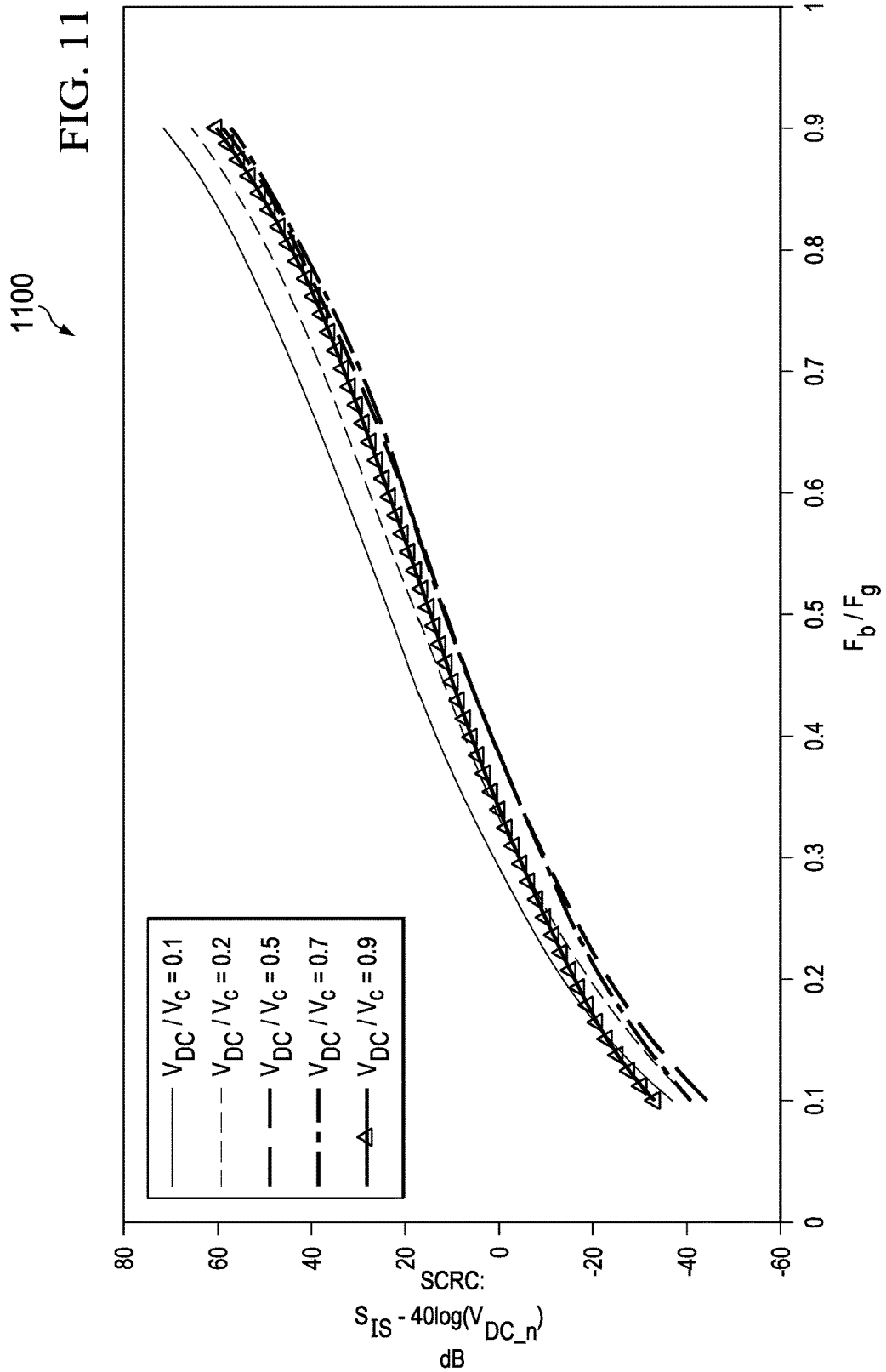

FIG. 11 shows a graph of the relationship between normalized Short Circuit Received Current Sensitivity (SCRC) and normalized static mechanical force $F_b/F_g$, for example values of the relative bias voltage level $V_{DC}/V_C$.

Figure 12:
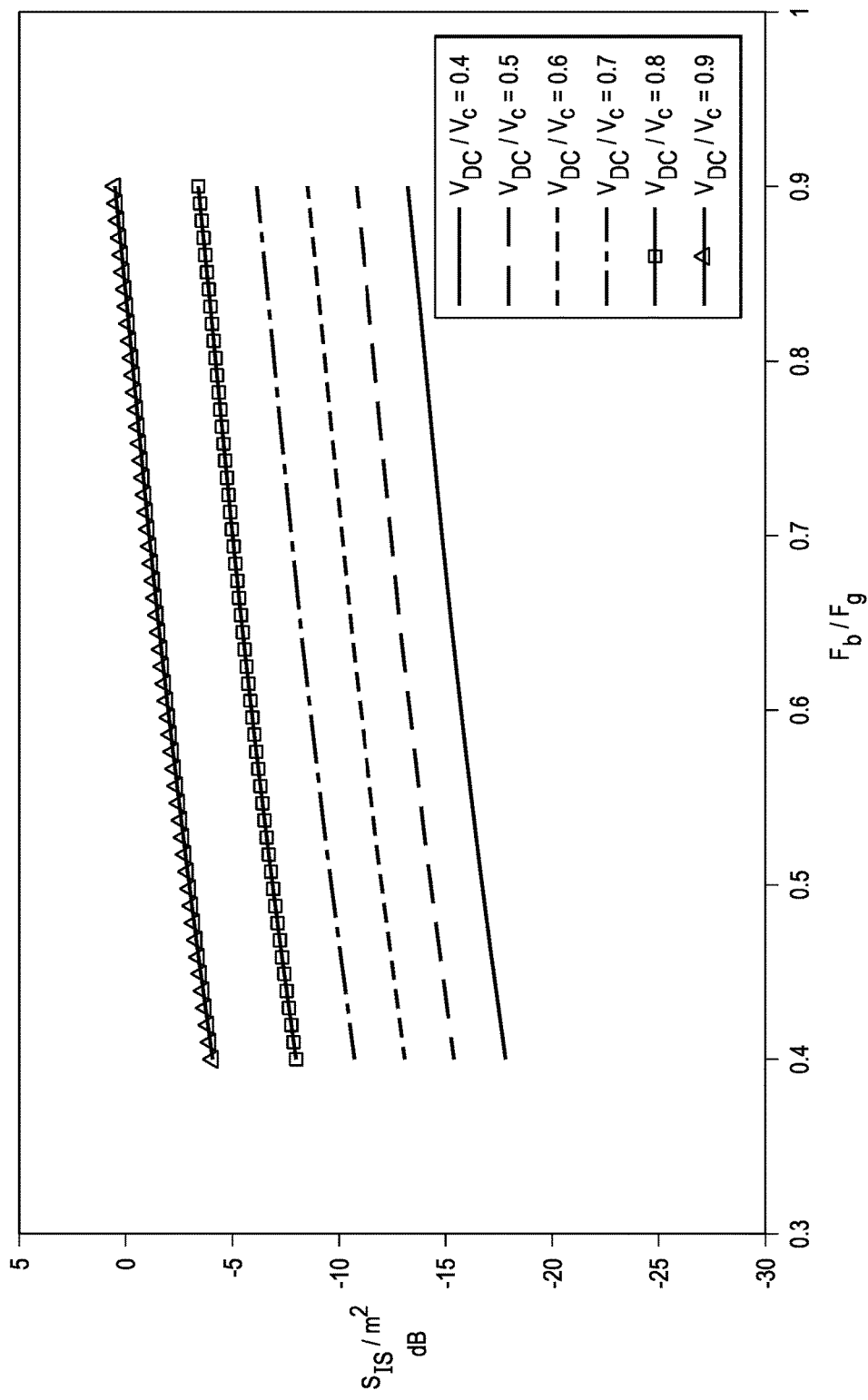

FIG. 12 shows a graph of the relationship between normalized Short Circuit Received Current Sensitivity (SCRC) per square meter and normalized static mechanical force $F_b/F_g$, for example values of the relative bias voltage level $V_{DC}/V_C$.

Figure 13:
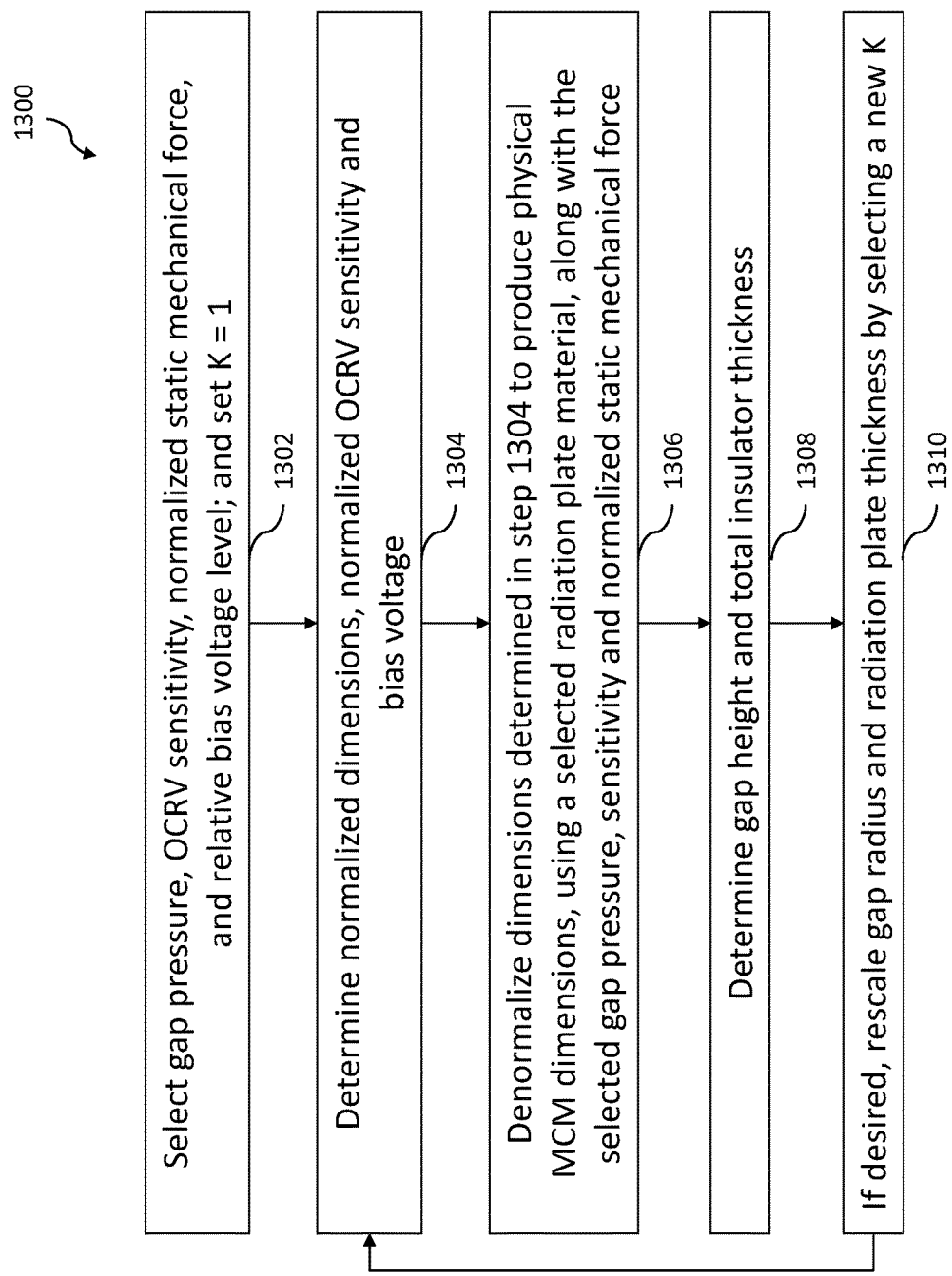

FIG. 13 shows an example process for design of an MCM, starting with a selected OCRV sensitivity, normalized static mechanical force $F_b/F_g$, and relative bias voltage $V_{DC}/V_C$.

Figure 14:
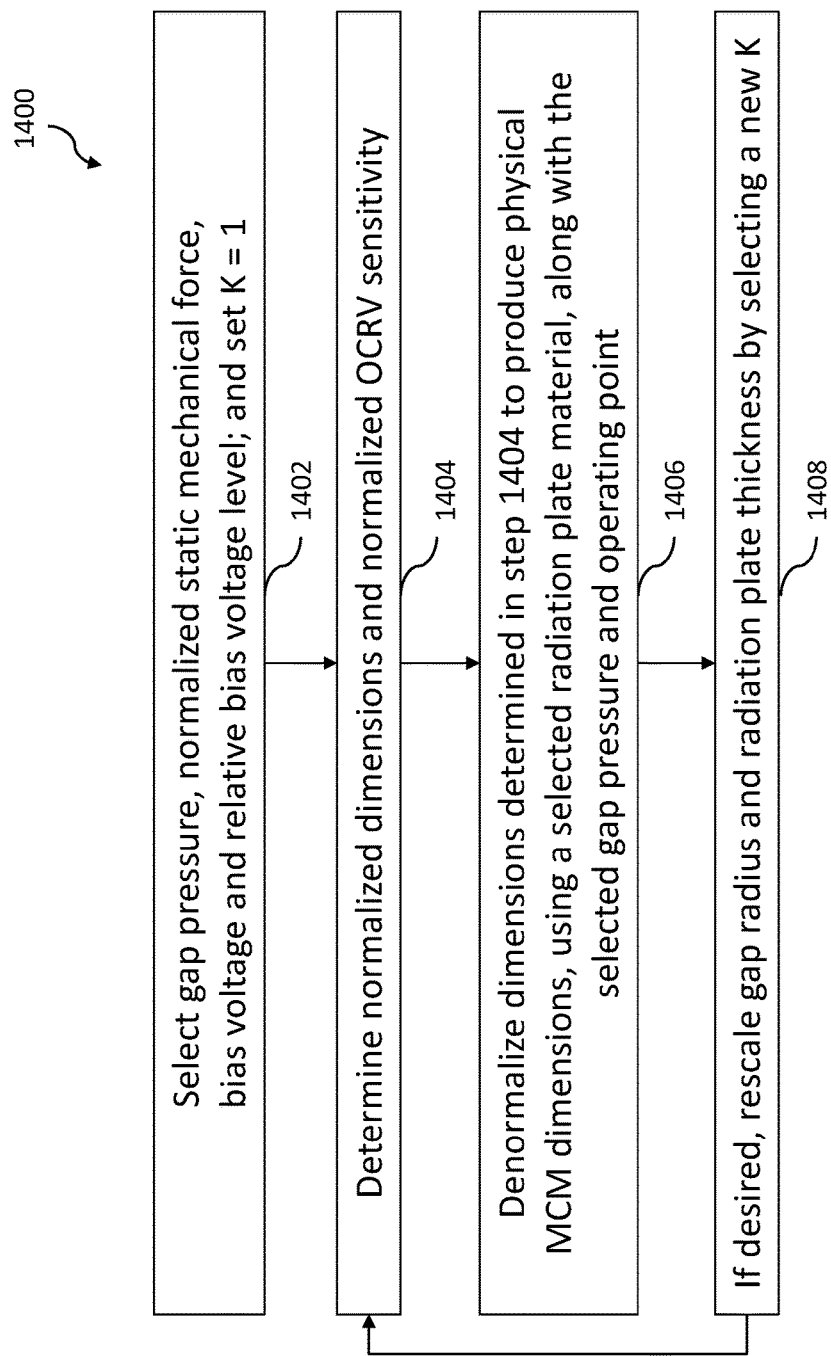

FIG. 14 shows an example process for design of an MCM, starting with a selected normalized static mechanical force $F_b/F_g$, bias voltage $V_{DC}$, and relative bias voltage $V_{DC}/V_C$.

Figure 15:
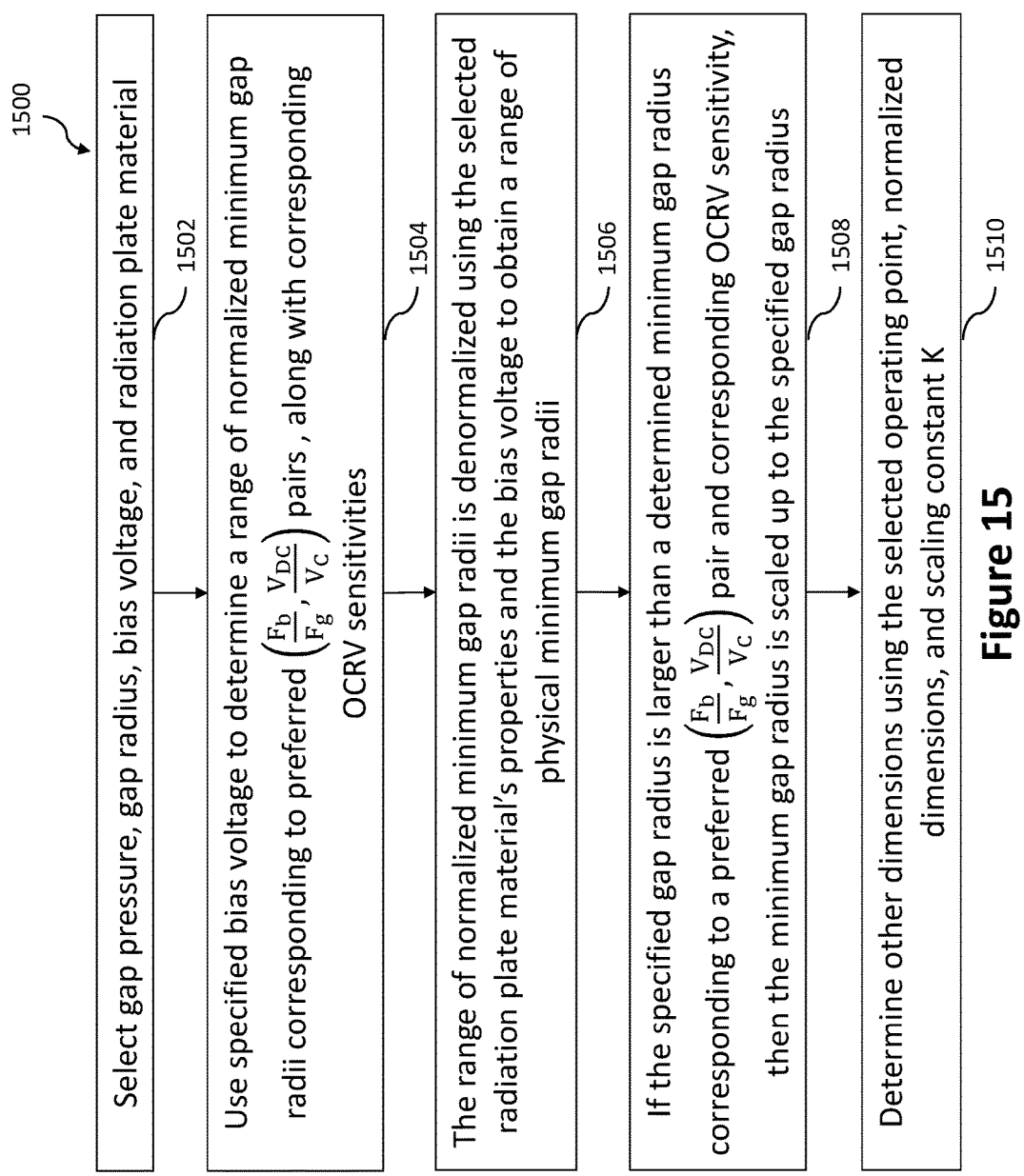

FIG. 15 shows an example process for design of an MCM, starting with a selected gap radius a, bias voltage $V_{DC}$, and radiation plate 310 material.

Figure 16:
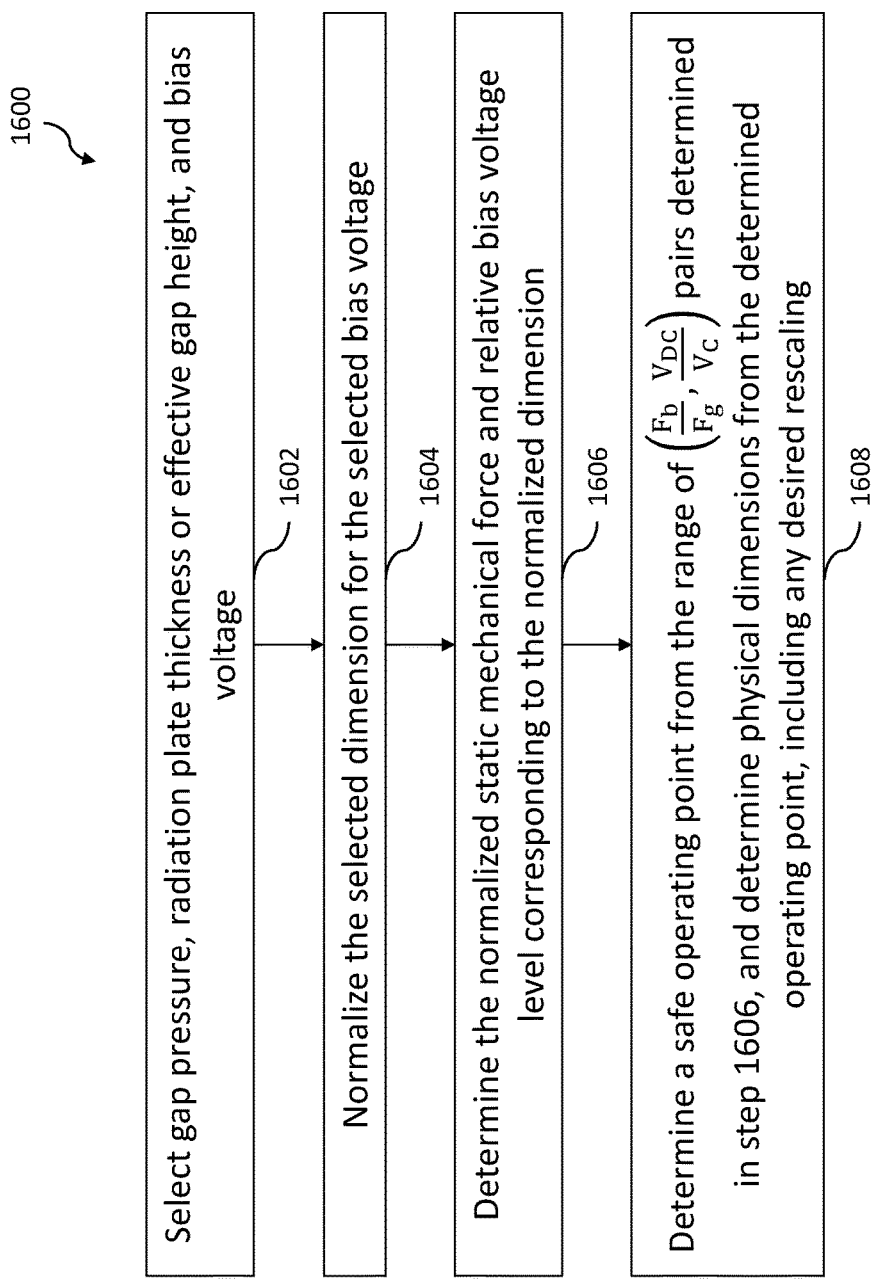

FIG. 16 shows an example process for design of an MCM, starting with a selected radiation plate thickness $t_m$ or effective gap height $t_{ge}$, and a selected bias voltage $V_{DC}$ or other parameter dependent on bias voltage $V_{DC}$.

Figure 17:
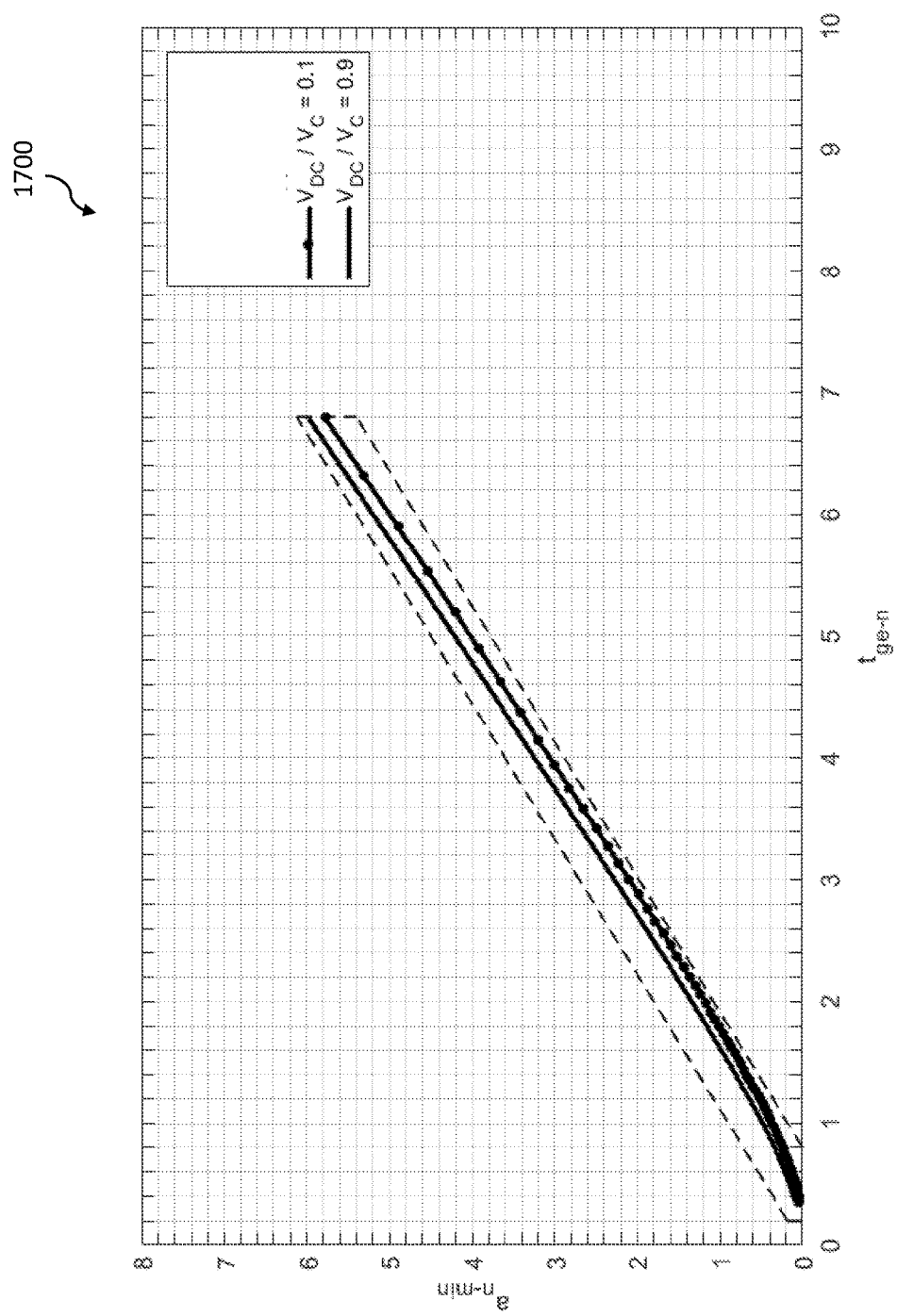

FIG. 17 shows a graph of the relationship between normalized minimum gap radius $a_{n\_min}$ and normalized effective gap height $t_{ge\_n}$ for various values of the relative bias voltage level $V_{DC}/V_C$.

Figure 18:
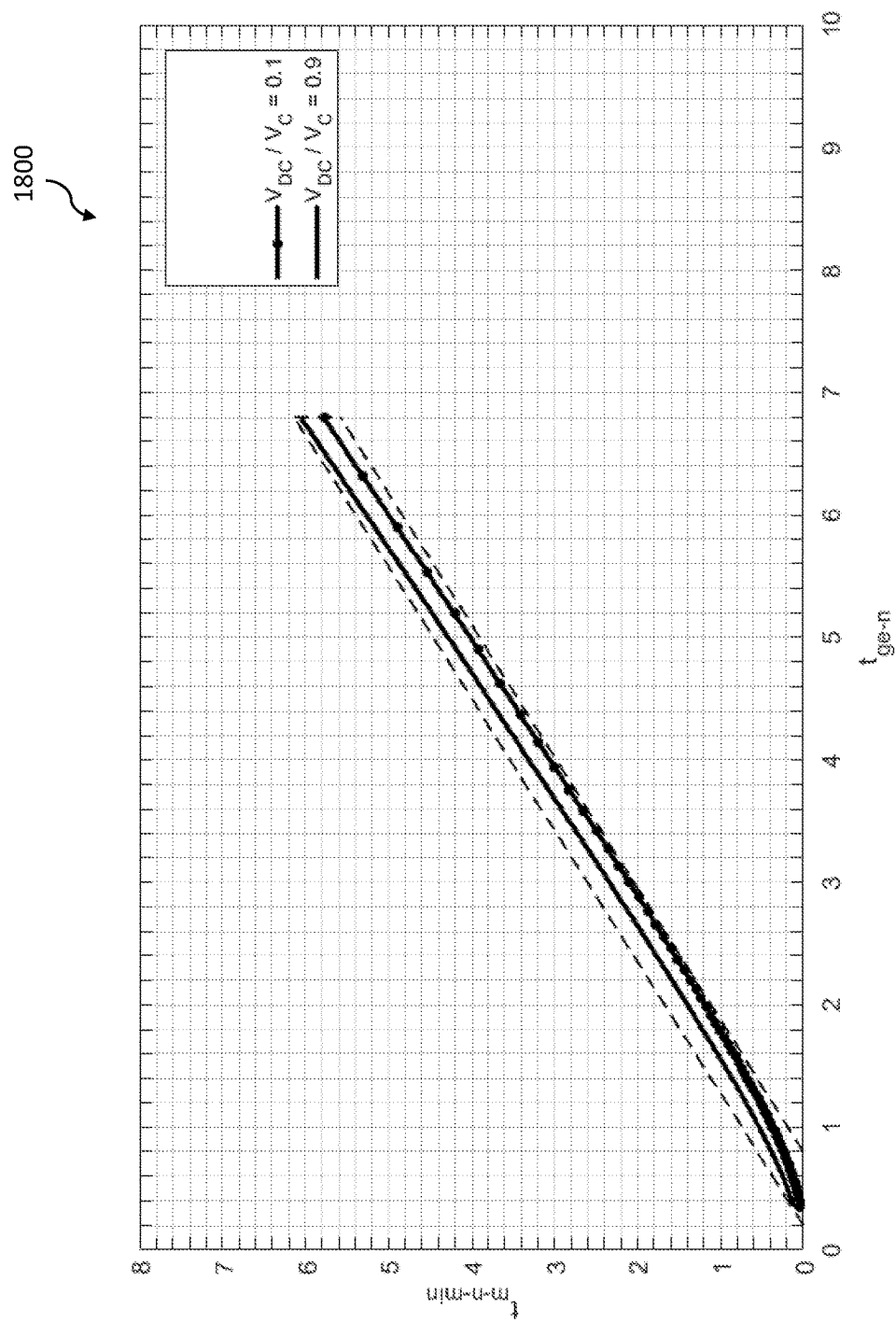

FIG. 18 shows a graph of the relationship between normalized minimum radiation plate thickness $t_{m\_n\_min}$ and normalized effective gap height $t_{ge\_n}$ for various values of the relative bias voltage level $V_{DC}/V_C$.

Figure 19:
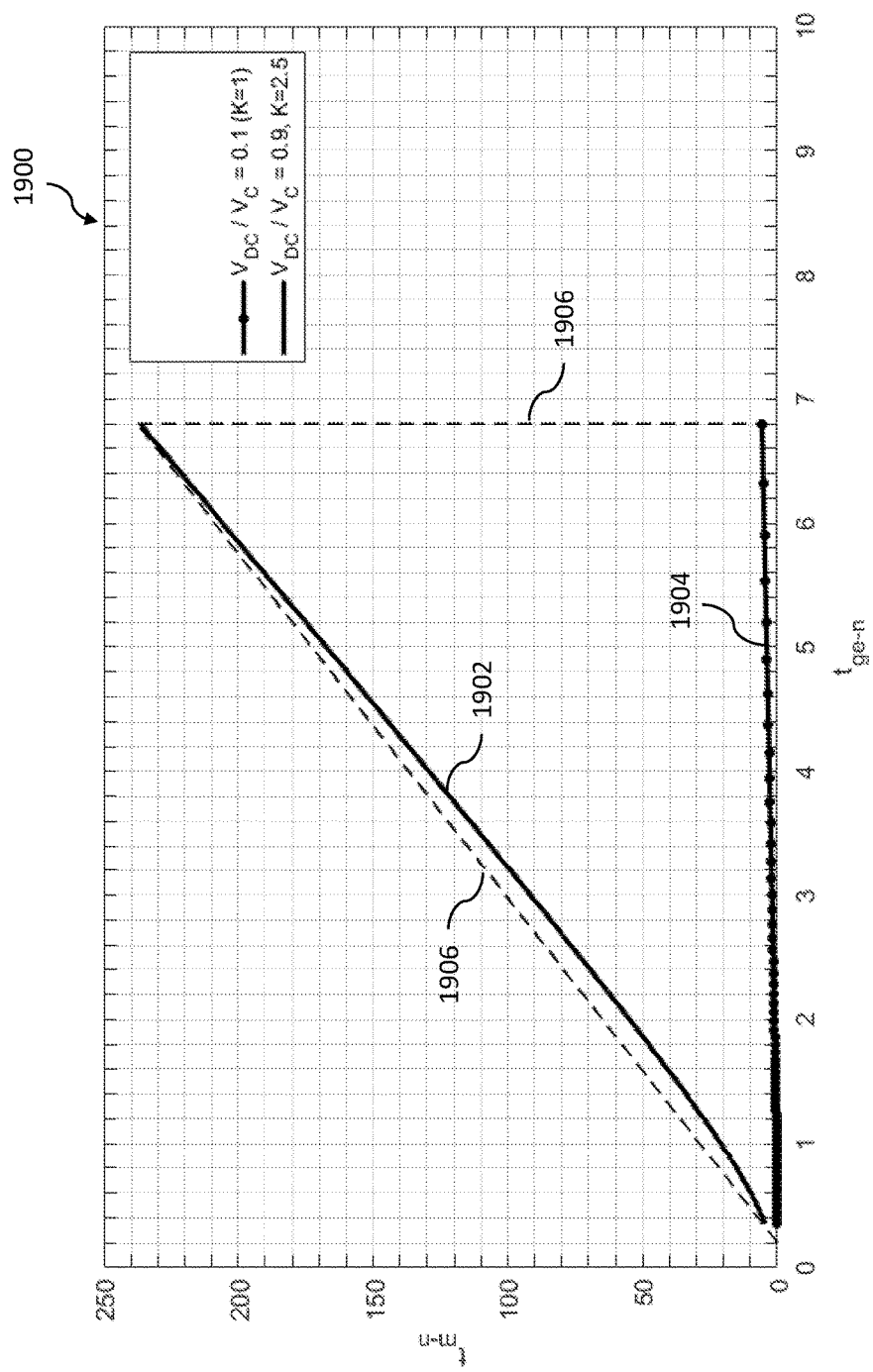

FIG. 19 shows a graph of the relationship between normalized gap radius $a_n$ and normalized effective gap height $t_{ge\_n}$ for various values of the relative bias voltage level $V_{DC}/V_C$ and various values of the scaling constant K.

Figure 20:
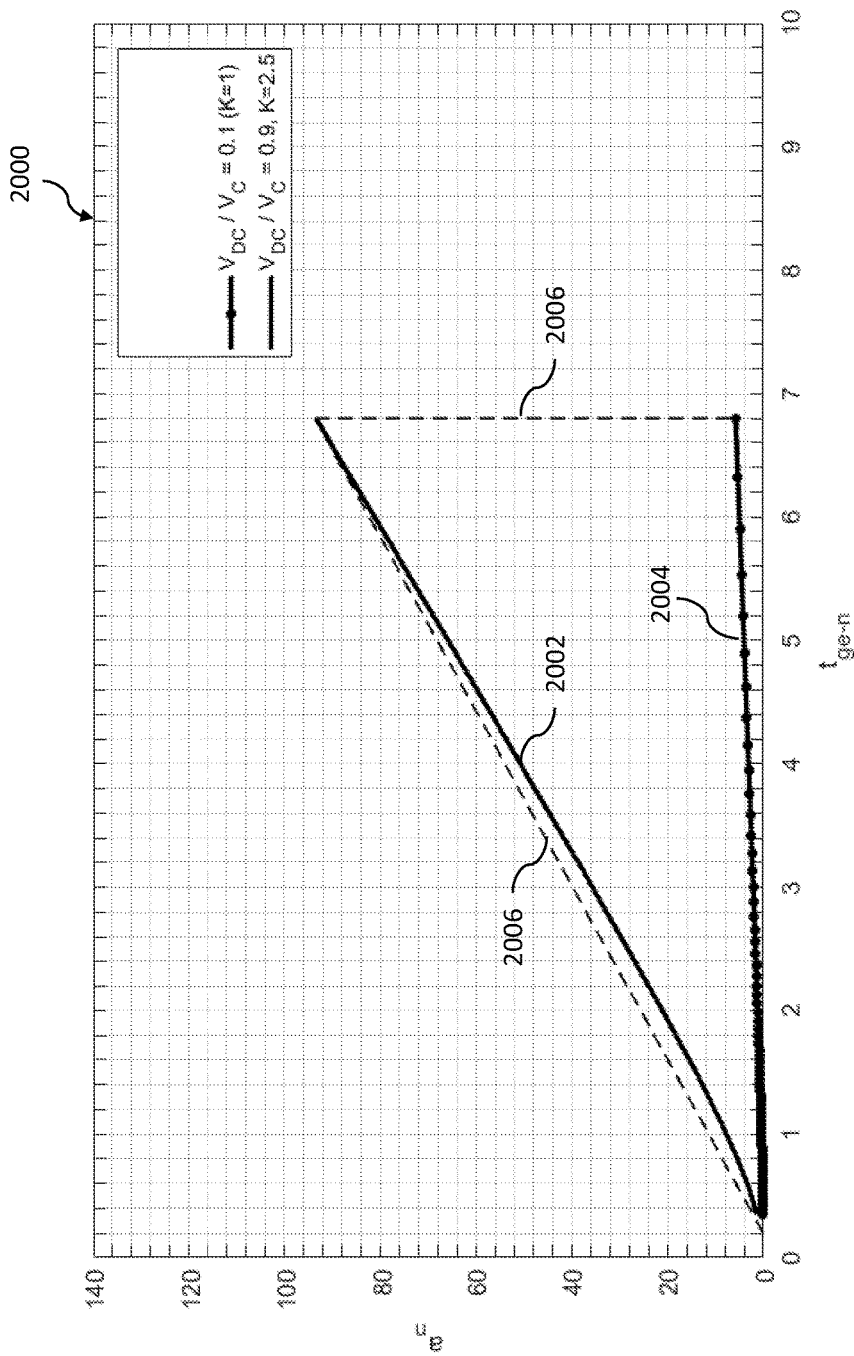

FIG. 20 shows a graph of the relationship between normalized radiation plate thickness $t_{m\_n}$ and normalized effective gap height $t_{ge\_n}$ for various values of the relative bias voltage level $V_{DC}/V_C$ and various values of the scaling constant K.

DETAILED DESCRIPTION OF SAMPLE EMBODIMENTS

The numerous innovative teachings of the present application will be described with particular reference to presently preferred embodiments by way of example, and not of limitation. The present application describes inventive scope, and none of the statements below should be taken as limiting the claims generally.

The present application discloses new approaches to capacitive MEMS microphones with a sealed gap, and to design of such microphones.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

A capacitive MEMS microphone with a sealed gap is disclosed herein which is preferably an airborne microphone configured for off-resonance operation (described below with respect to FIG. 3). Such microphones are referred to herein as Micromachined Capacitive Microphones (MCM).

The inventors have made the surprising discovery that MCMs can be constructed with gap and vibrating membrane dimensions that result in robust uncollapsed, linearly elastic operation with high sensitivity and little or no self-noise—in some embodiments, an SNR of approximately 94 dBA can be achieved across the audible spectrum! Further, because MCMs are sealed, they are waterproof, in some embodiments down to tens of meters in depth.

The inventors have also made the surprising discovery that certain MCM operating parameters and MCM gap and vibrating membrane dimensions are deterministically related, such that MCM dimensions which will result in high sensitivity (or optimal sensitivity for selected operating parameters) can be determined from selected operating parameters. In other words, microphone design can be performed backwards for MCMs, starting from selected performance requirements, which can be used to determine corresponding physical microphone dimensions which will result in those performance characteristics! Moreover, if an MCM microphone is made from solid materials suitable for MEMS device fabrication, the determined dimensions will generally be unaffected by the particular materials used!

MCMs are related to CMUTs, but preferably operate in an audible range. MCMs can be used in, for example, airborne consumer and professional products, such as computers, ear phones, hearing aids, mobile phones, wireless equipment and wideband precision acoustic measurement and recording systems. Preferred MCM embodiments comprise a relatively simple structure which can be fabricated at low cost using standard MEMS processes.

In an MCM, dimensions of the microphone that optimize microphone sensitivity, SNR and other performance characteristics can be determined by selecting values for three operating parameters (an "operating point"): normalized static mechanical force $F_b/F_g$, bias voltage of electrodes $V_{DC}$, and relative bias voltage $V_{DC}/V_C$. (When not specified, "sensitivity" herein refers to the Open Circuit Receive Voltage (OCRV) sensitivity.) The operating point, including the collapse voltage $V_C$, is further described below, along with the relationships between the operating point, MCM dimensions, MCM sensitivity and other MCM parameters. Further, the operating point can be used to determine normalized values for microphone dimensions which are independent of properties of materials used in fabricating the microphone. De-normalized microphone dimensions (physical dimensions for fabrication) can then be determined from normalized dimensions using elastic properties (Young's modulus and Poisson's ratio) of a vibrating element (radiation plate), a static differential pressure between the gap and the ambient atmosphere (referred to herein as the ambient), and the permittivities of insulator layers connected to gap-facing sides of the radiation plate. These relationships are described below.

A model relating various dimensions and properties of CMUTs is developed in H. Köymen, A. Atalar, E. Aydoğdu, C. Kocabaş, H. K. Oğuz, S. Olçum, A. Özgürlük, A. Ünlügedik, "An improved lumped element nonlinear circuit model for a circular CMUT cell," *IEEE Trans. Ultrason. Ferroelectr. Freq. Control*, Vol. 59, no. 8, pp. 1791-1799, August 2012, which is incorporated herein by reference (and referred to herein as the "Circuit Model reference"). This model is further developed in H. Köymen, A. Atalar and H. K. Oğuz, "Designing Circular CMUT Cells Using CMUT Biasing Chart," 2012 IEEE International Ultrasonics Symposium Proceedings pp. 975-978, Dresden, October, 2012 (the "CMUT Design reference"). As MCM structure is based on principles of CMUT operation, the model developed in the Circuit Model and CMUT Design references is relevant to MCM design. However, the relationships described herein enabling determination of MCM measurements and OCRV sensitivity from an operating point were not stated in the Circuit Model and CMUT Design references.

A single capacitive microphone, such as an MCM, is also called a "cell". A microphone system can comprise multiple cells.

FIG. 3 schematically shows an example of a cross section of a Micromachined Capacitive Microphone 300 (MCM), comprising a capacitive electroacoustic microphone with a sealed gap 302. As shown in FIG. 3, an MCM 300 preferably comprises a circular gap 302 fabricated (e.g., machined or etched) into a surface of a substrate 304, with the substrate 304 at the bottom of the gap 302 forming a back plate 306. (Non-circular gaps are described with respect to and following Equations 30-34, below.) The back plate 306 is made of a solid material suitable for use in manufacturing MEMS microphones, such as a metal, a conducting, semiconducting or insulating ceramic, or a crystalline or polycrystalline material. A bottom electrode 308 is formed over the back plate 306, e.g., using a metallization technique.

A vibrating element in a microphone that is used to measure acoustic energy is generally called a "membrane" or a "radiation plate" depending on the vibrating element's radius-to-thickness ratio. If the vibrating element's radius-to-thickness ratio is less than a threshold (which different authorities specify as, for example, 40, 80 or 100), then the vibrating element is a "radiation plate"; otherwise, it is a "membrane". MCMs 300 will generally use a vibrating element with a radius-to-thickness ratio less than 40. (This is discussed below with respect to FIG. 7, using the scaling constant term first described with respect to Equation 14.) Therefore, the vibrating element in MCMs described herein is referred to as a "radiation plate".

A radiation plate 310 of total thickness $t_m$ (thickness of membrane) is clamped to the back plate 306 at the aperture of the gap 302 (the upper side of the gap 302, that is, the side distant from the back plate 306), preferably at the rim of the gap's 302 aperture, such that the gap 302 is sealed. ("Total" thickness refers to $t_m$ being the sum of the thickness of the radiation plate 310, plus any electrodes or insulator layers, further described below, which are attached to it.) To implement this clamping and seal, the substrate 304 and the radiation plate 310 are mechanically coupled, e.g., by bonding, wafer bonding or sacrificial layer processing. The gap 302 is preferably completely (hermetically) sealed, so that no air (or other gas, dust or other material) can pass between the gap 302 and the ambient. The radiation plate 310 can be made of a solid material generally suitable for MEMS manufacture, such as a metal, a conducting, semiconducting or insulating ceramic, or a crystalline or polycrystalline material.

The radiation plate 310 can comprise multiple layers of different materials, such as a metal layer (or layers) for an electrode, a layer for compliance ($C_{RM}$), and an insulator layer. The elastic properties of one layer will generally be more significant than the elastic properties of the other layers, since the other layers will generally be comparatively thin. The combined effects of multilayer structures on elastic behavior of a vibrating element in a microphone are described by: M. Funding la Cour, T. L. Christiansen, J. A. Jensen, Fellow, IEEE, and E. V. Thomsen, "Electrostatic and Small-Signal Analysis of CMUTs With Circular and Square Anisotropic Plates," IEEE Trans. Ultrason. Ferroelectr. Freq. Control, vol. 62, no. 8, pp. 1563-1579, 2015 (the "Anisotropic Plates" reference). This reference provides an approach to treating a multilayered vibrating element as an equivalent single layer vibrating element, and determining a Young's modulus and Poisson's ratio for the equivalent single layer vibrating element.

Airborne MCMs 300 (MCMs operated in air) are preferably operated off-resonance. This is because an MCM 300 operated on-resonance would have a high sensitivity peak, but the bandwidth would be relatively narrow (in some embodiments, too narrow for typical consumer electronics implementations such as cellular phone microphones).

The gap 302 has a radius a and a gap height $t_g$. (The gap radius a is also the radius of the radiation plate 310.) The gap height $t_g$ is the distance between the uppermost material at the bottom of the gap 302 and the lowermost material at the top of the gap 302 when the radiation plate 310 is undeflected. The radiation plate 310 is undeflected when the normalized static mechanical force $F_b/F_g$ equals zero (generally, when there is no static pressure difference between the gap 302 and the ambient), and the bias voltage $V_{DC}$ is zero or the relative bias level $V_{DC}/V_C$ equals zero. $F_b/F_g$, $V_{DC}/V_C$ and the "collapse voltage" $V_C$ are further described below. A smaller gap 302 radius a or a larger radiation plate 310 thickness $t_m$ will increase the stiffness of the radiation plate 310.

A top electrode 312 is fixedly connected to the radiation plate 310, or can be the radiation plate 310 itself if the radiation plate 310 is made of a conductive material. The top electrode 312 can be formed on either surface of the radiation plate 310, or can be formed within the radiation plate 310 if the radiation plate 310 is made of a dielectric material. The top electrode 312 is preferably formed using a metallization technique (if the radiation plate 310 is not itself the top electrode 312). Preferably, the bottom electrode 308 fully covers the back plate 306 (the bottom of the gap 302; that is, the back plate 306 is "fully electroded"), and the top electrode 312 fully covers the portion of the radiation plate 310 that faces and touches the gap 302 (the radiation plate 310 is "fully electroded"). The voltage across the electrodes 308, 312 is a bias voltage $V_{DC}$. Generally, at lower bias voltages $V_{DC}$, better microphone performance is achieved if the back plate 306 and radiation plate 310 are fully electroded. Electrodes 308, 312 can also be smaller than the gap 302, down to 80% of the size of the gap 302, as further explained below. Electrodes 308, 312 which are smaller than the gap 302 are preferably concentric with the gap 302.

There is preferably a first dielectric insulator layer 314 of thickness $L_{i1}$ fixedly attached to and covering the gap 302 side of the bottom electrode 308, and a second dielectric insulator layer 316 of thickness $t_{i2}$ fixedly attached to and covering the gap 302 side of the combination of the radiation plate 310 and the top electrode 312. In alternative embodiments, both of the dielectric insulator layers 314, 316 can be located on the gap 302 side of either the bottom electrode 308, or the combination of the radiation plate 310 and the top electrode 312. The insulating layers 314, 316 can be made of an insulating material suitable for use in a MEMS microphone (generally, any such material), such as an insulating ceramic, polymer, crystalline or polycrystalline material. One or both of the insulator layers 314, 316 can be electrets.

Electrets and certain CMUT performance measurements are addressed in H. Köymen, A. Atalar, Itir Köymen, A. S. Taşdelen, A. Ünlügedik, "Unbiased Charged Circular CMUT Microphone: Lumped Element Modeling and Performance", IEEE Trans. Ultrason. Ferroelectr. Freq. Control, Vol. 65, no. 1, pp. 60-71, Nov. 14, 2018, which is incorporated herein by reference (and referred to herein as the "Electret and Performance reference"). The Electret and Performance reference and the Anisotropic Plates reference show that noise (losses) in a CMUT (a capacitive MEMS microphone with a sealed gap) are very small—in some embodiments, approximately 0 dBA.

An MCM 300 is a capacitive microphone. Capacitive microphone operation uses the fact that if a voltage (electric potential) is applied across two parallel conducting plates (the bottom and top electrodes 308, 312) separated by a gap 302, the parallel conducting plates 308, 312 will attract each other electrostatically via the electromechanical attraction force. The radiation plate 310 is clamped (fixedly connected) to the substrate 304 at the rim of the gap 302, and the top electrode 312 is attached to (fixedly connected to or comprised of) the radiation plate 310. Because the radiation plate 310 is clamped to the substrate 304 at the rim of the gap 302, the spring reaction (elastic restoring force) due to the elasticity of the radiation plate 310 resists the electromechanical force exerted by the top electrode 312. That is, the attraction between the electrodes 308, 312 pulls the radiation plate 310 down into the gap 302, and the elasticity of the radiation plate 310 pulls the radiation plate 310 back towards a resting position. The voltage across the electrodes 308, 312 is the bias voltage $V_{DC}$. For a given bias voltage $V_{DC}$, the electromechanical force and elastic restoring force are balanced when the center of the radiation plate 310 is displaced by an equilibrium displacement distance (also called the equilibrium point).

As stated, the voltage across the electrodes 308, 312 is a bias voltage $V_{DC}$. If the bias voltage $V_{DC}$ is increased beyond a limit for "uncollapsed" microphone operation called the "collapse voltage" $V_C$, the elastic restoring force is unable to prevent the electromechanical force from causing the center of the radiation plate 310 to collapse into (make physical contact with) the bottom of the gap 302. In example embodiments as shown in FIG. 3, this would comprise the first insulator layer 314 touching the second insulator layer 316. Generally, microphone SNR is significantly decreased in collapsed operation. The ratio between the bias voltage $V_{DC}$ and the collapse voltage $V_C$ is called the relative bias level $V_{DC}/V_C$.

Preferably, the sealed gap 302 contains a very low pressure environment (a vacuum, for example, less than 10 mbar). If the gap 302 contains a vacuum, there is a static pressure difference $P_0$ between the ambient environment (on the other side of the radiation plate 310 from the gap 302) and the gap 302 which results in a net static force $F_b$ pushing the radiation plate 310 into the gap 302.

At equilibrium, when sound (a time varying pressure signal) is incident on the radiation plate 310 (accordingly, received by the MCM 300), the radiation plate 310 vibrates and the displacement of the radiation plate 310 changes (e.g., oscillates) around the equilibrium point. This movement causes variation of the microphone capacitance (the capacitance between the top and bottom electrodes 308, 312). Variation in the microphone capacitance, combined with the charge stored on the capacitance due to the bias voltage $V_{DC}$, causes a voltage across the output terminals of the microphone to vary in proportion to the incident sound pressure signal. This output voltage can be amplified, measured, stored, and used to reproduce (play back) the sound originally received by the microphone (the MCM 300).

An "operating point" is defined herein as a triplet of selected values comprising the applied bias voltage $V_{DC}$, the relative bias level $V_{DC}/V_C$, and the normalized static mechanical force $F_b/F_g$ (further described below with respect to FIG. 4 and Equation 6). As disclosed below, an operating point uniquely determines dimensions of an MCM 300 that will result in optimal sensitivity of the MCM 300 at that operating point. For example, an operating point can be used to determine an MCMs 300 gap 302 radius a, radiation plate 310 thickness $t_m$, and effective gap 302 height $t_{ge}$ (as described below with respect to, for example, Equations 9-18). Alternatively, the operating point can be used to determine an MCM's minimum gap 302 radius $a_{min}$, minimum radiation plate 310 thickness $t_{m\_min}$, and effective gap 302 height $t_{ge}$, along with a range for radiation plate 310 radius-to-thickness ratio $a/t_m$ enabling the MCM 300 to maintain elastic linear operation (operation within the elastic linearity constraint, as described below with respect to FIGS. 7, 8A and 8B). Dimensions as determined yield a resulting (and optimal) open circuit received voltage (OCRV) sensitivity at a corresponding operating point. Dimensions can then be adjusted to enable robust elastic linear operation without compromising the OCRV sensitivity. Various examples of MCM 300 design processes are shown with respect to, for example, FIGS. 13-16. These results take advantage of the very low noise floor (in some embodiments, approximately 0 dBA) and high SNR (in some embodiments, approximately 94 dBA) in airborne sealed gap 302 MCMs 300 as disclosed herein.

The operating point can be selected: for example, to minimize bias voltage $V_{DC}$, and/or to correspond to a selected OCRV sensitivity, gap 302 radius a (or other physical dimension), or other desired performance characteristic. Selectable operating point values, and optimality of results with respect to the selected operating point, are not limited by materials to be used in fabrication of the radiation plate 310 or insulator layers 314, 316. Such components in an MCM 300 can be made out of materials suitable for manufacture of similar components in MEMS devices (in preferred embodiments, any such materials). Normalized dimensions of the MCM 300, which are not dependent on material properties, can be determined directly from the operating point. De-normalized dimensions used before MCM 300 fabrication can then be determined using properties of materials selected for use in MCM 300 components. As a result, dimensions, sensitivity and other properties of the MCM, including gap 302 radius a and radiation plate 310 thickness $t_m$, effective gap 302 height $t_{ge}$, and Open Circuit Received Voltage Sensitivity (OCRV), as well as other microphone performance parameters, are independent of the particular material(s) used to fabricate the radiation plate 310 and the insulator layers 314, 316.

Also described herein are conditions enabling the gap 302 radius a, the radiation plate 310 thickness $t_m$, and the ratio between the gap 302 radius and the radiation plate 310 thickness $a/t_m$ to be rescaled, within ranges and with relationships determined by the operating point, while maintaining the optimal OCRV sensitivity for that operating point.

FIG. 4 shows an example visual representation 400 of an analytical model for a Micromachined Capacitive Microphone 300 (MCM), using a cross-section of the MCM 300. As shown in FIG. 4, the effective gap 302 height $t_{ge}$, which is an electrical dimension of the gap 302 used in modeling the MCM 300, depends on the gap height $t_g$, the relative permittivity of the first insulator layer 114 $\varepsilon_{r\_i1}$, and the relative permittivity of the second insulator layer 116 $\varepsilon_{r\_i2}$. These relative permittivities are the ratios between the respective permittivities of the insulator layers 314, 316 and the permittivity of free space. (Permittivity is the resistance of a medium to forming an electric field in that medium. The gap 302 preferably contains a vacuum, which has a relative permittivity of 1.) The effective gap height $t_{ge}$ is determined as shown in Equation 1. Note that if the entire gap 302 height $t_g$ and insulator height ($t_{i1}$ plus $t_{i2}$) comprised vacuum, the effective gap height $t_{ge}$ would equal the gap height $t_g$.

Insulator layer 314, 316 thicknesses and materials (corresponding to permittivities) can be selected after the effective gap 302 height $t_{ge}$ is determined. That is, appropriate materials for insulator layer 314, 316 fabrication can be selected to keep insulator layer 314, 316 thickness ($t_{i1}$, $t_{i2}$) small relative to the gap 302 height $t_g$. Once effective gap 302 height $t_{ge}$ is determined, then gap 302 height $t_g$ can be determined such that gap 302 height $t_g$ is greater than the static displacement of the center of the radiation plate 310 $X_P$, plus a margin for production tolerances and insulator layer 314, 316 thicknesses using selected insulator materials. The static displacement of the center of the radiation plate 310 $X_P$ is the deflection distance of the center of the radiation plate 310 from the effective gap height $t_{ge}$ at the equilibrium point. Higher relative permittivities of insulator layers 314, 316 generally correspond to thinner insulator layers 314, 316. The effective gap 302 height $t_{ge}$ is determined from the operating point as shown below in Equations 8 through 12.

Microphones are more sensitive when the bias voltage $V_{DC}$ is larger. The effective gap 302 height $t_{ge}$ determines the level of bias voltage $V_{DC}$ that can be used, because higher bias voltages increase the deflection of the radiation plate 310, and sufficiently high bias voltages $V_{DC}$ will cause the radiation plate 310 to collapse. Voltage available on a device also limits bias voltage $V_{DC}$. For example, some mobile phones are limited to about 14 volts available to mobile phone components. Electrets can provide, for example, 150 volts to 200 volts bias voltage. The Electret and Performance reference is relevant to implementation of electrets in a capacitive MEMS microphone with a sealed gap.

In an MCM 100, the bias voltage $V_{DC}$, the static displacement of the center of the radiation plate 310 $X_P$, and the net static force on the radiation plate 310 due to the ambient static pressure $F_b$ are related, in static electromechanical equilibrium (at the equilibrium point), as shown in Equation 7 (below).

The relationship shown in Equation 7 is dependent on various properties of the MCM 300 (which are explained below), including the shape function of a deflected clamped circular plate $g(X_P/t_{ge})$ (also referred to as g(u)), which is proportional to the capacitance of the MCM 300; the transduction force (proportional to g'(u), the first derivative of g(u)); the collapse voltage in vacuum $V_r$ (a reference voltage); the normalized static mechanical force $F_b/F_g$; the Young's modulus $Y_0$ (stiffness) and Poisson's ratio σ (signed ratio of transverse strain to axial strain) of the radiation plate 310; the differential pressure $P_0$ between the ambient static pressure and the pressure in the gap 302; the clamped capacitance $C_0$, and the compliance of the radiation plate 310 $C_{Rm}$ (the inverse of the stiffness of the radiation plate 310).

The transduction force is the force generated on the radiation plate 310 when a bias voltage $V_{DC}$ is applied. Equation 3 expresses the transduction force in terms of the effect the bias voltage $V_{DC}$ has on the shape of the radiation plate 310 (rather than in terms of the bias voltage $V_{DC}$). The variable u corresponds to the ratio of the static displacement to the effective gap height $X_P/t_{ge}$.

$$t_{ge} = t_g + \frac{t_{i1}}{\varepsilon_{r\_i1}} + \frac{t_{i2}}{\varepsilon_{r\_i2}} \qquad \text{Equation 1}$$

$$g(u) = \frac{\tanh^{-1}(\sqrt{u})}{\sqrt{u}} \qquad \text{Equation 2}$$

-continued $$g'(u) = \frac{1}{2u}\left(\frac{1}{1-u} - g(u)\right) \quad \text{Equation 3}$$

$$g''(u) = \frac{1}{2u}\left(\frac{1}{(1-u)^2} - 3g'(u)\right) \quad \text{Equation 4}$$

Equation 5 shows the collapse voltage in vacuum $V_r$ for a fully electroded MCM 300. $V_r$ depends on dimensions of the MCM 300 and properties of the radiation plate 310. This model is also valid for MCMs 300 using electrodes 308, 312 which are between 80% and 100% of the size of the gap 302 area, if g(u) and its derivatives (that is, the terms used to determine the transduction force and the shape function of the radiation plate 310) are modified as shown in the Circuit Model reference.

$$V_r = \sqrt{\frac{4t_{ge}^2}{15C_{Rm}C_0}} = 8t_{ge}\frac{t_m^2}{a^2}\sqrt{\frac{t_{ge}}{t_m}}\sqrt{\frac{Y_0}{27\varepsilon_0(1-\sigma^2)}} \quad \text{Equation 5}$$

As previously stated, $P_0$ is the differential pressure between the ambient static pressure and the pressure in the gap 302. For example, if the gap 302 contains a vacuum and the ambient static pressure equals Standard Atmospheric Pressure (SAP), then $P_0$ equals SAP.

As previously stated, $F_b$ is the net static force on the radiation plate 310 due to the ambient static pressure, that is, the force on the radiation plate 310 due to the differential static pressure between the ambient static pressure and the pressure in the gap 302 $P_0$. $F_g$ is the uniformly distributed force required to displace the center of the radiation plate 310 by the effective gap height $t_{ge}$ (that is, to cause the radiation plate 310 to collapse). Because $t_{ge} \geq t_g$ in uncollapsed operation (depending on whether there is an insulator layer 314, 316 between the electrodes 308, 312, see Equation 1), the normalized static mechanical force $F_b/F_g \leq 1$. The normalized static mechanical force $F_b/F_g$ is given in Equation 6.

$$\frac{F_b}{F_g} = \frac{\pi a^2 P_0/3}{t_{ge}/5C_{Rm}} = \frac{3(1-\sigma^2)P_0}{16Y_0} \frac{a^4}{t_m^4} \frac{t_m}{t_{ge}} \quad \text{Equation 6}$$

In an MCM 300 in uncollapsed operation in which the gap 302 contains a vacuum, the normalized static mechanical force $F_b/F_g$ can assume values between 0 (if the ambient static pressure is zero, so that differential static pressure $P_0=0$; or if the radiation plate 310 is infinitely stiff, meaning $$\frac{1}{C_{Rm}} \to \infty$$

and the ratio between the gap 302 height and the effective gap 302 height $t_g/t_{ge}$. The limiting case $F_b/F_g=1$ means that the center of the radiation plate 310 is displaced by the effective gap 302 height $t_{ge}$, which is not physically possible when there is an insulator layer 314, 316 between the electrodes 308, 312. ($F_b/F_g$ is also zero in pressure compensated MEMS microphones.)

The normalized static mechanical force $F_b/F_g$ will generally be relatively low in an MCM 300 with a stiff radiation plate 310

$$\left(\text{large } \frac{1}{C_{RM}}\right),$$

or with a compliant radiation plate 310 (large $C_{Rm}$) and a large effective gap 302 height $t_{ge}$. $F_b/F_g$ will generally be relatively high if the ambient static pressure displaces the radiation plate 310 by a significant fraction of the effective gap 302 height $t_{ge}$, which can occur, for example, in a MCM 300 with a compliant radiation plate 310, or with a stiff radiation plate 310 and a relatively small effective gap height $t_{ge}$.

Figure 1:
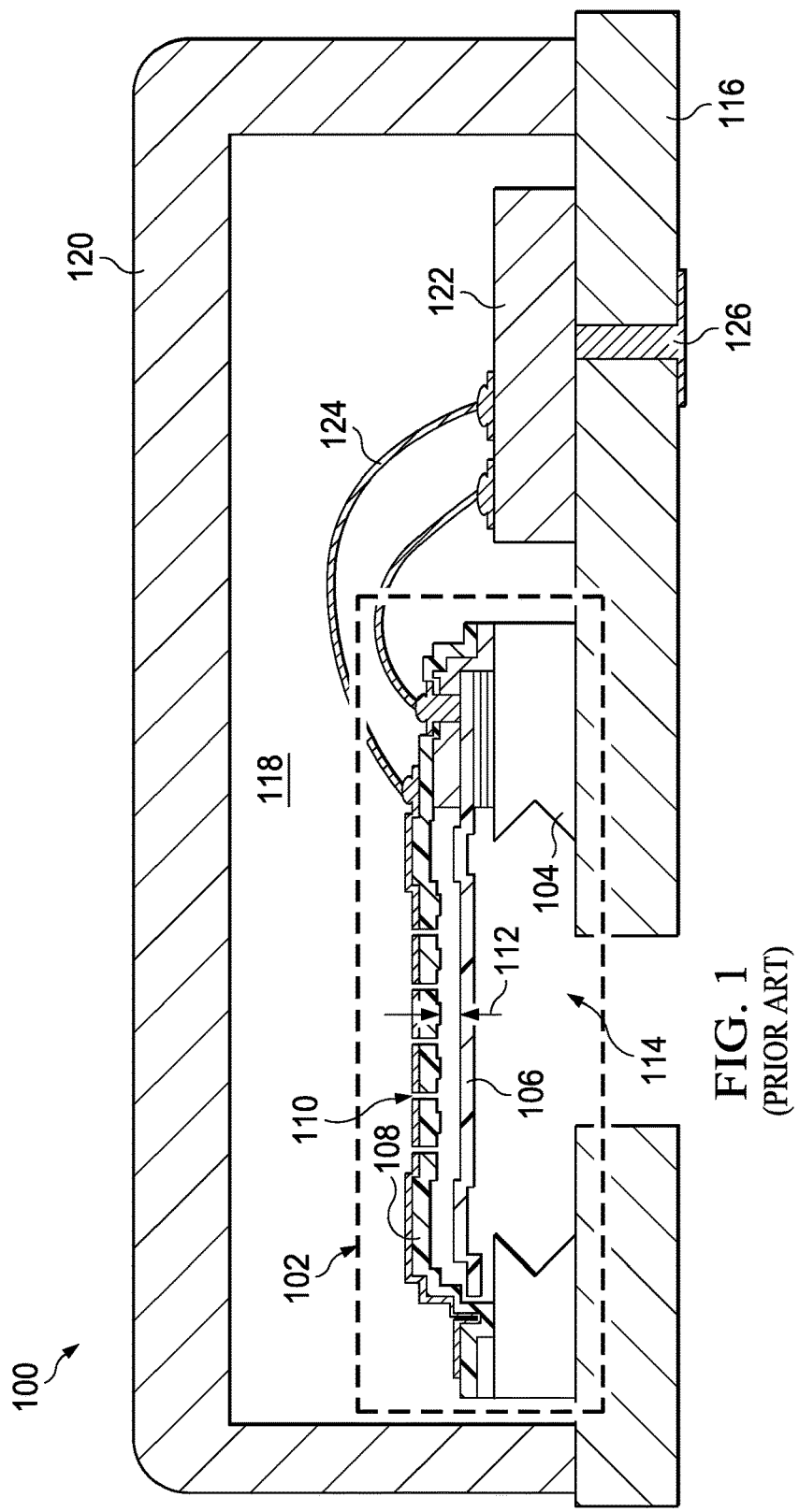
FIG. 1 schematically shows a cross-section of an example of a pressure compensated MEMS microphone.
Figure 2:
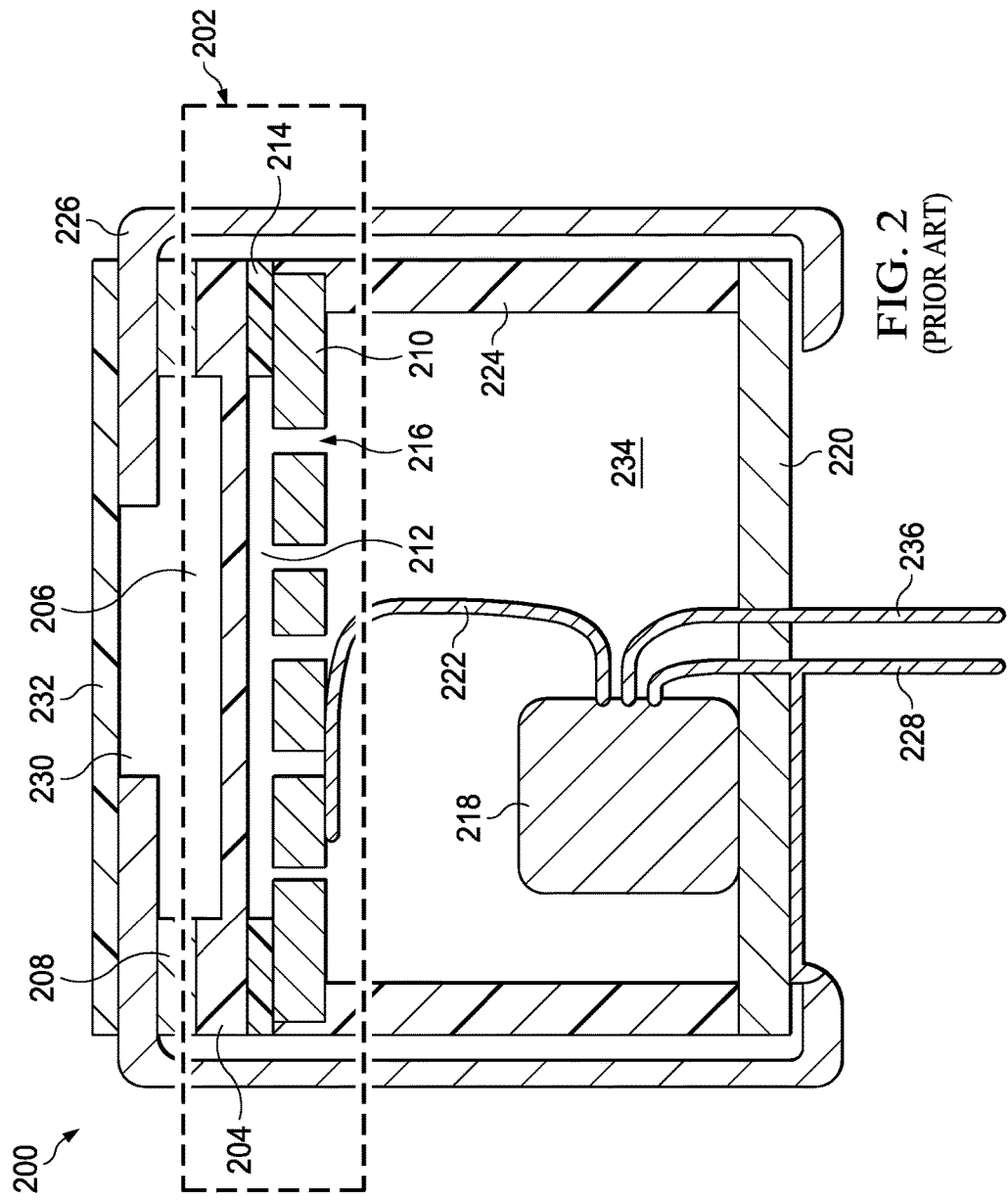
FIG. 2 schematically shows a cross-section of an example of a pressure compensated electret microphone.
Figure 5:
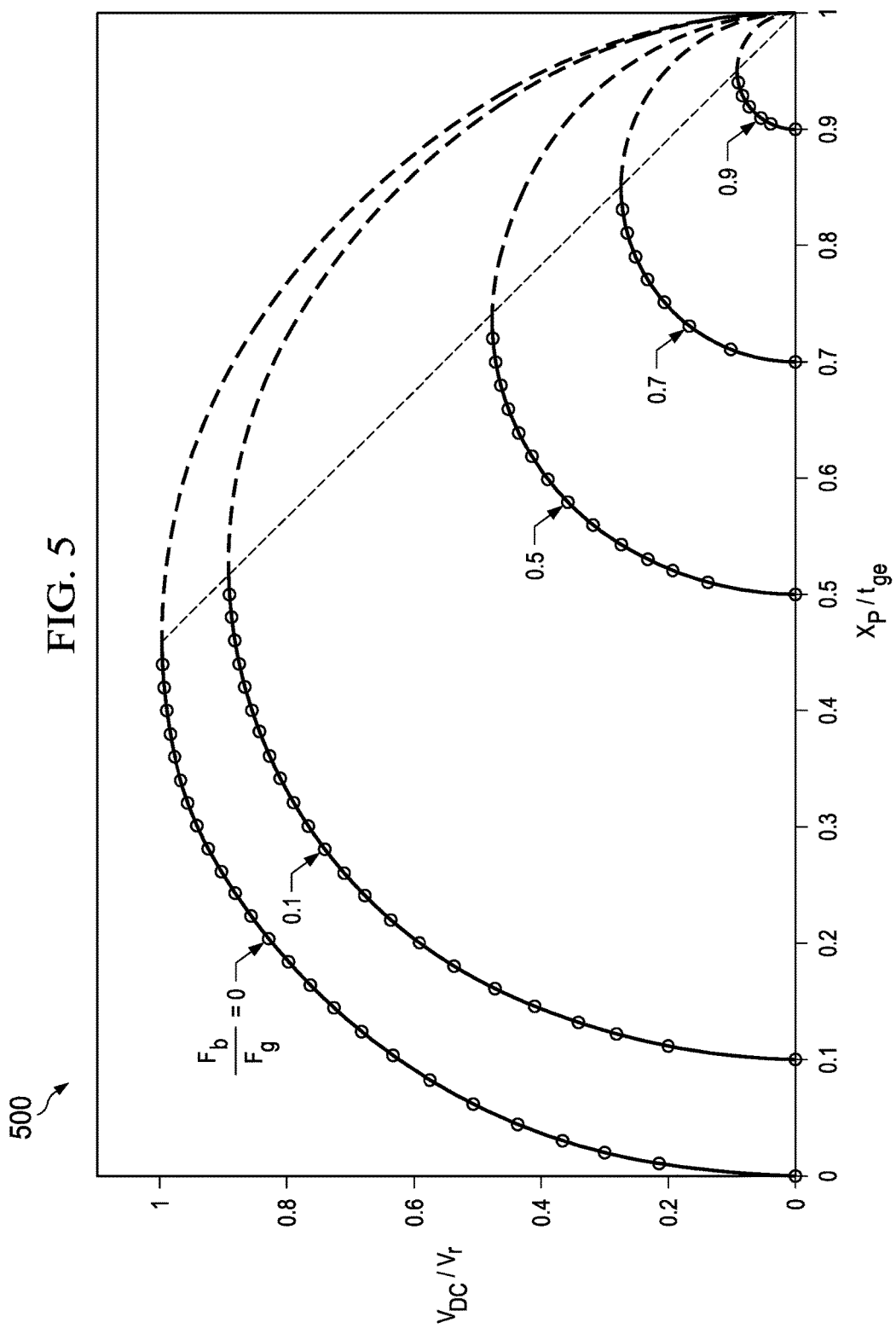
FIG. 5 shows a graph of the relationship between the ratio of the bias voltage to the collapse voltage in a vacuum $V_{DC}/V_r$ and the normalized static displacement of the center of the radiation plate 310 $X_P/t_{ge}$ at the electromechanical equilibrium (the equilibrium point).

FIG. 5 shows a graph 500 of the relationship between the ratio of the bias voltage to the collapse voltage in a vacuum $V_{DC}/V_r$ and the normalized static displacement of the center of the radiation plate 310 $X_P/t_{ge}$ at the electromechanical equilibrium (the equilibrium point). In FIG. 5, the solid curves correspond to operational domains in which the microphone will be in uncollapsed operation; the dotted line marks the transition between uncollapsed operation and collapsed operation; and the dotted curves correspond to operational domains in which the microphone will be in collapsed operation. The ratio of the bias voltage to the collapse voltage $V_{DC}/V_r$ is given in Equation 7.

$$\frac{V_{DC}}{V_r} = \sqrt{\frac{3\left(\frac{X_P}{t_{ge}} - \frac{F_b}{F_g}\right)}{2g'\left(\frac{X_P}{t_{ge}}\right)}} \text{ for } \frac{X_P}{t_{ge}} \geq \frac{F_b}{F_g} \quad \text{Equation 7}$$

Equation 7 shows that the static displacement of the center of the radiation plate 310 $X_P$ is equal to $t_{ge}*(F_b/F_g)$ when the plate is electrically unbiased, so that $V_{DC}=0$. This can also be viewed as the normalized static displacement of the center of the radiation plate 310 $X_P/t_{ge}$ being equal to the normalized static mechanical force $F_b/F_g$ when no bias voltage is applied, so that $V_{DC}=0$.

The collapse voltage $V_C$ depends on the normalized static mechanical force $F_b/F_g$, as well as the stiffness of the radiation plate 310 and the effective gap 302 height $t_{ge}$. When the radiation plate 310 is displaced by ambient static pressure (accordingly, the MCM 300 is not in a vacuum), the collapse voltage $V_C$ is decreased from the collapse voltage in a vacuum $V_r$. As shown in Equation 8, the collapse voltage $V_C$, normalized to $V_r$, depends only on $F_b/F_g$.

$$\frac{V_C}{V_r} \approx \quad \text{Equation 8}$$
$$0.9961 - 1.0468\frac{F_b}{F_g} + 0.06972\left(\frac{F_b}{F_g} - 0.25\right)^2 + 0.01148\left(\frac{F_b}{F_g}\right)^6$$

As shown in Equations 9 through 18 below, the MCM 300 dimensions, that is, gap 302 radius a, radiation plate 310 thickness $t_m$ and effective gap 302 height $t_{ge}$, can be expressed in terms of the operating point: normalized static mechanical force $F_b/F_g$, relative bias level $V_{DC}/V_C$, and bias voltage $V_{DC}$.

The effective gap 302 height $t_{ge}$ is determined as shown in Equation 9.

$$t_{ge} = \frac{3}{2} V_r \sqrt{\frac{\varepsilon_0}{P_0} \frac{F_b}{F_g}} = \frac{3}{2} \sqrt{\frac{\varepsilon_0}{P_0}} V_{DC} \left(\frac{V_{DC}}{V_C}\right)^{-1} \left[\left(\frac{V_C}{V_r}\right)^{-1} \sqrt{\frac{F_b}{F_g}}\right] \quad \text{Equation 9}$$

Equation 9 can be rewritten to express the effective gap height $t_{ge}$ in terms of the normalized bias voltage $V_{DC\_n}$ and the normalized effective gap 302 height $t_{ge\_n}$, as shown in Equation 10. $V_{DC\_n}$ is defined as shown in Equation 12.

$$t_{ge} = V_{DC\_n} \left(\frac{V_{DC}}{V_C}\right)^{-1} t_{ge\_n} \quad \text{Equation 10}$$

The normalized effective gap 302 height $t_{ge\_n}$ is a function of normalized static mechanical force $F_b/F_g$, as shown in Equation 11A.

$$t_{ge\_n}\left(\frac{F_b}{F_g}\right) = \left(\frac{V_C}{V_r}\right)^{-1} \sqrt{\frac{F_b}{F_g}} \quad \text{Equation 11A}$$

Figure 6:
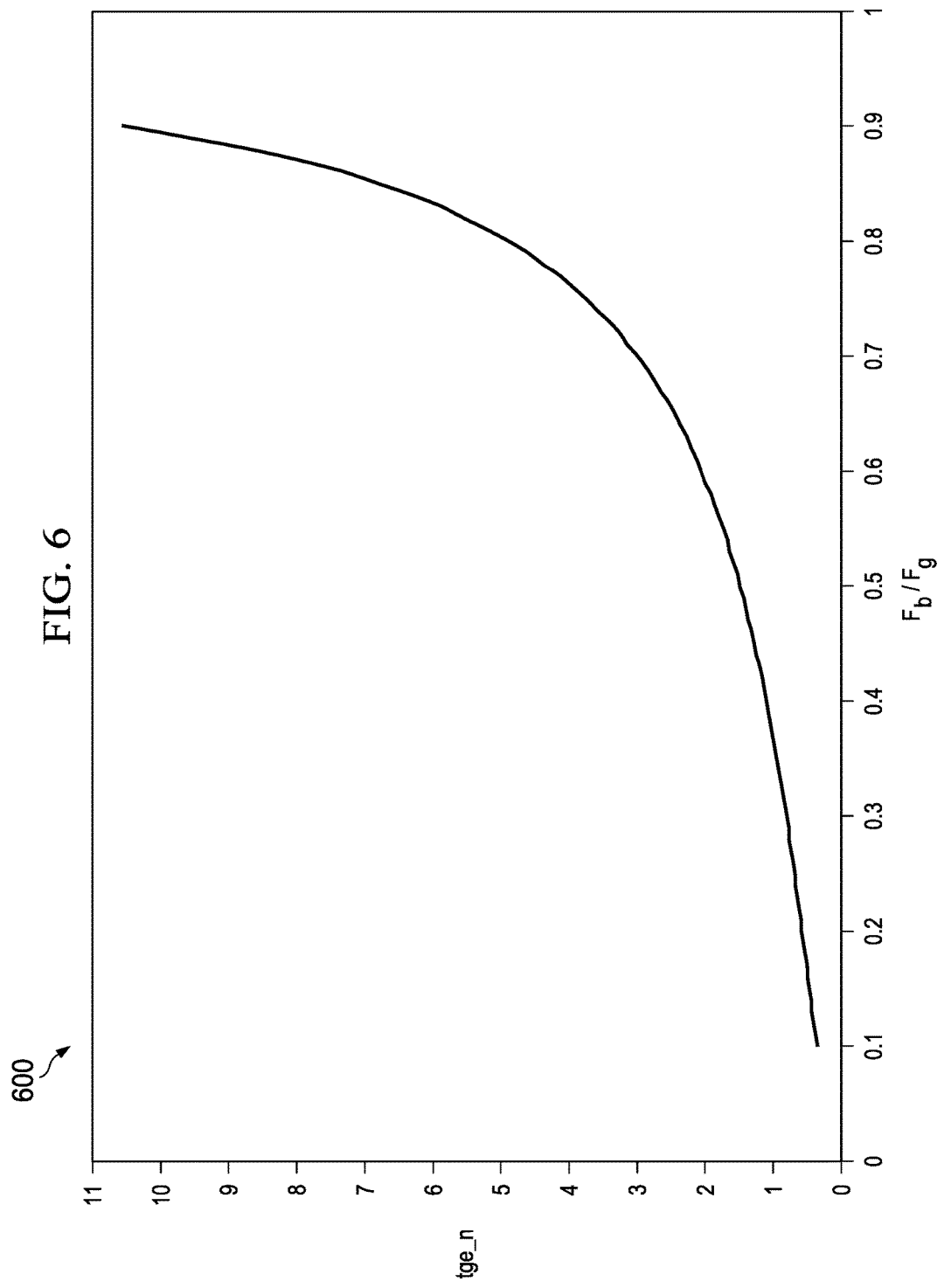
FIG. 6 shows a graph of the relationship between normalized effective gap height $t_{ge\_n}$ and normalized static mechanical force $F_b/F_g$ for an MCM.

FIG. 6 shows a graph 600 of the relationship between normalized effective gap height $t_{ge\_n}$ and normalized static mechanical force $F_b/F_g$ for a MCM 300, as described in Equation 11B. Equation 11A can be rewritten using Equation 8 so that the normalized effective gap 302 height $t_{ge\_n}$ depends only on normalized static mechanical force $F_b/F_g$, as shown in Equation 11B. Equations 10, 11B and 12 can be used to determine the effective gap 302 height $t_{ge}$ using the operating point, independent of material properties. Equation 1 can be used to determine the gap height $t_g$ using the effective gap height $t_{ge}$ and permittivities of selected insulator layer 314, 316 materials.

$$t_{ge\_n}\left(\frac{F_b}{F_g}\right) \approx \frac{\left(\sqrt{\frac{F_b}{F_g}}\right)}{0.9961 - 1.0468 \frac{F_b}{F_g} + 0.06972 \left(\frac{F_b}{F_g} - 0.25\right)^2 + 0.01148 \left(\frac{F_b}{F_g}\right)^6} \quad \text{Equation 11B}$$

The normalized bias voltage $V_{DC\_n}$ is related to the bias voltage $V_{DC}$ as shown in Equation 12. The normalized bias voltage $V_{DC\_n}$ is approximately $1.4 \times 10^{-8} V_{DC}$ (meters) for a sealed gap 302 containing vacuum when the ambient pressure is SAP.

$$V_{DC\_n} = \frac{3}{2} \sqrt{\frac{\varepsilon_0}{P_0}} V_{DC} \quad \text{Equation 12}$$

The radiation plate 310 thickness $t_m$ is related to the normalized static mechanical force $F_b/F_g$ and the relative bias level $V_{DC}/V_C$ using the normalized radiation plate 310 radius-to-thickness ratio $$\left(\frac{a}{t_m}\right)_N$$

and the normalized bias voltage $V_{DC\_n}$ (see Equation 12), as shown in Equation 13.

$$t_m = 5 V_{DC\_n} \left(\frac{a}{t_m}\right)_N^{-4} \left(\frac{V_{DC}}{V_C}\right)^{-1} \left(\frac{V_C}{V_r}\right)^{-1} \left(\frac{F_b}{F_g}\right)^{3/2} \quad \text{Equation 13}$$

The normalized radiation plate 310 radius-to-thickness ratio $$\left(\frac{a}{t_m}\right)_N$$

is related to the radiation plate 310 radius-to-thickness ratio $$\frac{a}{t_m}$$

as shown in Equation 14. The non-dimensional scaling constant $$\sqrt[4]{\frac{16 Y_0}{15(1-\sigma^2) P_0}}$$

used in Equation 14 is dependent on the elastic properties of the radiation plate 310 (Young's modulus $Y_0$ and Poisson's ratio $\sigma$) and the static pressure difference $P_0$ between the gap 302 and the ambient.

$$\left(\frac{a}{t_m}\right)_N = \frac{a}{t_m} \left(\sqrt[4]{\frac{16 Y_0}{15(1-\sigma^2) P_0}}\right)^{-1} \quad \text{Equation 14}$$

The radiation plate 310 thickness $t_m$ can also be written in terms of the normalized radiation plate 310 thickness $t_{m\_n}$ as shown in Equation 15.

$$t_m = 5 V_{DC\_n} \left(\frac{V_{DC}}{V_C}\right)^{-1} t_{m\_n} \quad \text{Equation 15}$$

The normalized radiation plate 310 thickness $t_{m\_n}$ is defined in Equation 16 in terms of the normalized radius-to-thickness ratio $$\left(\frac{a}{t_m}\right)_N$$

and the normalized static mechanical force $F_b/F_g$. The ratio of the collapse voltage to the collapse voltage in a vacuum $V_C/V_r$ can be substituted for using Equation 8. Note that there is an inverse relationship between the size of the normalized radiation plate 310 thickness $t_{m\_n}$ and the normalized ratio between the gap 302 radius and the radiation plate 310 thickness $$\left(\frac{a}{t_m}\right)_N.$$

$$t_{m\_n} = \left(\frac{a}{t_m}\right)_N^{-4} \left(\frac{V_C}{V_r}\right)^{-1} \left(\frac{F_b}{F_g}\right)^{3/2} \quad \text{Equation 16}$$

The gap 302 radius a is determined, as shown in Equation 18, using the normalized gap 302 radius $a_n$. The normalized gap 302 radius $a_n$ is defined in Equation 17 in terms of the normalized radiation plate 310 radius-to-thickness ratio $$\left(\frac{a}{t_m}\right)_N.$$

The ratio between the collapse voltage and the collapse voltage in a vacuum $V_C/V_r$ can be substituted for using Equation 8. Note that there is an inverse relationship between the normalized gap 302 radius $a_n$ and the normalized ratio between the gap 302 radius and the radiation plate 310 thickness $$\left(\frac{a}{t_m}\right)_N$$

$$a_n = \left(\frac{a}{t_m}\right)_N^{-3} \left[\left(\frac{V_C}{V_r}\right)^{-1} \left(\frac{F_b}{F_g}\right)^{3/2}\right] \quad \text{Equation 17}$$

As shown in Equation 18, gap 302 radius a is determined by the elastic constants of a selected radiation plate 310 material, and the operating point. The normalized bias voltage $V_{DC\_n}$ is given in Equation 12.

$$a = \left(\sqrt[4]{\frac{16Y_0}{15(1-\sigma^2)P_0}}\right)\left(\frac{a}{t_m}\right)_N t_m = \quad \text{Equation 18}$$
$$\left(10\sqrt[4]{\frac{Y_0}{15(1-\sigma^2)P_0}}\right)V_{DC\_n}\left(\frac{V_{DC}}{V_C}\right)^{-1} a_n$$

The equations set forth herein, particularly (but not only) Equations 8, 11A, 16, 17 and 19-21, show that the normalized bias voltage $V_{DC\_n}$, the normalized gap height $t_{ge\_n}$, the normalized gap 302 radius $a_n$, the normalized radiation plate 310 thickness $t_{m\_n}$ and the normalized radius-to-thickness ratio $$\left(\frac{a}{t_m}\right)_N$$

are independent of material properties.

Boundary conditions are discussed below for the radius-to-thickness ratio, gap 302 radius a, radiation plate 310 thickness $t_m$, and corresponding normalized values, with respect to FIGS. 7, 8A and 8B and Equations 19 through 25.

Scalability of the radius-to-thickness ratio while maintaining optimum sensitivity at a selected operating point is discussed below with respect to Equations 26 through 29. Together, these Figures and Equations demonstrate a certain degree of flexibility in selection of particular MCM 300 dimensions for use at a selected operating point while maintaining optimum sensitivity (subject to the relationships described herein).

Figure 7:
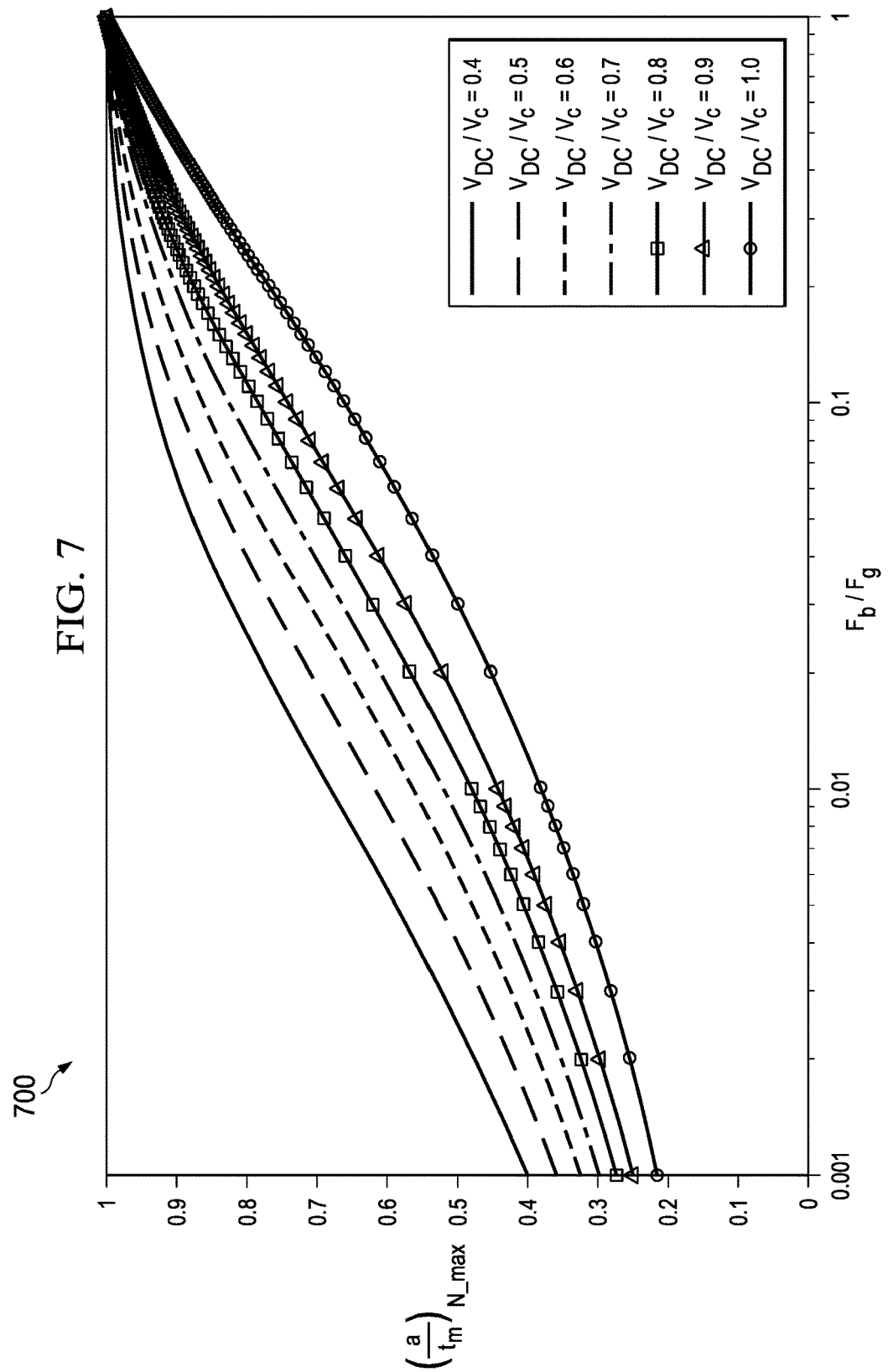
FIG. 7 shows a lin-log semi-log graph of the relationship between the maximum normalized radiation plate radius-to-thickness ratio $$\left(\frac{a}{t_m}\right)_{N\_max}$$

FIG. 7 shows a lin-log semi-log graph 700 of the relationship between a maximum normalized radiation plate 310 radius-to-thickness ratio $$\left(\frac{a}{t_m}\right)_{N\_max}$$

mat enables an MCM 300 to meet the elastic linearity constraint (explained below), and normalized static mechanical force $F_b/F_g$, for example values of the relative bias voltage level $V_{DC}/V_C$. The elastic linearity constraint can be explained using Hooke's law. Hooke's law defines the behavior of linearly elastic structures under stress. Hooke's law states that the displacement in a spring (or other linearly elastic structure) is proportional to a force which stretches or compresses it. If the force is doubled, the displacement of the spring will be doubled. However, once a real spring is sufficiently displaced (stretched), doubling the force will not double the displacement, deviating from Hooke's law. This is due to elastic non-linearity. Beyond an upper bound for applied force and for displacement, Hooke's law no longer holds and the relationship between applied force and spring displacement is no longer linear.

Hooke's law applies to clamped membranes as long as linearly elastic operation holds. Studies on applied mechanics classify the linearly elastic range, that is, the displacement range in which Hooke's law is applicable to a clamped circular radiation plate, as corresponding to the center deflection of the radiation plate being less than 20% of the plate thickness, that is, $X_P/t_m < 0.2$. The sensitivity of an MCM 300 will decrease when elastic linearity fails, accordingly, when $X_P/t_m \geq 0.2$. This limit for linearly elastic behavior of an MCM 300 is referred to herein as the "elastic linearity constraint."

The elastic linearity constraint can be used to determine a maximum value for the radiation plate 310 radius-to-thickness ratio $a/t_m$ at which an MCM 300 at a particular operating point will exhibit linearly elastic behavior. This maximum radius-to-thickness ratio $a/t_m$ corresponds to minima for the gap 302 radius a and the radiation plate 310 thickness $t_m$. Accordingly, as shown in Equations 12 and 15-18 herein, there is an inverse relationship between (1) the size of the gap 302 radius a and radiation plate 310 thickness $t_m$ (the radiation plate 310 dimensions), and (2) the radiation plate 310 radius-to-thickness ratio $a/t_m$.

Elastic linearity of CMUT cells is described in A. Unlugedik, A. S. Tasdelen, A. Atalar, and H. Koymen, "Designing Transmitting CMUT Cells for Airborne Applications," IEEE Transactions on Ultrasonics, Ferroelectrics, and Frequency Control, Vol. 61, pp. 1899-1910, 2014, which is incorporated herein by reference.

The maximum radiation plate 310 radius-to-thickness ratio $a/t_m$ is found using a maximum normalized radius-to-thickness ratio $$\left(\frac{a}{t_m}\right)_{N\_max},$$

which is related to the normalized static displacement of the center of the radiation plate 310 $X_P/t_{ge}$ as shown in Equation 19. In Equation 19, the normalized static displacement of the center of the radiation plate 310 $X_P/t_{ge}$ is expressed as $$X_{PN}\left(\frac{V_{DC}}{V_C}, \frac{F_b}{F_g}\right),$$

that is, as a function of the relative bias $V_{DC}/V_C$ and the normalized static mechanical force $F_b/F_g$.

$$\left(\frac{a}{t_m}\right)_N < \left(\frac{a}{t_m}\right)_{N\_max} = \sqrt[4]{\frac{F_b}{F_g} \bigg/ X_{PN}\left(\frac{V_{DC}}{V_C}, \frac{F_b}{F_g}\right)} \quad \text{Equation 19}$$

The normalized static displacement of the center of the radiation plate 310

$$X_{PN}\left(\frac{V_{DC}}{V_C}, \frac{F_b}{F_g}\right)$$

is obtained in Equation 20 by solving Equation 7, and substituting for the collapse voltage in a vacuum $V_r$ using Equation 8.

$$\frac{V_{DC}^2}{V_C^2}\left(0.9961 - 1.0468\frac{F_b}{F_g} + 0.06972\left(\frac{F_b}{F_g} - 0.25\right)^2 + 0.01148\left(\frac{F_b}{F_g}\right)^6\right)^2 2g'\left(\frac{X_P}{t_{ge}}\right) - 3\left(\frac{X_P}{t_{ge}} - \frac{F_b}{F_g}\right) \approx 0 \text{ for } \frac{X_P}{t_{ge}} \geq \frac{F_b}{F_g} \quad \text{Equation 20}$$

As shown in FIG. 7, $$\left(\frac{a}{t_m}\right)_{N\_max} \leq 1;$$

that is, the maximum value of the maximum normalized radius-to-thickness ratio $$\left(\frac{a}{t_m}\right)_{N\_max},$$

which is unity (one), is reached at $F_b/F_g=1$ (see description of FIG. 4 and Equation 6 regarding normalized static mechanical force $F_b/F_g$). The maximum normalized radius-to-thickness ratio $(a/t_m)_{N\_max}$ that enables an MCM 300 to meet the elastic linearity constraint decreases as normalized static mechanical force $F_b/F_g$ decreases or as relative bias level $V_{DC}/V_C$ decreases.

The scaling constant term $$\sqrt[4]{\frac{16Y_0}{15(1-\sigma^2)P_0}}$$

relating radius a to normalized radius $a_n$ (see Equations 14 and 18) is 35.6 for a silicon radiation plate 310, if Young's modulus $Y_0$ is $149 \times 10^9$ Pa, Poisson's ratio $\sigma$ is 0.17, and the static pressure difference $P_0$ between the gap 302 and the ambient equals SAP (101.325 kPa). For a silicon radiation plate 310, the radius-to-thickness ratio $a/t_m$ will therefore, to maintain linearly elastic operation, be kept less than 35.6 at large normalized static mechanical force $F_b/F_g$ if the static pressure differential $P_0$ is equal to SAP. This upper limit for radius-to-thickness ratio $a/t_m$ for elastic linear operation decreases as the normalized static mechanical force $F_b/F_g$ decreases. The minimum radius-to-thickness ratio $a/t_m$ is about 8 for $F_b/F_g=0.001$. Because there is an inverse relationship between the radiation plate dimensions (a and $t_m$) and the radius-to-thickness ratio $a/t_m$, the elastic linearity constraint suggests that the lower the normalized static mechanical force $F_b/F_g$, the larger the gap 302 radius a should be.

Accordingly, a maximum normalized radius-to-thickness ratio $$\left(\frac{a}{t_m}\right)_{N\_max}$$

implies minimum values for the gap 302 radius $a_{min}$ and the radiation plate 310 thickness $t_{m\_min}$ that enable an MCM 300 to operate in the linearly elastic regime at a selected operating point ($F_b/F_g$, $V_{DC}$, $V_{DC}/V_C$). The minimum gap 302 radius $a_{min}$ corresponds to the narrowest gap 302 that enables linearly elastic operation at a selected operating point. The minimum radiation plate 310 thickness $t_{m\_min}$ corresponds to the thinnest radiation plate 310 that enables linearly elastic operation at a selected operating point.

Equation 21 shows the relationship between minimum radius $a_{min}$ and normalized minimum radius $a_{n\_min}$, which is found using the relationship between gap 302 radius a and normalized gap 302 radius $a_n$ as described by Equation 18.

$$a_{min} = \left(10^4\sqrt{\frac{Y_0}{15(1-\sigma^2)P_0}}\right)V_{DC\_n}\left(\frac{V_{DC}}{V_C}\right)^{-1} a_{n\_min} \quad \text{Equation 21}$$

FIG. 8A shows a log-lin semi-log graph 800 of the relationship between minimum normalized gap 302 radius $a_{n\_min}$ that enables an MCM 300 to meet the elastic linearity constraint, and normalized static mechanical force $F_b/F_g$, for example values of the relative bias voltage level $V_{DC}/V_C$. Equation 22 defines normalized minimum gap 302 radius $a_{n\_min}$ in terms of maximum normalized radiation plate 310 radius-to-thickness ratio $(a/t_m)_{N\_max}$, using the relationship between normalized gap 302 radius $a_n$ and normalized radiation plate 310 radius-to-thickness ratio $(a/t_m)_N$ as described by Equation 17. Note that the ratio between the clamp voltage and the collapse voltage in a vacuum $V_C/V_r$ depends only on the normalized static mechanical force $F_b/F_g$, as shown in Equation 8.

$$a_{n\_min} = \left(\frac{a}{t_m}\right)_{N\_max}^{-3}\left[\left(\frac{V_C}{V_r}\right)^{-1}\left(\frac{F_b}{F_g}\right)^{3/2}\right] \quad \text{Equation 22}$$

Equation 23 shows the relationship between minimum radiation plate 310 thickness $t_{m\_min}$ and normalized minimum radiation plate 310 thickness $L_{m\_n\_min}$, which is found using the relationship between radiation plate 310 thickness $t_m$ and normalized radiation plate 310 thickness $L_{m\_m}$ as described by Equation 15.

$$t_{m\_min} = 5V_{DC\_n}\left(\frac{V_{DC}}{V_C}\right)^{-1} t_{m\_n\_min} \qquad \text{Equation 23}$$

FIG. 8B shows a log-lin semi-log graph 802 of the relationship between normalized minimum radiation plate 310 thickness $t_{m\_min}$ that enables an MCM 300 to meet the elastic linearity constraint, and normalized static mechanical force $F_b/F_g$, for example values of the relative bias voltage level $V_{DC}/V_C$. Equation 24 defines normalized minimum radiation plate 310 thickness $L_{m\_n\_min}$ in terms of maximum normalized radius-to-thickness ratio $(a/t_m)_{N\_max}$, using the relationship between normalized minimum radiation plate 310 thickness $t_{m\_min}$ and normalized radius-to-thickness ratio $(a/t_m)_N$ as described by Equation 16. Note that the ratio between the clamp voltage and the collapse voltage in a vacuum $V_C/V_r$ depends only on the normalized static mechanical force $F_b/F_g$, as shown in Equation 8.

$$t_{m\_n\_min} = a_{n\_min}\left(\frac{a}{t_m}\right)^{-1}_{N\_max} = \left(\frac{a}{t_m}\right)^{-4}_{N\_max}\left(\frac{V_C}{V_r}\right)^{-1}\left(\frac{F_b}{F_g}\right)^{3/2} \qquad \text{Equation 24}$$

The scaling constant term in Equation 21 is determined for silicon in Equation 25, taking Young's modulus $Y_0$ to be $149\times10^9$ Pa, Poisson's ratio $\sigma$ to be 0.17, and the static pressure difference $P_0$ between the gap 302 and the ambient to equal SAP (101.325 kPa).

$$10^4\sqrt{\frac{Y_0}{15(1-\sigma^2)P_0}} = 177.95 \qquad \text{Equation 25}$$

This normalization parameter for the minimum gap 302 radius $a_{min}$ is non-dimensional and contains only the elastic constants of the radiation plate 310 material and the differential static pressure $P_0$. The normalized minimum gap 302 radius $a_{n\_min}$ and radiation plate 310 thickness $t_{m\_n\_min}$ are independent of material and ambient physical properties and the bias voltage $V_{DC}$. The normalized minimum gap 302 radius $a_{n\_min}$ and radiation plate 310 thickness $t_{m\_n\_min}$ are instead determined by normalized static mechanical force $F_b/F_g$ and relative bias voltage $V_{DC}/V_C$, as shown in Equations 8, 19, 20, 22 and 24.

Using Equations 26-29, a normalized radiation plate 310 radius-to-thickness ratio $(a/t_m)_N$ can be chosen (within the limitations described by the equations) that is less than the maximum radius-to-thickness ratio $$\left(\frac{a}{t_m}\right)_{N\_max},$$

that is, less than the value of the normalized radius-to-thickness ratio $(a/t_m)_N$ at the elastic linearity limit. The smaller the normalized radius-to-thickness ratio $(a/t_m)_N$ of an MCM 300 operated at a selected operating point $(F_b/F_g, V_{DC}, V_{DC}/V_C)$, the larger the gap 302 radius a, the thicker the radiation plate 310 (larger $t_m$), and the more robust the linearly elastic operation (less prone to variations in operation removing the MCM 300 from the linearly elastic regime) of the MCM 300 operated at the selected operating point; without changing the OCRV sensitivity corresponding to that operating point. Further, increased normalized radius-to-thickness ratio $(a/t_m)_N$ (within the limitations described in the equations) results in increased input capacitance $C_{in}$ of the MCM 300, which is advantageous for pre-amplification electronics. Also, the larger the clamped capacitance $C_0$, the smaller the relative effect of parasitic capacitance on MCM 300 performance. Accordingly, a choice of normalized radius-to-thickness ratio $(a/t_m)_N$ can be made while retaining the same optimal OCRV sensitivity at the selected operating point.

A scalar K is defined in Equation 26, relating the normalized radius-to-thickness ratio $(a/t_m)_N$ to the maximum normalized radius-to-thickness ratio $$\left(\frac{a}{t_m}\right)_{N\_max}.$$

K, as expressed in Equation 27, is defined to satisfy the elastic linearity constraint. Accordingly, K is larger than unity, that is, K>1.

$$\left(\frac{a}{t_m}\right)_N = \frac{1}{K}\left(\frac{a}{t_m}\right)_{N\_max} \qquad \text{Equation 26}$$

$$\left(\frac{a}{t_m}\right)_N < \left(\frac{a}{t_m}\right)_{N\_max} \qquad \text{Equation 27}$$

The normalized radius $a_n$ can be expressed in terms of the minimum normalized gap 302 radius $a_{n\_min}$ and the scalar K as shown in Equation 28. The normalized thickness $t_{m\_n}$ of the radiation plate 310 can be expressed in terms of the minimum normalized thickness of the radiation plate 310 $t_{m\_n\_min}$ and the scalar K as shown in Equation 29. A larger K means a radiation plate 310 that is thicker relative to the gap 302 radius a. There is an upper limit for K, approximately K<5, above which the radiation plate 310 becomes too thick for the model to be valid. Further, in some embodiments comprising an MCM 300 fabricated from typical materials and intended for use in an air environment, K<2.5 is preferable. Microphones with K over 2.5 will have gap 302 radius a much larger than radiation plate 310 thickness $t_m$. This can make the MCM 300 difficult and/or expensive to manufacture, and potentially fragile in operation.

$$a_n = (K^3)a_{n\_min} \qquad \text{Equation 28}$$

$$t_{m\_n} = (K^4)t_{m\_n\_min} \qquad \text{Equation 29}$$

For a particular selected operating point triplet $$\left(\frac{F_b}{F_g}, V_{DC}, \frac{V_{DC}}{V_C}\right),$$

changes in K (within boundaries as described) will not affect the MCM 300 sensitivity or the effective gap 302 height $t_{ge}$.

Open Circuit Receive Voltage (OCRV) sensitivity of an MCM 300 is obtained, in volts (V) per pascal (Pa), as shown in Equation 30. (Particular units are used herein by way of example only; other units can be used.) The OCRV sensitivity is represented by $S_{VO}$. $S_{VO}=V_{OC}/p$. $V_{OC}$ is the voltage across the electrical terminals (not shown) of the MCM 300 when the terminals are in open circuit, and p represents incident pressure, meaning that $V_{OC}/p$ describes the strength ($V_{OC}$) of the voltage induced between the terminals of a microphone circuit by a pressure wave of magnitude p incident on the radiation plate 310. Equation 30 assumes that the MCM 300 is mounted on a rigid baffle and operated off-resonance, and ignores radiation impedance (losses from radiation impedance are discussed in the Background, above).

$$S_{VO} = \frac{V_{OC}}{p} = -\left[\frac{3}{8}\sqrt{\frac{2}{5}}\sqrt{\frac{1-\sigma^2}{\varepsilon_0 Y_0}}\left(\frac{a^2}{t_m}\right)\sqrt{\frac{t_{ge}}{t_m}}\right]h\left(\frac{X_p}{t_{ge}},\frac{F_b}{F_g},\frac{C_p}{C_0}\right)\frac{V}{Pa} \quad \text{Equation 30}$$

Equation 30 can be rewritten so that OCRV sensitivity is expressed in terms of the operating point parameters ($F_b/F_g$, $V_{DC}$, $V_{DC}/V_C$). This is done using expressions for effective gap 302 height $t_{ge}$, radiation plate 310 thickness $t_m$, and gap 302 radius a, in Equations 10, 15 and 18, respectively. Expressions for input capacitance $C_{in}$ and clamped capacitance $C_0$ in terms of the operating point are provided in Equations 37 and 38, respectively.

$$S_{VO} = \frac{V_{OC}}{p} = -\left[\frac{9}{2}\sqrt{\frac{1}{5}}\left(\frac{V_{DC}}{P_0}\right)\right]h_{OC}\left(\frac{F_b}{F_g},\frac{V_{DC}}{V_C},\frac{C_p}{C_0}\right)\frac{V}{Pa} \quad \text{Equation 31}$$

The dimensionless normalized OCRV sensitivity $h_{oc}$ is given as shown in Equation 32. The dimensionless normalized OCRV sensitivity $h_{oc}$ is a function of the parasitic capacitance $C_p$ and the operating point parameters voltage bias level $V_{DC}/V_C$ and normalized static mechanical force $F_b/F_g$. The functions g(u), g'(u), and g"(u) are shown and described with respect to Equations 2-4 (above). Preferably, the parasitic capacitance $C_p$ is relatively small compared to the input capacitance $C_0$, for example, small enough that the effects of the parasitic capacitance can be ignored and/or do not prevent meeting design performance specifications. The ratio of the collapse voltage to the collapse voltage in a vacuum $V_C/V_r$ can be substituted for using Equation 8. The dimensionless normalized OCRV sensitivity $h_{oc}$ is evaluated at the static equilibrium shown in Equation 20, but does not explicitly depend on the dimensions of the MCM 300 (such as gap 302 radius a) or material properties (such as Poisson's ratio). The normalized static displacement of the center of the radiation plate 310 $X_{PN}$ equals the ratio of the static displacement $X_P$ to the effective gap height $t_{ge}$ at the operating point, as shown in Equation 33. Also, as shown in Equation 33, the normalized static displacement $X_{PN}$ depends only on the relative bias level $V_{DC}/V_C$ and the normalized static mechanical force $F_b/F_g$.

$$h_{oc}\left(\frac{V_{DC}}{V_C},\frac{F_b}{F_g},\frac{C_p}{C_0}\right) = \frac{\frac{F_b}{F_g}g'(X_{PN})}{\left(\frac{V_{DC}}{V_C}\frac{V_C}{V_r}g'(X_{PN})\right)^2 + \left[\frac{C_p}{C_0}+g(X_{PN})\right]} \quad \text{Equation 32}$$

$$\left[\frac{3}{4}-\frac{1}{2}\left(\frac{V_{DC}}{V_C}\frac{V_C}{V_r}\right)^2 g''(X_{PN})\right]$$

$$X_{PN} = \frac{X_P}{t_{ge}} \text{ at the operating point }\left(\frac{F_b}{F_g},\frac{V_{DC}}{V_C}\right) \quad \text{Equation 33}$$

The OCRV sensitivity is a linear function of the ratio of the bias voltage to the static pressure difference between the gap 302 and the ambient $V_{DC}/P_0$. The sensitivity coefficient given in Equation 31 can be restated, using Equation 12 and holding the static pressure differential $P_0$ to be SAP, as shown in Equation 34.

$$\frac{9}{2}\sqrt{\frac{1}{5}}\left(\frac{V_{DC}}{P_0}\right) \approx \begin{cases} 2\times 10^{-5}V_{DC} & \frac{V}{Pa} \\ \frac{3}{\sqrt{5\varepsilon_0 P_0}}V_{DC\_n} = 1416.5\ V_{DC\_n} & \frac{V}{Pa} \end{cases} \quad \text{Equation 34}$$

As shown in Equation 34, the sensitivity coefficient can be described as $2\times 10^{-5}$ V/Pa per volt bias when the static pressure differential $P_0$ is SAP. Equations 6 and 7 show that the OCRV sensitivity is indirectly related to (though, as shown herein, not dependent on) the material properties of the radiation plate 310 through the normalized static mechanical force $F_b/F_g$ and $V_{DC}$. As a result, it can be seen that sensitivity increases (improves) as $F_b/F_g$ and/or $V_{DC}$ increases, and sensitivity decreases (worsens) as $F_b/F_g$ and/or $V_{DC}$ decreases.

The sensitivity of an MCM with a gap in the shape of a regular convex polygon (such as a square, pentagon, hexagon or octagon) with area equal to a circle of a particular radius R can be modelled similarly to an MCM 300 with a gap 302 of radius R, with additional parallel input capacitance—similar to parasitic capacitance—as part of the model. Because of the additional parasitic capacitance, such non-circular geometries will generally have lower OCRV sensitivity than an MCM 300 with a circular gap 302.

An MCM with an elliptical gap can also be modelled similarly to an MCM with a circular gap; as can a convex polygon with a same aspect ratio and equal gap area as an ellipse (such as a rectangle); with additional parallel input capacitance as part of the model. Because of the additional parasitic capacitance, such non-circular geometries will generally have lower OCRV sensitivity than an MCM 300 with a circular gap 302.

Irregular convex polygons and concave polygons can also be modelled by an equivalent circle with an area smaller than the area of the polygon, and with a parallel capacitance (in this case, resulting in a significantly higher ratio between parasitic capacitance $C_p$ and clamped capacitance $C_0$). Because of the additional parasitic capacitance, such non-circular geometries will generally have lower OCRV sensitivity than an MCM 300 with a circular gap 302, or a gap in the shape of a regular polygon.

In other words, an equivalent circular gap can be defined for a polygonal gap geometry, using an additional parallel capacitance to adapt the circular gap model described herein to the different geometry.

FIG. 9 shows a graph 900 of the relationship between normalized Open Circuit Received Voltage Sensitivity (OCRV) and normalized static mechanical force $F_b/F_g$, for example values of the relative bias voltage level $V_{DC}/V_C$, where parasitic capacitance $C_p$ divided by clamped capacitance $C_0$ equals zero, that is, $C_p/C_0=0$. This relationship is provided in Equation 35, which is obtained using Equations 12 and 31 (as described with respect to Equation 34). For an MCM 300 with a gap 302 containing a vacuum, when the ambient pressure is SAP, the static pressure difference between the gap 302 and the ambient is $P_0 = 101.325$ kPa.

$$S_{VO\_n} = S_{VO} - 20\log V_{DC\_n} \quad \text{Equation 35}$$

$$= 20\log\left|\frac{3}{\sqrt{5\varepsilon_o P_o}} h_{oc}\left(\frac{F_b}{F_g}, \frac{V_{DC}}{V_C}, 0\right)\right|$$

$$\text{dB re } \frac{V}{Pa \times m}$$

As shown in FIG. 9, normalized OCRV sensitivity varies less than 5 dB for relative bias voltage levels $V_{DC}/V_C$ between 0.4 and 0.9, and for possible levels of normalized static mechanical force $F_b/F_g$ (as described above with respect to FIG. 4 and Equation 6). Also, as shown in FIG. 9, the higher the normalized static mechanical force $F_b/F_g$, the higher the normalized OCRV sensitivity.

At the elastic linearity threshold, that is, when $a = a_{min}$ and $t_m = t_{m\_min}$, the sensitivity is about 1 dB less than the OCRV sensitivity given in Equation 35. This is related to the elastic linearity constraint being an approximation (there is generally not a sudden transition in microphone performance characteristics at the boundary of the elastic linearity constraint as described herein). When the radius-to-thickness ratio $$\frac{a}{t_m}$$

is lower than the maximum, the radiation plate 310 is relatively thicker and the MCM 300 maintains the OCRV sensitivity corresponding to the operating point, as described in Equation 35.

Advantageously, increasing clamp capacitance and input capacitance reduces the effect of parasitic capacitance on OCRV sensitivity, and enables better performance in front-end electronics designs. Accordingly, if input capacitance Cin is large compared to parasitic capacitance, then the amount by which the parasitic capacitance reduces the OCRV sensitivity will be diminished (or eliminated). Also, if clamped capacitance is increased, microphone impedance will be lowered; in some embodiments, this can enable simpler pre-amplifier design, higher pre-amplifier gain, and lower pre-amplifier noise contribution. The deflected clamped capacitance $C_{0d}$ (clamped capacitance when the radiation plate 310 is deflected by the static deflection $X_P$) at the operating point ($F_b/F_g$, $V_{DC}$, $V_{DC}/V_C$) is related to the clamped capacitance $C_0$ as shown in Equation 36. The input capacitance $C_{in}$ at the operating point is given in Equation 37 (see Equations 2-4).

$$C_{0d} = C_0 g(X_{PN}) \quad \text{Equation 36}$$

$$C_{in} = C_0 \left\{ g(X_{PN}) + \frac{4}{3} \frac{\left(\frac{V_{DC}^2 V_C^2}{V_C^2 V_r^2}[g'(X_{PN})]\right)^2}{1 - \frac{2V_{DC}^2 V_C^2}{3V_C^2 V_r^2} g''(X_{PN})} \right\} \quad \text{Equation 37}$$

The normalized static displacement $X_{PN}$ is determined using Equation 33. The clamped capacitance $C_0$ for an MCM 300 with a radiation plate 310 radius-to-thickness ratio $$\frac{a}{t_m}$$

and operating in the linearly elastic regime is expressed in terms of the operating point parameters as shown in Equation 38. The clamped capacitance $C_0$ equals the area of the MCM 300 cell divided by the effective gap height $t_{ge}$, $C_0 = 2\pi a^2/t_{ge}$. Equation 38 is produced using this relationship, and using Equations 9, 17 and 18. The ratio of the collapse voltage to the collapse voltage in a vacuum $V_C/V_r$ can be substituted for using Equation 8. The physical constant-dependent multiplier in Equation 38 has units of farads.

$$C_0 = \pi\varepsilon_0 \left(10\sqrt[4]{\frac{Y_0}{15(1-\sigma^2)P_0}}\right)^2 \quad \text{Equation 38}$$

$$V_{DC\_n}\left(\frac{a}{t_m}\right)_N^{-6}\left(\frac{V_{DC}}{V_C}\right)^{-1}\left(\frac{V_C}{V_r}\right)^{-1}\left(\frac{F_b}{F_g}\right)^{5/2}$$

As shown in Equation 38, $C_0$ is inversely proportional to the sixth power of the radius-to-thickness ratio $$\frac{a}{t_m}.$$

when the normalized radius-to-thickness ratio $(a/t_m)_N$ is chosen to be $$0.794 \times \left(\frac{a}{t_m}\right)_{N\_max},$$

corresponding to K=1.26, the gap radius 302 a is doubled (see Equation 28) and the input capacitance $C_{in}$ is increased by a factor of four. As described above, because this does not change the operating point and obeys the elastic linearity constraint, it also does not change the OCRV sensitivity.

Equation 39 shows the physical constant-dependent multiplier for a silicon radiation plate 310, where differential static pressure $P_0$ equals SAP.

$$\pi\varepsilon_0\left(10\sqrt[4]{\frac{Y_0}{15(1-\sigma^2)P_0}}\right)^2 V_{DC\_n} = 12.33 \times 10^{-15} V_{DC} F \quad \text{Equation 39}$$

FIG. 10 shows a log-lin semi-log graph 1000 of the relationship between normalized input capacitance $C_{in\_n}$ and normalized static mechanical force $F_b/F_g$, for example values of the relative bias voltage level $V_{DC}/V_C$, where the normalized radius-to-thickness ratio equals the maximum normalized radius-to-thickness ratio $$\left(\frac{a}{t_m}\right)_N$$

which enables linearly elastic operation. The normalized input capacitance $C_{in\_n}$ is shown in Equation 40 in terms of the operating point. Equation 8 can be used to substitute for the ratio between the collapse voltage and the collapse voltage in a vacuum $V_C/V_r$.

$$C_{in\_n} = \left\{ g(X_{PN}) + \frac{4}{3} \frac{\frac{V_{DC}^2}{V_C^2} \frac{V_C^2}{V_r^2} [g'(X_{PN})]^2}{1 - \frac{2}{3} \frac{V_{DC}^2}{V_C^2} \frac{V_C^2}{V_r^2} g''(X_{PN})} \right\}$$ Equation 40

$$\left(\frac{a}{t_m}\right)_N^{-6} \left(\frac{V_{DC}}{V_C}\right)^{-1} \left(\frac{V_C}{V_r}\right)^{-1} \left(\frac{F_b}{F_g}\right)^{5/2}$$

Using Norton source transformation and Equation 31, the SCRC sensitivity can be obtained from the OCRV sensitivity as shown in Equation 41. The SCRC sensitivity is represented by $S_{IS}$. $S_{IS}=I_{SC}/p$. $I_{SC}$ is short circuit current, and p represents incident pressure, meaning that $I_{SC}/p$ describes the strength ($S_{IS}$) of the current induced between the shorted terminals of an MCM 300 by a pressure wave of magnitude p incident on the radiation plate 310. The SCRC sensitivity is related to the OCRV sensitivity according to $I_{SC}=-j\omega C_{in} V_{OC}$. Here, ω represents the radial frequency of the sound signal at which the sensitivity is evaluated. The (−jω) portion of the expression means that the SCRC sensitivity increases as the frequency increases.

$$S_{IS} = \frac{I_{sc}}{p} = -j\omega C_{in} \left[ \frac{9}{2} \sqrt{\frac{1}{5} \left(\frac{V_{DC}}{P_0}\right)} \right] h_{oc}\left(\frac{F_b}{F_g}, \frac{V_{DC}}{V_C}, \frac{C_p}{C_0}\right) \frac{A}{Pa}$$ Equation 41

Equation 41 can be rewritten to obtain Equation 42, using Equations 37, 38 and 40. Equation 43 shows the expression for SCRC sensitivity of Equation 42, in units of $$dB \text{ re } \frac{A}{Pa},$$

corresponding to decibels relative to amps per pascal.

$$\frac{I_{sc}}{p} = -j\omega\pi\varepsilon_0 \left( 10 \sqrt[4]{\frac{Y_0}{15(1-\sigma^2)P_0}} \right)^2 V_{DC\_n}$$ Equation 42

$$C_{in\_n} \left\{ \left[ \frac{9}{2} \sqrt{\frac{1}{5} \left(\frac{V_{DC}}{P_0}\right)} \right] h_{oc}\left(\frac{F_b}{F_g}, \frac{V_{DC}}{V_C}, \frac{C_p}{C_0}\right) \right\} \frac{A}{Pa}$$

$$S_{IS} =$$ Equation 43

$$20\log\frac{I_{sc}}{p} dB \text{ re } \frac{A}{Pa} = \{S_{VO} - 20\log V_{DC\_n}\} + 20\log C_{in\_n} +$$

$$40\log V_{DC\_n} + 20\log\left( \omega\pi\varepsilon_0 \left( 10 \sqrt[4]{\frac{Y_0}{15(1-\sigma^2)P_0}} \right)^2 \right)$$

Equation 44 expresses the second term of Equation 43 using the corresponding operating point parameter, bias voltage $V_{DC}$. Equation 45 provides the value of the fifth (last) term of Equation 43 at 1 kHz operating frequency for a crystalline silicon radiation plate 310 at SAP. The unit S is Siemens.

$$20 \log V_{DC\_n} = -157.1 + 20 \log V_{DC} \text{ dBre(m)}$$ Equation 44

$$20\log\left\{ \omega\pi\varepsilon_0 \left( 10 \sqrt[4]{\frac{Y_0}{15(1-\sigma^2)P_0}} \right)^2 \right\} =$$ Equation 45

-continued $$-4.51 \text{ dB re } \frac{S}{m} \text{ at 1 kHz}$$

Equation 46 provides a simplified version of Equation 43, in terms of bias voltage $V_{DC}$ and normalized input capacitance $$S_{IS} = \{S_{VO} - 20\log V_{DC}\} + 20\log C_{in\_n} +$$ Equation 46

$$40\log V_{DC} - 359.3 \text{ dB } \frac{A}{Pa} \text{ at 1 kHz}$$

FIG. 11 shows a graph 1100 of the relationship between normalized Short Circuit Received Current Sensitivity ($SCRC_n$) and normalized static mechanical force $F_b/F_g$, for example values of the relative bias voltage level $V_{DC}/V_C$. The normalized SCRC sensitivity is determined as shown in Equation 47.

$$SCRC_n \text{ sensitivity}=S_{IS}-40 \log V_{DC\_n}$$ Equation 47

FIG. 12 shows a graph 1200 of the relationship between normalized Short Circuit Received Current Sensitivity ($SCRC_n$) per square meter and normalized static mechanical force $F_b/F_g$, for example values of the relative bias voltage level $V_{DC}/V_C$. OCRV sensitivity is independent of the area of the MCM 300 (the area of the circular gap 302), whereas SCRC sensitivity depends on the area of the MCM 300. SCRC sensitivity per square meter $S_{IS}/m^2$ is obtained by normalizing SCRC to the area of the cell (SCRC is divided by the area of an MCM 300 cell $\pi a^2$). Equation 48 is obtained using Equations 17, 37, 38, 40 and 41.

$$S_{IS}/m^2 = 20\log\frac{I_{sc}}{\pi a^2 p} = 20\log\left| -j\omega \frac{C_{in}}{\pi a^2} \left[ \frac{9}{2} \sqrt{\frac{1}{5} \left(\frac{V_{DC}}{P_0}\right)} \right] \right.$$ Equation 48

$$\left. h_{oc}\left(\frac{V_{DC}}{V_C}, \frac{F_b}{F_g}, \frac{C_p}{C_0}\right) \right| \text{ dB re } \frac{A}{Pa \times m^2}$$

$$= 20\log\left| -j\omega\left(3\sqrt{\frac{\varepsilon_0}{5P_0}}\right)\left\{\frac{C_{in\_n}}{a_n^2} h_{oc}\left(\frac{V_{DC}}{V_C}, \frac{F_b}{F_g}, \frac{C_p}{C_0}\right)\right\} \right|$$

$$\text{dB re } \frac{A}{Pa \times m^2}$$

The constant term in Equation 48, $$3\sqrt{\frac{\varepsilon_0}{5P_0}},$$

can be evaluated as shown in Equation 49, taking the static pressure differential $P_0$ to be SAP.

$$3\sqrt{\frac{\varepsilon_0}{5P_0}} = 1.254 \times 10^{-8} \frac{A \times \sec}{Pa \times m^2} = -158 \text{ dB re } \frac{A \times \sec}{Pa \times m^2}$$ Equation 49

SCRC sensitivity per unit area ($S_{IS}/m^2$) is independent of material properties and the bias voltage $V_{DC}$, and provides better guidance for the choice of operational parameters than unmodified SCRC sensitivity $S_{IS}$. This is because, generally, the larger the MCM 300 cell area, the better the sensitivity of the MCM 300 cell.

Sensitivity can also be increased by using multiple MCM 300 cells which are electrically connected in parallel.

A wide variety of combinations of less than all operating point parameters can be specified at the beginning of MCM 300 design so that the specified values are sufficient to determine the corresponding remaining MCM 300 characteristics. That is, combinations can be specified of a (small) subset of MCM 300 dimensions, MCM 300 OCRV and SCRC sensitivities, and/or other MCM 300 characteristics, and the remaining MCM characteristics can be determined from the selected values. This is enabled by the relationships between operating point parameters and MCM 300 properties as described above; as well as by the use of normalized dimensions, which are independent of properties of materials to be used in MCM manufacture; and by the scaling properties described with respect to Equations 26-29, which can be used to adjust the gap 302 radius a as desired (within limits, as described above). For example, an MCM 300 can be designed to obtain a specific OCRV sensitivity $S_{VO}$, a specified dimension (e.g., gap 302 radius a, gap 302 height $t_g$ or radiation plate 310 thickness $t_m$), a specified bias voltage $V_{DC}$, or a specified value for one or more other selected variables; while remaining within parametric ranges corresponding to an MCM 300 capable of maintaining linearly elastic, uncollapsed operation.

Advantageously, the design process can be initiated by choosing a normalized static mechanical force $F_b/F_g$ and a relative bias voltage $V_{DC}/V_C$ which will make uncollapsed operation highly robust. Generally, the higher the normalized static mechanical force $F_b/F_g$ and relative bias voltage $V_{DC}/V_C$, the higher the normalized OCRV sensitivity of the MCM 300. For example, the OCRV sensitivity at $$\left(\frac{F_b}{F_g}, \frac{V_{DC}}{V_C}\right) = (0.9, 0.9)$$

is almost 40 dB higher than the OCRV sensitivity at $$\left(\frac{F_b}{F_g}, \frac{V_{DC}}{V_C}\right) = (0.1, 0.1)$$

(see Equations 2-4, 8, 12, 32, 35 and 38), holding other variables constant when the operating point parameters are changed as stated. Similarly, the minimum gap 302 radius $a_{min}$ (as described above) will be approximately 30 times larger at $$\left(\frac{F_b}{F_g}, \frac{V_{DC}}{V_C}\right) = (0.9, 0.9)$$

than at $$\left(\frac{F_b}{F_g}, \frac{V_{DC}}{V_C}\right) = (0.1, 0.1)$$

(see Equations 3 and 19-22), holding other variables constant when the operating point parameters are changed as stated. However, generally, the lower the normalized static mechanical force $F_b/F_g$ and relative bias voltage $V_{DC}/V_C$, the more stable the MCM 300 will be against static pressure variations, production tolerances, and variations in bias voltage conditions. The design processes described herein enable various types of design objectives to be met efficiently and with effective MCM 300 performance results.

Note, however, that sensitivity will generally be poor for MCMs 300 with normalized static mechanical force and relative bias voltage level $$\left(\frac{F_b}{F_g}, \frac{V_{DC}}{V_C}\right) < (0.1, 0.1).$$

Also, MCMs 300 with normalized static mechanical force and relative bias voltage level $$\left(\frac{F_b}{F_g}, \frac{V_{DC}}{V_C}\right) > (0.85, 0.9)$$

(respectively) will be prone to collapse.

FIG. 13 shows an example process 1300 for design of an MCM 300, starting with a selected OCRV sensitivity, normalized static mechanical force $F_b/F_g$, and relative bias voltage $V_{DC}/V_C$. Accordingly, in step 1302, a gap 302 pressure, an OCRV sensitivity, a normalized static mechanical force $F_b/F_g$, and a relative bias voltage level $V_{DC}/V_C$ are selected, and K is set to equal one (K=1, see Equations 26-29). For example, for an MCM 300 with a gap 302 containing vacuum, these selections can comprise an OCRV sensitivity of −60 dB at SAP, a normalized static mechanical force $F_b/F_g$=0.7, and a relative bias voltage level $V_{DC}/V_C$=0.7.

In step 1304, normalized dimensions, normalized OCRV sensitivity and bias voltage $V_{DC}$ are determined. For K=1, Equations 19 and 20 can be used to determine that the normalized maximum ratio between the gap 302 radius and the radiation plate 310 thickness $$\left(\frac{a}{t_m}\right)_{N\_max} = 0.986.$$

As described above, gap 302 radius a and radiation plate 310 thickness $t_m$ are inversely related to the ratio between gap 302 radius and radiation plate thickness 310 $a/t_m$. Therefore, an MCM 300 in which $$\left(\frac{a}{t_m}\right)_N = \left(\frac{a}{t_m}\right)_{N\_max} (K=1)$$

is the smallest MCM 300 which satisfies the elastic linearity constraint and has the specified sensitivity when operating at the specified normalized static mechanical force $F_b/F_g$=0.7 and relative bias voltage level $V_{DC}/V_C$=0.7 (in the described example), and the corresponding bias voltage $V_{DC}$ (the minimum bias voltage $V_{DC}$ to produce the specified OCRV sensitivity; as described above, increasing bias voltage $V_{DC}$ increases OCRV sensitivity) That is, normalized dimensions determined in step 1304 will be the minimum normalized dimensions. Equations 8 and 22-24 can then be used to determine these normalized minimum dimensions: normalized gap 302 radius $a_n$=2.198; normalized radiation plate 310 thickness $t_{m\_n}$=2.221; normalized effective gap 302 height $t_{ge\_n}$=3.00; and normalized OCRV sensitivity $S_{VO}$–20 log $V_{DC\_n}$=63.64 dB. The normalized bias voltage $V_{DC\_n}$ and bias voltage $V_{DC}$ can be determined using the normalized OCRV sensitivity $S_{VO}$–20 log $V_{DC\_n}$: $V_{DC\_n}$=6.573× $10^{-7}$ in and $V_{DC}$=47 V.

In step 1306, the dimensions determined in step 1304 are de-normalized for a selected radiation plate 310 material, to produce physical dimensions of an MCM 300 with a vacuum gap 302 (the selected gap pressure) and the selected sensitivity and operating point parameters. In the described example, the normalized dimensions correspond to de-normalized physical dimensions as follows (see Equations 8, 10, 13 and 18): radiation plate 310 thickness $t_m$=10.42 µm, and effective gap 302 height $t_{ge}$=2.82 µm; and for a crystalline silicon radiation plate 310, with Young's modulus $Y_0$ of 250 GPa and Poisson's ratio σ of 0.14, gap 302 radius a=366.1 µm (in this example, input capacitance $C_{in}$=2.2 pF). If the radiation plate 310 is made of a harder material, for example a material with Young's modulus $Y_0$ of 250 GPa and Poisson's ratio σ of 0.14, gap 302 radius a=413 µm. Changing radiation plate 310 hardness does not change radiation plate 310 thickness $t_m$ or effective gap 302 height $t_{ge}$.

In step 1308, the gap 302 height $t_g$ and the total insulator thickness $t_i$=$t_{i1}$+$t_{i2}$ of the first and second insulator layers 316, 316 are determined from the effective gap 302 height $t_{ge}$ using Equation 1. The gap height $t_g$ is preferably large enough to enable, with a margin, the radiation plate 310 to be displaced by the static displacement of the center of the radiation plate 310 $X_P$ without the radiation plate 310 collapsing. That is, a "safe" gap 302 height $t_g$ should be chosen, meaning sufficient room should be given to compensate for variations in operating conditions, such as variations in bias voltage $V_{DC}$ (and therefore relative bias voltage level $V_{DC}/V_C$) due to variations in a voltage supply providing the bias voltage, or changes in atmospheric pressure due to weather or pressure waves (sounds) incident on the radiation plate 310. In the described example, normalized static displacement $$\frac{X_p}{t_{ge}} = \frac{F_b}{F_g}\left(\frac{a}{t_m}\right)^{-4}_{N\_max} = (0.7)(1.058) = 0.74.$$

This results in static displacement $X_P$=2.09 µm. As determined above, effective gap height $t_{ge}$=2.82 µm. If $t_g$=2.50 µm is chosen as a safe gap 302 height, then the total insulator thickness ti is limited by $$\frac{t_{i1}}{\varepsilon_{r\_i1}} + \frac{t_{i2}}{\varepsilon_{r\_i2}} = t_{ge} - t_g = 2.82 - 2.50 = .32 \text{ µm}.$$

If an insulator material is selected for both insulator layers 314, 316 with a relative permittivity of 4, then total insulator thickness $t_i$=1.28 µm.

In step 1310, to make linear elastic operation more robust, and if a larger gap 302 radius is desired (such as to improve SCRC sensitivity), then the scaling method described by equations 26-29 can be used. Accordingly, K can be selected (preferably, within described limitations) to adjust (increase) the gap 302 radius a and the radiation plate 310 thickness $t_m$, and adjust (decrease) the ratio between the gap 302 radius and the radiation plate 310 thickness $a/t_m$. Steps 1304 through 1310 can then be repeated with the new K, until the desired results are achieved.

FIG. 14 shows an example process 1400 for design of an MCM 300, starting with a selected normalized static mechanical force $F_b/F_g$, bias voltage $V_{DC}$, and relative bias voltage $V_{DC}/V_C$. In step 1402, the process begins by selecting a gap 302 pressure, a normalized static mechanical force $F_b/F_g$, a bias voltage $V_{DC}$, and a relative bias voltage level $V_{DC}/V_C$; and by setting K to equal 1 (K=1, see Equations 26-29). For example, for an MCM 300 with a gap 302 containing vacuum, these selections can comprise a bias voltage $V_{DC}$=10 volts, a normalized static mechanical force $F_b/F_g$=0.7, and a relative bias voltage level $V_{DC}/V_C$=0 0.7.

In step 1404, for K=1, Equations 19 and 20 can be used to determine that the normalized maximum ratio between the gap 302 radius and the radiation plate 310 thickness $$\left(\frac{a}{t_m}\right)_{N\_max} = 0.986.$$

Also, Equation 12 can be used to determine $V_{DC\_n}$=1.4× $10^{-7}$ (in) at SAP. Normalized dimensions and other values thus correspond to: normalized gap 302 radius $a_n$=2.198, normalized radiation plate 310 thickness $t_{m\_n}$=2.221, normalized gap 302 height $t_{ge\_n}$=3.00, and normalized OCRV sensitivity $S_{VO}$–20 log $V_{DC\_n}$=63.64 dB (in this example, normalized input capacitance $C_{in\_n}$=3.7890).

In step 1406, MCM 300 dimensions are de-normalized to determine physical dimensions using a selected radiation plate 310 material. In the described example, the normalized dimensions correspond to de-normalized physical dimensions as follows: radiation plate 310 thickness $t_m$=2.22 µm (at K=1, this is a minimum radiation plate 310 thickness), effective gap height $t_{ge}$=600 nm, and OCRV sensitivity $S_{VO}$=−73.44

$$\text{dB re } \frac{V}{PA};$$

and for a crystalline silicon radiation plate 310, gap 302 radius a=78.0 µm and input capacitance $C_{in}$=0.5 pF (a relatively low capacitance for use in conjunction with pre-amplification circuitry). Gap 302 height $t_g$ and total insulator thickness $t_i$ can also be determined (similarly to step 1308).

In the example discussed with respect to FIG. 14, the resulting gap 302 radius a=78.0 µm (aperture) is small, and will generally correspond to a low SCRC sensitivity. In some embodiments, amplification circuitry used to amplify an MCM 300 output signal can result in a loss in total SNR of the microphone-plus-amplification system that reduces SNR below design specifications. In some embodiments corresponding to the example described with respect to FIG. 14 (with gap 302 radius a=78.0 µm), a microphone can comprise sufficient MCM 300 cells, electrically connected in parallel (such as in a closed pack array), to cover an area of 1 mm²; for example, 30 such cells. The input capacitance of such an array would be 30*0.5=15 pF.

Alternatively, in step 1408, to make linear elastic operation more robust, and if a larger gap 302 radius is desired (such as to improve SCRC sensitivity), then the scaling method described by Equations 26-29 can be used. Accordingly, K can be selected (preferably, within described limitations) to adjust (increase) the gap 302 radius a and the radiation plate 310 thickness $t_m$, and adjust (decrease) the ratio between the gap 302 radius and the radiation plate 310 thickness $a/t_m$. Steps 1404 through 1308 can then be repeated with the new K, until the desired results are achieved.

For example, K=2, meaning that $$\left(\frac{a}{t_m}\right)_N = \frac{1}{2}\left(\frac{a}{t_m}\right)_{N\_max} = 0.493.$$

This results in normalized dimensions (see step 1404 and Equations 26-29) as follows: normalized gap 302 radius $a_n=(2^3)a_{n\_min}=17.584$; and normalized radiation plate 310 thickness $t_{m\_n}=(2^4)\ t_{m\_n\_min}=17.768$. The physical dimensions then become, for a crystallized silicon radiation plate 310 (see step 1406 and Equations 16 and 17): gap 302 radius $a=626.0$ μm; and radiation plate 310 thickness $t_m=35.5$ μm. Changes in K do not change effective gap height $t_{ge}$ or OCRV sensitivity $S_{VO}$ (except with respect to effects due to the elastic linearity constraint being an approximation).

FIG. 15 shows an example process 1500 for design of an MCM 300, starting with a selected gap 302 radius, a bias voltage $V_{DC}$, and radiation plate 310 material. Accordingly, in step 1502, a gap 302 pressure, a gap 302 radius a, a bias voltage $V_{DC}$, a radiation plate 310 material are selected. In step 1504, the specified bias voltage $V_{DC}$ is used to determine a range of normalized minimum gap 302 radii $a_{n\_min}$ corresponding to preferred $$\left(\frac{F_b}{F_g}, \frac{V_{DC}}{V_C}\right)$$

pairs (such as a range of such pairs), along with corresponding OCRV sensitivities. In step 1506, the range of minimum gap 302 radii $a_{n\_min}$ is denormalized for the preferred material using the material's properties and the bias voltage $V_{DC}$ to obtain a range of physical minimum gap 302 radii $a_{min}$. In step 1506, if the specified gap 302 radius a is larger than a determined minimum gap 302 radius $a_{min}$ corresponding to a preferred $$\left(\frac{F_b}{F_g}, \frac{V_{DC}}{V_C}\right)$$

pair and corresponding determined OCRV sensitivity, then the minimum gap 302 radius $a_{min}$ can be scaled up to the specified gap 302 radius a using (and as described with respect to) Equations 26-29. In step 1508, other MCM 300 dimensions can be determined using the selected operating point, the normalized dimensions at the selected operating point, and the scaling constant K determined in step 1506.

FIG. 16 shows an example process 1600 for design of an MCM 300, starting with a selected radiation plate 310 thickness $t_m$ or effective gap 302 height $t_{ge}$, and a selected bias voltage $V_{DC}$ or other parameter dependent on bias voltage $V_{DC}$. (For example, OCRV sensitivity is dependent on bias voltage $V_{DC}$.) In step 1602, a gap 302 pressure, a radiation plate 310 thickness $t_m$ or effective gap 302 height $t_{ge}$, a bias voltage $V_{DC}$, a radiation plate 310 material are selected. In step 1604, the specified dimension is normalized for the selected bias voltage $V_{DC}$, or for another parameter (such as sensitivity) which is dependent on bias voltage $V_{DC}$. In step 1604, the normalized static mechanical force and relative bias voltage level $$\left(\frac{F_b}{F_g}, \frac{V_{DC}}{V_C}\right)$$

corresponding to this normalized dimension are then determined. In step 1606, a safe operating point is chosen (similarly to step 1308) from the determined parameters, and other physical dimensions suitable for production using a preferred material are determined (including any desired rescaling).

The design processes described in FIGS. 13-16 are merely exemplary; other design processes can be used, as described herein.

FIG. 17 shows a graph 1700 of the relationship between normalized minimum gap 302 radius $a_{n\_min}$ and normalized effective gap 302 height $t_{ge\_n}$ for various values of the relative bias voltage level $V_{DC}/V_C$. As described above, sensitivity will generally be poor for MCMs 300 with normalized static mechanical force and relative bias voltage level $$\left(\frac{F_b}{F_g}, \frac{V_{DC}}{V_C}\right) < (0.1, 0.1);$$

and MCMs 300 with normalized static mechanical force and relative bias voltage level $$\left(\frac{F_b}{F_g}, \frac{V_{DC}}{V_C}\right) > (0.85, 0.9)$$

(respectively) will be prone to collapse. FIG. 17 shows curves relating the normalized minimum gap 302 radius $a_{n\_min}$ to the normalized effective gap 302 height $t_{ge\_n}$. A first curve 1702 corresponds to the described upper (0.9) bound for the relative bias voltage level $$\frac{V_{DC}}{V_C}.$$

A second curve 1704 corresponds to the described lower (0.1) bound for the relative bias voltage level $$\frac{V_{DC}}{V_C}.$$

Individual curves correspond to varying normalized static mechanical force $$\frac{F_b}{F_g}.$$

The dotted-line boundary 1706 corresponds (with a small margin) to the x-axis and y-axis limits reached by the respective curves 1702, 1704 at the described upper (0.85) and lower (0.1) bounds for the normalized static mechanical force $$\frac{F_b}{F_g}.$$

The dotted-line boundary 1706 corresponds to an area within the graph 1700 which is enclosed by the curves and ranges (of the normalized effective gap 302 height $t_{ge\_n}$) described by Equations 50 and 51.

$a_{n\_min} \leq 0.9 t_{ge\_n}$ for $t_{ge\_n}$ in the range $0.2 < t_{ge\_n} \leq 0.8$  Equation 50

$0.9 t_{ge\_n} - 0.72 \leq a_{n\_min} \leq 0.9 t_{ge\_n}$ for $t_{ge\_n}$ in the range $0.8 < t_{ge\_n} \leq 6.8$  Equation 51

The dotted-line boundary 1706 closely approximates the first curve 1702 and the second curve 1704. As previously stated, the elastic linearity constraint is an approximation; portions of the described regions beneath the curves (lower normalized gap 302 radius $a_n$ than the normalized minimum gap 302 radius $a_{n\_min}$) remain close enough to the boundaries set by the elastic linearity constraint to enable, in some embodiments, useful operation with small reductions in OCRV sensitivity with respect to the elastic linear operation region (as described above with respect to the elastic linearity constraint boundary).

FIG. 18 shows a graph 1800 of the relationship between normalized minimum radiation plate 310 thickness $t_{m\_n\_min}$ and normalized effective gap 302 height $t_{ge\_n}$ for various values of the relative bias voltage level $V_{DC}/V_C$. FIG. 18 shows curves relating the normalized minimum radiation plate 310 thickness $t_{m\_n\_min}$ to the normalized effective gap 302 height $t_{ge\_n}$. A first curve 1802 corresponds to the described upper (0.9) bound for the relative bias voltage level $$\frac{V_{DC}}{V_C}.$$

A second curve 1804 corresponds to the described lower (0.1) bound for the relative bias voltage level $$\frac{V_{DC}}{V_C}.$$

Individual curves correspond to varying normalized static mechanical force $$\frac{F_b}{F_g}.$$

The dotted-line boundary 1806 corresponds (with a small margin) to the x-axis and y-axis limits reached by the respective curves 1802, 1804 at the described upper (0.85) and lower (0.1) bounds for the normalized static mechanical force $$\frac{F_b}{F_g}.$$

The dotted-line boundary 1806 corresponds to an area within the graph 1800 which is enclosed by the curves and ranges (of the normalized effective gap 302 height $t_{ge\_n}$) described by Equations 52 and 53.

$t_{m\_n\_min} \leq 0.93 t_{ge\_n} - 0.186$ for $t_{ge\_n}$ in the range $0.2 < t_{ge\_n} \leq 0.8$  Equation 52

$0.93 t_{ge\_n} - 0.744 < t_{m\_n\_min} \leq 0.93 t_{ge\_n} - 0.186$ for $t_{ge\_n}$ in the range $0.8 < t_{ge\_n} \leq 6.8$  Equation 53

The dotted-line boundary 1806 closely approximates the first curve 1802 and the second curve 1804. As previously stated, the elastic linearity constraint is an approximation; portions of the described regions beneath the curves (lower normalized radiation plate 310 thickness $t_{m\_n}$ than the normalized minimum radiation plate 310 thickness $t_{m\_n\_min}$) remain close enough to the boundaries set by the elastic linearity constraint to enable, in some embodiments, useful operation with small reductions in OCRV sensitivity with respect to the elastic linear operation region (as described above with respect to the elastic linearity constraint boundary).

FIG. 19 shows a graph 1900 of the relationship between normalized gap 302 radius $a_n$ and normalized effective gap 302 height $t_{ge\_n}$ for various values of the relative bias voltage level $V_{DC}/V_C$ and various values of the scaling constant K. Specifically, FIG. 19 applies the scaling constant K=2.5 to the first curve 1702

$$\left(\frac{V_{DC}}{V_C} = .9\right)$$

of FIG. 17 to produce a first scaled curve 1902, and applies the scaling constant K=2.5 to the second curve 1704

$$\left(\frac{V_{DC}}{V_C} = .1\right)$$

of FIG. 17 to produce a second scaled curve 1904 (see Equations 26-29). The dotted-line boundary 1906 corresponds (with a small margin) to the x-axis and y-axis limits reached by the respective curves 1902, 1904 at the described upper (0.85) and lower (0.1) bounds for the normalized static mechanical force $$\frac{F_b}{F_g}$$

in FIG. 17. (The dotted-line boundary 2006 overlaps the second scaled curve 1904.) The dotted-line boundary 1906 closely approximates and describes a useful region of MCM 300 normalized dimensions for uncollapsed, linear elastic operation. The dotted-line boundary corresponds to an area within the graph 1900 which is enclosed by the curves and ranges (of the normalized effective gap 302 height $t_{ge\_n}$) described by Equations 54 and 55.

$a_n \leq 14.2 t_{ge\_n} - 2.84$ for $t_{ge\_n}$ in the range $0.2 < t_{ge\_n} \leq 0.8$  Equation 54

$0.9 t_{ge\_n} - 0.72 < a_n \leq 14.2 t_{ge\_n} - 2.84$ for $t_{ge\_n}$ in the range $0.8 < t_{ge\_n} \leq 6.8$  Equation 55

FIG. 20 shows a graph 2000 of the relationship between normalized radiation plate 310 thickness $t_{m\_n}$ and normalized effective gap 302 height $t_{ge\_n}$ for various values of the relative bias voltage level $V_{DC}/V_C$ and various values of the scaling constant K. Specifically, FIG. 20 applies the scaling constant K=2.5 to the first curve 1802

$$\left(\frac{V_{DC}}{V_C} = .9\right)$$

of FIG. 18 to produce a first scaled curve 2002, and applies the scaling constant K=2.5 to the second curve 1804

$$\left(\frac{V_{DC}}{V_C} = .1\right)$$

of FIG. 18 to produce a second scaled curve 2004 (see Equations 26-29). The dotted-line boundary 2006 corresponds (with a small margin) to the x-axis and y-axis limits reached by the respective curves 2002, 2004 at the described upper (0.85) and lower (0.1) bounds for the normalized static mechanical force $$\frac{F_b}{F_g}$$

in FIG. 18. (The dotted-line boundary 2006 overlaps the second scaled curve 2004.) The dotted-line boundary 2006 closely approximates and describes a useful region of MCM 300 normalized dimensions for uncollapsed, linear elastic operation. The dotted-line boundary corresponds to an area within the graph 2000 which is enclosed by the curves and ranges (of the normalized effective gap 302 height $t_{ge\_n}$) described by Equations 56 and 57.

$t_{m\_n} \leq 36 t_{ge\_n} - 7.2$ for $t_{ge\_n}$ in the range $0.2 < t_{ge\_n} \leq 0.8$    Equation 56

$0.93 t_{ge\_n} - 0.744 < t_{m\_n} \leq 36 t_{ge\_n} - 7.2$ for $t_{ge\_n}$ in the range $0.8 < t_{ge\_n} \leq 6.8$    Equation 57

The disclosed innovations, in various embodiments, provide one or more of at least the following advantages. However, not all of these advantages result from every one of the innovations disclosed, and this list of advantages does not limit the variously claimed inventive scope.
- Microphone dimensions for optimal microphone sensitivity can be specified using a limited number of selected operating parameters and/or dimensions and/or other microphone characteristics;
- uses a sealed gap, avoiding gap contamination;
- sealed gap enables microphone operation, without damage to the microphone, down to tens of meters under water;
- self-noise of an MCM is limited to radiation impedance, so that SNR is approximately 94 dBA;
- suitable for use in various airborne consumer and professional products, such as computers, ear phones, hearing aids, mobile phones, wireless equipment and wideband precision acoustic measurement and recording systems;
- can be fabricated at low cost using standard MEMS processes;
- microphone dimensions, sensitivity and other performance characteristics are independent of materials used to fabricate the radiation plate and insulator layers; and
- avoids use of finite element analysis to optimize microphone dimensions.

Sealed gap capacitive MEMS microphone embodiments, as disclosed herein, has very low self-noise, and can be designed for robust uncollapsed, linear elastic operation with high (or optimal) OCRV sensitivity. The inventors have discovered that MCM performance (sensitivity) depends on a small number of operating parameters: static mechanical force, bias voltage, and relative bias voltage level. These parameters—or dimensions or other microphone properties dependent on these parameters—can be specified at the start of a design process. This enables a sort of design-in-reverse, allowing a designer to pick a desired performance profile of an MCM; microphone dimensions (gap radius/radiation plate radius, radiation plate thickness, and gap height) and other characteristics of the MCM are then determined by the selected performance profile. Radiation plate dimensions can then be scaled to improve robustness of linearly elastic, uncollapsed operation, and to improve SCRC sensitivity. Generally, these microphones are as durable with respect to temperature and impact as pressure compensated MEMS microphones. Further, these microphones can be manufactured using tools and processes used to manufacture pressure compensated MEMS microphones, making manufacture relatively inexpensive.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

While certain variables are described herein as depending "only" on certain other variables, this convention explicitly ignores variations in as-fabricated parts, such as variations due to process variability, variations in process environment or operational environment, and other factors not addressed herein. These factors will generally not affect the optimality of results with respect to particular operating points, as described herein.

In some embodiments, an MCM comprises an electret. In some MCM embodiments using an electret, the radiation plate can comprise a polymeric material.

The Electret and Performance reference shows that an electret layer in an MCM results in a DC bias voltage $V_E$ that adds to the electrically induced bias voltage $V_{DC}$, resulting in a total bias voltage of $V_{DC} + V_E$. The magnitude and polarity of effective electret voltage $V_E$ depend on the polarization of the trapped charges in the electret layer(s). When there is no external bias voltage, i.e. $V_{DC}=0$ volts, a static bias is provided by $V_E$ if the electrical termination is appropriate. This is particularly useful in transducer reception applications. Increased effective bias voltage as a result of an electret can be used to increase the sensitivity of the MCM.

In some embodiments, a membrane is used as a vibrating element.

In some embodiments, ambient pressure can be taken to be between 70 kPa, corresponding to approximately the lowest normal pressure in an airplane cabin, and 110 kPa, corresponding to a highest atmospheric pressure measured on Earth.

In some embodiments, an MCM uses a single insulator layer of thickness $t_i = t_{i1} + t_{i2}$.

In some embodiments, an MCM with amplification can achieve a signal-to-noise ratio of 75 dB or more.

In some embodiments, an electret is used in addition to or instead of an applied bias voltage.

In some embodiments, an MCM scaled pursuant to Equations 26-29 will have SCRC sensitivity $K^6$ times greater than an unscaled MCM.

In some embodiments using a number N MCMs electrically connected in parallel, the connected MCMs together have N times greater SCRC sensitivity than a single one of the MCMs.

While "optimum" sensitivity and maintaining "optimum" sensitivity (or other determined sensitivity) are referred to herein, one of ordinary skill in the arts of capacitive MEMS microphones will understand that fabrication tolerances, variations in the static pressure difference between the ambient and the gap (such as between the Dead Sea and Lhasa), material imperfections causing variations of material elastic properties, variations from the operating point during operation, the approximate nature of the elastic linearity constraint, and other differences between models and physicalized embodiments can cause variation of an MCM's sensitivity from the "optimum" sensitivity.

In some embodiments, the operating point is selected by selecting up to three of the following: the gap radius a, the radiation plate thickness $t_m$, the effective gap height $t_{ge}$, the optimum OCRV sensitivity, an SCRC sensitivity, the normalized static mechanical force $F_b/F_g$, the bias voltage $V_{DC}$, and the relative bias voltage level $V_{DC}/V_C$.

In some embodiments, MCM microphones can be connected in parallel to yield the same OCRV sensitivity as a single element, but with higher SCRC sensitivity and higher input capacitance.

In some embodiments, MCM microphones can be connected in parallel to yield higher OCRV sensitivity and lower SCRC sensitivity and input capacitance.

Additional general background, which helps to show variations and implementations, may be found in the following publications, all of which are hereby incorporated by reference: U.S. Pat. No. 6,075,867; U.S. Pat. No. 7,955,250; U.S. Pat. No. 8,288,971; U.S. Pat. No. 9,363,589; U.S. Pat. No. 9,451,375; U.S. Pat. No. 9,560,430; U.S. Pat. Pub. No. 2001/0019945; U.S. Pat. Pub. 2014/0339657; U.S. Pat. Pub. No. 2014/0083296; and U.S. Pat. Pub. No. 2015/0163572; H. Köymen, A. Atalar, E. Aydoğdu, C. Kocabaş, H. K. Oğuz, S. Olçum, A. Özgürlük, A. Ünlügedik, "An improved lumped element nonlinear circuit model for a circular CMUT cell," IEEE Trans. Ultrason. Ferroelectr. Freq. Control, Vol. 59, no. 8, pp. 1791-1799, August 2012; H. Köymen, A. Atalar, I. Köymen, A. S. Taşdelen, A. Ünlügedik, "Unbiased Charged Circular CMUT Microphone: Lumped Element Modeling and Performance", IEEE Trans. Ultrason. Ferroelectr. Freq. Control, Vol. 65, no. 1, pp. 60-71, Nov. 14, 2017; A. Unlugedik, A. S. Tasdelen, A. Atalar, and H. Köymen, "Designing Transmitting CMUT Cells for Airborne Applications," IEEE Trans. Ultrason. Ferroelectr. Freq. Control, Vol. 61, pp. 1899-1910, 2014; M. Funding la Cour, T. L. Christiansen, J. A. Jensen, and E. V. Thomsen, "Electrostatic and Small-Signal Analysis of CMUTs With Circular and Square Anisotropic Plates," IEEE Trans. Ultrason. Ferroelectr. Freq. Control, vol. 62, no. 8, pp. 1563-1579, 2015; H. Köymen, A. Atalar and H. K. Oğuz, "Designing Circular CMUT Cells Using CMUT Biasing Chart," 2012 IEEE International Ultrasonics Symposium Proceedings pp. 975-978, Dresden, October, 2012; M. Engholm, T. Pedersen, and E. V. Thomsen, "Modeling of plates with multiple anisotropic layers and residual stress," Sens. and Act. A: Phys., vol. 240, pp. 70-79, April 2016; and M. Rahman, J. Hernandez, S. Chowdhury, "An Improved Analytical Method to Design CMUTs With Square Diaphraghms," IEEE Trans. Ultrason. Ferroelectr. Freq. Control, vol. 260, no. 4, April 2013.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

As shown and described herein, the inventors have discovered a variety of new and useful approaches to capacitive MEMS microphones with a sealed gap, and design of such microphones.

What is claimed is:

1. A microphone system for receiving sound waves, the microphone system comprising:

a back plate;

a radiation plate having a thickness $t_m$, the radiation plate clamped to the back plate so that there is a sealed gap between the radiation plate and the back plate such that passage of gas into or out of the gap is prevented, the gap having a radius a and a gap height $t_g$;

a first electrode, either the first electrode being fixedly coupled to a side of the back plate proximate to the gap, or the first electrode comprising or contained within the back plate;

a second electrode, either the second electrode being fixedly coupled to a side of the radiation plate, or the first electrode comprising or contained within the radiation plate;

a first insulator layer of thickness $t_{i1}$ and relative permittivity $\varepsilon_{r\_i1}$, and a second insulator layer of thickness $t_{i2}$ and relative permittivity $\varepsilon_{r\_i2}$, the first and second insulator layers being disposed between the first and second electrodes, and the first and second insulator layers being disposed between the back plate and the radiation plate;

a power source; and a microphone controller configured to use the power source to drive the microphone at an operating point, wherein $F_b$ is a net static force exerted on the radiation plate due to an ambient static pressure, $F_g$ is a uniformly distributed force required to displace a center of the radiation plate by an effective gap height $t_{ge}$, and $V_C$ is a limit to bias voltage $V_{DC}$ for uncollapsed operation of the microphone system, the operating point comprising: a normalized static mechanical force $F_b/F_g$, a bias voltage of the first and second electrodes $V_{DC}$, and a relative bias voltage level of the first and second electrodes $V_{DC}/V_C$;

wherein $$t_{ge} = t_g + \frac{t_{i1}}{s_{r\_i1}} + \frac{t_{i2}}{s_{r\_i2}};$$

and wherein the gap radius a, the gap height $t_g$, and the radiation plate thickness $t_m$ are determined using the selected operating point so that an OCRV sensitivity of the microphone at the selected operating point is an optimum OCRV sensitivity for the selected operating point.

2. The microphone system of claim 1, wherein the gap comprises a hole machined into the substrate, and the back plate comprises a portion of the substrate forming a floor of the gap.

3. The microphone system of claim 1,
wherein the first electrode covers at least 80% of the area of the back plate on the side of the back plate proximate to the gap, and
wherein the second electrode covers at least 80% of the area of the radiation plate on the side of the radiation plate proximate to the gap.

4. The microphone system of claim 1, wherein the sound waves are human-audible and the gap contains a vacuum.

5. The microphone system of claim 1, wherein the gap radius a, the gap height $t_g$, and the radiation plate thickness $t_m$ are determined using the operating point so that the microphone system will maintain uncollapsed, linear elastic operation.

6. The microphone system of claim 1, wherein the gap is circular.

7. The microphone system of claim 1, further comprising an electret configured to increase an effective bias voltage of the first and second electrodes.

8. The microphone system of claim 1,
wherein the radiation plate comprises a selected solid material suitable for fabrication of a MEMS microphone; and
wherein the particular selected solid material does not affect the optimum sensitivity, and does not affect a corresponding gap height or radiation plate thickness.

9. The microphone system of claim 1, wherein the gap radius a is related to a minimum gap radius $a_{min}$ corresponding to the optimum sensitivity at the operating point, and the radiation plate thickness $t_m$ is related to a minimum radiation plate thickness $t_{m\_min}$ corresponding to the optimum sensitivity at the operating point, by a selected scaling constant K, such that $a=(K^3)a_{min}$, and $t_m=(K^4)t_{m\_min}$.

10. The microphone system of claim 1, wherein the operating point is a selected operating point, the selected operating point being selected by selecting up to three of the following: the gap radius a, the radiation plate thickness $t_m$, the effective gap height $t_{ge}$, the optimum OCRV sensitivity, an SCRC sensitivity, the normalized static mechanical force $F_b/F_g$, the bias voltage $V_{DC}$, and the relative bias voltage level $V_{DC}/V_C$.

11. The microphone system of claim 1, wherein multiple ones of the microphone system are electrically connected in parallel.

12. A microphone system for receiving sound waves, the microphone system comprising:
a back plate;
a radiation plate having a thickness $t_m$, the radiation plate clamped to the back plate so that there is a sealed gap between the radiation plate and the back plate such that passage of gas into or out of the gap is prevented, the gap having a radius a and a gap height $t_g$;
a first electrode, either the first electrode being fixedly coupled to a side of the back plate proximate to the gap, or the first electrode comprising or contained within the back plate;
a second electrode, either the second electrode being fixedly coupled to a side of the radiation plate, or the first electrode comprising or contained within the radiation plate;
a first insulator layer of thickness $t_{i1}$ and relative permittivity, $\varepsilon_{r\_i1}$, and a second insulator layer of thickness $t_{i2}$ and relative permittivity $\varepsilon_{r\_i2}$, the first and second insulator layers being disposed between the first and second electrodes, and the first and second insulator layers being disposed between the back plate and the radiation plate;
a power source; and
a microphone controller configured to use the power source to drive the microphone at an operating point, wherein $F_b$ is a net static force exerted on the radiation plate due to an ambient static pressure, $F_g$ is a uniformly distributed force required to displace a center of the radiation plate by an effective gap height $t_{ge}$, and $V_C$ is a limit to bias voltage $V_{DC}$ for uncollapsed operation of the microphone system, the operating point comprising: a normalized static mechanical force $F_b/F_g$, a bias voltage of the first and second electrodes $V_{DC}$, and a relative bias voltage level of the first and second electrodes $V_{DC}/V_C$;
wherein $$t_{ge} = t_g + \frac{t_{i1}}{s_{r\_i1}} + \frac{t_{i2}}{s_{r\_i2}};$$

wherein $a_n$ is a normalized radius of the gap, and $a_n$ is in the range:

$a_n \leq 14.2 t_{ge\_n} - 2.84$ for $0.2 < t_{ge\_n} \leq 0.8$ $0.9 t_{ge\_n} - 0.72 < a_n \leq 14.2 t_{ge\_n} - 2.84$ for $0.8 < t_{ge\_n} \leq 6.8$;

wherein $t_{m\_n}$ is a normalized thickness of the radiation plate, and $t_{m\_n}$ is in the range:

$t_{m\_n} \leq 36 t_{ge\_n} - 7.2$ for $0.2 < t_{ge\_n} \leq 0.8$ $0.93 t_{ge\_n} - 0.744 < t_{m\_n} \leq 36 t_{ge\_n} - 7.2$ for $0.8 < t_{ge\_n} \leq 6.8$;

wherein $\varepsilon_0$ is a permittivity of free space, $P_0$ is a static pressure difference between an ambient and the gap, and $V_{DC\_n}$ is a normalized operating bias voltage such that:

$$V_{DC\_n} = \frac{3}{2}\sqrt{\frac{\varepsilon_0}{P_0}}\, V_{DC};$$

wherein $t_{ge\_n}$ is a normalized effective gap height, and the gap radius a, the gap height $t_g$, and the radiation plate thickness $t_m$ are:

$$t_{ge} = V_{DC\_n}\left(\frac{V_{DC}}{V_2}\right)^{-1} t_{ge\_n}$$

$$t_{ge\_n}\left(\frac{F_b}{F_g}\right) \approx \frac{\sqrt{\frac{F_b}{F_g}}}{0.9961 - 1.0468\frac{F_b}{F_g} + 0.06972\left(\frac{F_b}{F_g} - 0.25\right)^2 + 0.01148\left(\frac{F_b}{F_g}\right)^2}$$

$$a = \left(10^4 \sqrt{\frac{Y_0}{15(1-\sigma^2)P_0}}\right) V_{DC\_n} a_n$$

$$t_m = 5 V_{DC\_n}\left(\frac{V_{DC}}{V_C}\right)^{-1} t_{m\_n};\text{ and}$$

wherein $Y_0$ is a Young's modulus of a material comprising the radiation plate and $\sigma$ is a Poisson's ratio of the material comprising the radiation plate.

13. The microphone system of claim 12, wherein the normalized gap radius $a_n$ corresponds to a normalized minimum gap radius $a_{n\_min}$ that is within the range for $a_n$, the normalized radiation plate thickness $t_{m\_n}$ corresponds to a normalized minimum radiation plate thickness $t_{m\_n\_min}$ that is within the range for $t_{m\_n}$, K is a selected scaling constant, $X_P$ is a static deflection of the center of the radiation plate, $$g\left(\frac{X_P}{t_{ge}}\right)$$

is a function of $$\frac{X_P}{t_{ge}},$$

and $$g'\left(\frac{X_P}{t_{ge}}\right)$$

is a function which is the first derivative of $$g\left(\frac{X_P}{t_{ge}}\right):$$

$$g\left(\frac{X_P}{t_{ge}}\right) = \frac{\tanh^{-1}\left(\sqrt{X_P/t_{ge}}\right)}{\sqrt{X_P/t_{ge}}} g'\left(\frac{X_P}{t_{ge}}\right) =$$

$$\frac{1}{2\frac{X_P}{t_{ge}}}\left(\frac{1}{1-\frac{X_P}{t_{ge}}} - g\left(\frac{X_P}{t_{ge}}\right)\right)\frac{a_{n\_min}}{t_{m\_n\_min}} = \sqrt[4]{\frac{F_b}{F_g} / \frac{X_P}{t_{ge}} \frac{V_{pc}^g}{V_c^g}}$$

$$\left(0.9961 - 1.0468\frac{F_b}{F_g} + 0.06972\left(\frac{F_b}{F_g} - 0.25\right)^2 + 0.01148\left(\frac{F_b}{F_g}\right)^2\right)^2$$

$$2g'\left(\frac{X_P}{t_{ge}}\right) - 3\left(\frac{X_P}{t_{ge}} - \frac{F_b}{F_g}\right) \approx 0 \quad \frac{X_P}{t_{ge}} \geq \frac{F_b}{F_g}$$

$$a_n = (K^3)a_{n\_min}$$

$$t_{m\_n} = (K^4)t_{m\_n\_min}.$$

14. The microphone system of claim 12,
wherein the material comprising the radiation plate is a selected solid material suitable for fabrication of a MEMS microphone; and
wherein the particular selected solid material does not affect the optimum sensitivity, and does not affect a corresponding gap height or radiation plate thickness.

15. The microphone system of claim 12, wherein both insulator layers are fixedly coupled to the radiation plate, or both insulator layers are fixedly coupled to the back plate, or the first insulator layer is fixedly coupled to the radiation plate and the second insulator layer is fixedly coupled to the back plate.

16. The microphone system of claim 12, wherein the gap comprises a hole machined into the substrate, and the back plate comprises a portion of the substrate forming a floor of the gap.

17. The microphone system of claim 12,
wherein the first electrode covers at least 80% of the area of the back plate on the side of the back plate proximate to the gap, and
wherein the second electrode covers at least 80% of the area of the radiation plate on the side of the radiation plate proximate to the gap.

18. The microphone system of claim 12, wherein the sound waves include the range of human-audible sound waves, and the gap contains a vacuum.

19. The microphone system of claim 12, wherein the gap radius a, the gap height $t_g$, and the radiation plate thickness $t_m$ are determined using the operating point so that the microphone system will maintain uncollapsed, linear elastic operation.

20. The microphone system of claim 12, wherein the gap is circular.

21. The microphone system of claim 12, further comprising an electret configured to increase an effective bias voltage of the first and second electrodes.

22. The microphone system of claim 12, wherein the gap radius a is related to a minimum gap radius $a_{min}$ corresponding to an optimum sensitivity at the operating point, and the radiation plate thickness $t_m$ is related to a minimum radiation plate thickness $t_{m\_min}$ corresponding to an optimum sensitivity at the operating point, by a selected scaling constant K, such that $a=(K^3)a_{min}$, and $t_m=(K^4)t_{m\_min}$.

23. The microphone system of claim 12, wherein the operating point is a selected operating point, the selected operating point being selected by selecting up to three of the following: the gap radius a, the radiation plate thickness $t_m$, the effective gap height $t_{ge}$, the optimum OCRV sensitivity, an SCRC sensitivity, the normalized static mechanical force $F_b/F_g$, the bias voltage $V_{DC}$, and the relative bias voltage level $V_{DC}/V_C$.

24. The microphone system of claim 12, wherein multiple ones of the microphone system are electrically connected in parallel.

* * * * *